(12) United States Patent
Hamano et al.

(10) Patent No.: US 6,833,667 B2
(45) Date of Patent: Dec. 21, 2004

(54) ORGANIC ELECTROLUMINESCENCE ELEMENT AND IMAGE FORMING APPARATUS OR PORTABLE TERMINAL UNIT USING THEREOF

(75) Inventors: Takafumi Hamano, Nakagawa (JP); Hisanori Sugiura, Hirakata (JP); Naohide Wakita, Suita (JP); Hiroshi Yamaguchi, Hirakata (JP); Tomohiko Sasano, Muika (JP); Yasuhiro Tanaka, Ashiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/373,210

(22) Filed: Feb. 26, 2003

(65) Prior Publication Data

US 2003/0164679 A1 Sep. 4, 2003

(30) Foreign Application Priority Data

| Feb. 27, 2002 | (JP) | 2002-050972 |
| Feb. 28, 2002 | (JP) | 2002-052760 |
| May 22, 2002 | (JP) | 2002-147395 |
| Jul. 12, 2002 | (JP) | 2002-203816 |

(51) Int. Cl.$^7$ ................................................. H01J 1/62
(52) U.S. Cl. ..................... 313/504; 313/506; 313/113
(58) Field of Search ............................. 313/498, 504, 313/506, 509, 512, 113

(56) References Cited

FOREIGN PATENT DOCUMENTS

| JP | 9129375 | 5/1997 |
| JP | 2773720 | 4/1998 |
| JP | 10189251 | 7/1998 |
| JP | 10308286 | 11/1998 |
| JP | 2991183 | 10/1999 |

OTHER PUBLICATIONS

C. W. Tang, et al.; "Organic Electroluminescent Diodes," "vol. 51, Sep. 21, 1987, No. 12, Research Laboratories, Corporate Research Group, Eastman Kodak Company, Rochester, New York 14650, a publication of the American Institute of Physics, pp. 913–915.

N. C. Greenham, et al.; "Angular Dependence of the Emission from a Conjugated Polymer Light–Emitting Diode: Implications for Efficiency Calculations," Advanced Materials, Jun. 1994, vol. 6, No. 6, pp. 491–494.

*Primary Examiner*—Vip Patel
(74) *Attorney, Agent, or Firm*—Stevens, Davis, Miller & Mosher, LLP

(57) ABSTRACT

There are provided an organic electroluminescence element which is excellent in visibility and which can maintain a light emission performance with a high degree of efficiency, an image forming apparatus which is excellent in visibility and which can maintain a light emission performance with a high degree of efficiency, and a portable terminal unit which is lightweight and which has a long use life. The organic electroluminescence element incorporates at least, on a substrate, an anode for injecting holes, a luminous layer having a light emitting zone, a cathode for injecting electrons, wherein light radiated from the luminous layer is extracted through a surface opposed to the substrate, and an inverted V-like structure higher than the luminous layer is formed on at least a part of an element forming surface of the substrate.

70 Claims, 19 Drawing Sheets

ORGANIC ELECTROLUMINESCENCE ELEMENT AND IMAGE FORMING APPARATUS OR PORTABLE TERMINAL UNIT USING THEREOF

FIELD OF THE INVENTION

The present invention relates to an organic electroluminescence element used as a light source or a back light in various image forming apparatus or an light emitting element used in an optical communication equipment or the like, and or to an image forming apparatus and a terminal unit using thereof.

BACKGROUND OF THE INVENTION

An electroluminescence element is the so-called light emitting device utilizing electroluminescence of a solid fluorescent substance, and an inorganic electroluminescence element using an organic group material as a light emitter has come into a practical use until now, and has been aimed for development and application into some backlights in a liquid crystal display, a flat display or the like. However, a voltage required for allowing the inorganic electroluminescence element to emit light is high, that is, it is not less than 100 V, and it is difficult to emit blue light therefrom, thereby full color exhibition with three primary colors, that is, RGB, is difficult. Further, since the inorganic electroluminescence element includes a light emitter made of a material having a large refractive index, it can be greatly affected by total reflection at its interface or the like, and accordingly, the efficiency of extraction of light into the air with respect to actual light emission is extremely low, that is, 10 to 20%, and it is difficult to enhance the efficiency.

Meanwhile, studies as to luminescence elements made of organic materials have been attractively and variously executed for a long time. However, its luminous efficiency is extremely low, and accordingly, it has not yet been developed into studies direct for practical use.

However, W. Tang of Kodak Co. proposed, 1987, an organic electroluminescence element having a function separation type laminated structure in which an organic material is separated into two layers, that is, a hole transmit layer and a luminous layer, and it was found that the luminance which is not less than 1,000 cd/m² could be obtained therefrom (Refer to Applied Physics Letter, vol. 51, 1987, page 913 or the like, by C. W. Tang and S. A. Vanslayke). Thereafter, this organic electroluminescence element has been remarkably attractive, and studies for organic luminescence elements having a similar function separation type laminated structure are now prosperously made. In particular, an increase in efficiency and a prolongation of the use life thereof, which are indispensable for practical utilization thereof, have been sufficiently studied. Thus, these years, a display or the like using an organic electroluminescence element has been materialized.

Next, explanation will be made of a configuration of a typical conventional organic electroluminescence element with reference to FIG. 25 which is a sectional view illustrating an essential portion of the conventional electroluminescence element and in which there are shown a substrate 1, an anode 2, a hole transport layer 3, a luminous layer 4, and a cathode 5.

Referring to FIG. 25, the organic electroluminescence element is composed of the anode 2 which is formed on the substrate 1 made of glass or the like in a sputtering process, a resistive heating evaporation process or the like, and which is formed of a transparent conductive film made of ITO or the like, and the hole transport layer 3 which is formed on the anode 2, similarly by the resistive heating evaporation process or the like, and which is made N,N-diphenyl-N, N'-bis(3-methylphenyl)-1,1'-diphenyl-4,4'-diamin (which will be abbreviated as PTD) or the like, the luminous layer 4 which is formed on the hole transport layer 3 by a resistive heating evaporation process or the like, and which is made of 8-hydroxyquinoline aluminum (which will be hereinbelow abbreviated as $Alq_3$) or the like, and the cathode 5 which is formed on the luminous layer 4 by a resistive heating evaporation process or the like, and which is formed of a metal film having a film thickness of 100 to 300 nm.

When a d.c. voltage or a d.c. current applied to the electroluminescence element having the above-mentioned configuration, using the anode 2 as a positive electrode and the cathode 5 as a negative electrode, holes are injected from the anode 2 into the luminous layer 4 through the intermediary of the hole transport layer 3, and electrons are charged from the cathode 5 into the luminous layer 4. In the luminous layer 4, the holes and the electrons are recombined, and accordingly, excitons which are produced through the recombination are shifted from a normal state to an excited state so as to cause a luminous phenomenon.

Referring to FIG. 26 which is a graph exhibiting a relationship between an energizing time and a relative luminance in an organic electroluminescence element, there are shown variation in luminance among three kinds of initial luminance.

Referring to FIG. 27 which is a graph exhibiting a relationship between an energizing voltage and luminance in an organic electroluminescence element, as shown in FIG. 26, it is found, the higher the luminance, the shorter the energizing time or the service life. Further, as shown in FIG. 27, the energizing voltage has to be higher in order to enhance the luminance. Thus, in order to materialize an organic electroluminescence element capable of having a long service life and maintaining a high luminous function, it is important to lower the luminance and to enhance the luminous efficiency. However, in order to practically use the organic electroluminescence element, a sufficiently high degree of luminance is required, that is, it is ineffective to simply lower the luminance.

As mentioned above, the organic electroluminescence element has a correlation between its luminance and its service life. Thus, there has been demanded an organic electroluminescence which can fully satisfy both enhanced luminance and long service life.

In the above-mentioned organic electroluminescence element, light emitted from fluorescent substance in the luminous layer 4 is emitted omnidirectionally from the fluorescent substance as a center, and is then radiated into the atmospheric air by way of the hole transport layer 3, the anode 2 and the substrate 1. Alternatively, the light is once emitted in a direction reverse to a light extracting direction (a direction toward the substrate 1), then it is reflected by the cathode 5, and is then radiated into the atmospheric air by way of the luminous layer 4, the hole transport layer 5, the anode 2 and the substrate 1.

However, during the course of passing through interfaces between mediums, light which is incident at an angle greater than an angle with which an emergent angle of refracted waves becomes 90 deg., that is, at a critical angle, cannot transmit through one of the interfaces if the refractive index of a medium on the incident side is grater than that of a medium on the emergent side, and accordingly, the light is totally reflected so that it cannot extracted into the atmospheric air.

It is noted here that the relationship between a refraction angle of light and refractive indices of different mediums at the interface between mediums is determined under the Snell's Law. In view of the Snell's Law, in the case of transmission of light from a medium having a refractive index n1 into a medium having a refractive index n2, a relationship $n1*\sin\theta1=n2*\sin\theta2$ is obtained between an incident angle θ1 and an emergent angle θ2. Accordingly, if n1>n2 is effected, the incident angle $\theta1=\sin^{-1}(n2/n1)$ with which θ2=90 deg. can be obtained, has been well-known as a critical angle, and therefore, if the incident angle is greater than this value, the light is totally reflected at the interface between the mediums.

Thus, in an electroluminescence element in which light is isotropically radiated, light radiated at an angle grater than the critical angle repeats total reflection at the interface so that it is confined within the element, that is, it cannot be radiated into the atmospheric air.

Referring to FIG. 28 which is a schematic view illustrating a typical light paths in a section of an essential part of a conventional organic electroluminescence element, and in which like reference numerals are used to denote parts like to those which have been explained with reference to FIG. 25, light rays radiated from a light source 6 in the luminous layer 4 are totally reflected at interfaces, that is, an interface between the anode 2 and the substrate 1 (ITO/glass interface) and an interface between the substrate 1 and the atmospheric air (glass/air interface).

That is, light rays emitted from the luminous layer 4 are not emitted outside the element so as to apparently cause lowering of the efficiency of the organic luminescence element. In general, it has been known that a substantial part of radiated light rays obtained in the luminous layer 4 are confined within the element, and accordingly, only about 17 to 20% thereof is used as effective light lays (Refer to Advanced Material 6 (1994) 491).

Thus, a means for changing the emergent angle of light is provided in the substrate of the organic luminescence element, in order to aim at solving the above-mentioned problem.

For example, JP-B2-2,773,720 discloses such an invention that a lens structure is formed on the light extracting side of the substrate so as to enhance the efficiency of the electroluminescence element.

Further, JP-B2-2,991,183 discloses such an invention that diffraction grating or the like is formed at positions where the total reflection should be restrained so as to enhance the efficiency of extraction of light, and further, JP-A-9-129375 discloses such an invention that a surface on the light extraction side of the element causes irregular reflection or disordered reflection or refraction angles so as to enhance the efficiency of extraction of light.

Further, JP-A-10-189251 discloses means for changing light emitting angles, formed in a transparent substrate, and JP-A-10-308286 discloses a light reflecting layer is formed on the lower electrode side surface so as to enhance the efficiency of extraction of light.

However, the above-mentioned conventional electroluminescence elements have caused the following problems:

In the case of using the element in an image forming device such as a display unit, since the mesa structure has an inverted V-like shape structural component on the element side surface of the substrate, it is very difficult to form an electrode while preventing the effect of the mesa structure from lowering.

In the case of using the element in an image forming apparatus of an active matrix type, it is extremely difficult to form electrodes while the effect of the masa structure is maintained.

In the case of formation of the mesa structure on the substrate, since light emitted from the organic electroluminescence element is extracted after transmission at least through both mesa structure and substrate, the light causes a light loss corresponding to transmission through the substrate, and accordingly, the efficiency of light emission is lowered.

In the case of using the organic electroluminescence element having a substrate formed thereon with a mesa structure in an image forming device such as a display unit, since light emitted from an arbitrary pixel is extracted after transmission at least through the mesa structure and the substrate, light totally reflected comes to the other pixels by way of the substrate, and is then emitted into the atmospheric air from these pixels so as to cause the so-called stray light, resulting in disadvantages including lowering of the contrast thereof.

If the mesa structure and the organic electroluminescence element are formed, independent from each other, the positional alignment thereof during affixing therebetween is difficult, causing a slip in affixing, which causes deterioration of the visual performance thereof such as moiré effect. Further, it is likely to cause a disadvantage of peeling-off due to stress.

Although the efficiency of extraction of light is enhanced, enhancement of both brightness and use life has not yet been satisfied, and further, prolongation of use life has not yet come into effect.

In the case of using the element in an image forming device as a display unit composed of a group of minute pixels, the areas of openings and luminous portions become smaller in the pixel area, and accordingly, it is required to effect luminance with a high degree of brightness.

Further, it has not yet been made to aim at prolonging the use life thereof in view of its element structure.

Further, since the orientation of light varies, the visibility thereof is lowered, including lowering of the visual angle.

In the case of using the element in a full color display or the like, visual angles of respective colors are different from one another, causing color shift.

Since countermeasure for enhancing the efficiency of extraction of light is used in the substrate itself, relative restrictions are imposed to materials and processes for forming the element, and in particular, in the case of using the element incorporating the above-mentioned countermeasure for enhancing the efficiency of extraction of light in an image forming device such as a display unit, each of the pixels are very small, and accordingly, the degree of freedom as to the countermeasure for enhancing the efficiency of extraction of light is important.

In the case of using the element in an image forming device such as a display unit, if pixels therein correspond to lenses in the lens structure one for one, the positional alignment of the lenses is difficult, causing a slip in position so as to result in deterioration of visibility.

In the case of using the element in an image forming device such as a display unit, since the lens structure is present on the light extraction surface side of the substrate, it is difficult shorten the distance between the lens structure and the luminance portion.

In the case of forming the lens structure on the substrate, since light emitted from the organic electroluminescence element is extracted into the atmospheric air after transmission at least through both lens structure and substrate, a light loss is caused in view of the transmission through the substrate, resulting in deterioration of the efficiency of light emission.

In the case of using an organic electroluminescence element having a substrate formed thereon a lens structure in an image forming device such as a display unit, since light radiated from an arbitrary pixel is extracted into the atmospheric air after transmission at least through both lens structure and substrate, light totally reflected comes to the other pixels by way of the substrate before it is radiated into the atmospheric air, and accordingly, it causes the so-called stray light, resulting in a disadvantage of lowering the contrast thereof and the like.

In the case of the provision of a countermeasure for enhancing the efficiency of extraction of light, such as the formation of a lens structure or a mesa structure on the substrate side, it is difficult to freely design the orientation of light, possibly causing lowering of visibility such as a visual angle characteristic which can be exhibited by the organic electroluminescence element.

SUMMARY OF THE INVENTION

The present invention is devised in order to solve the above-mentioned problems inherent to the prior art, and accordingly, one object of the present invention is to provide an organic electroluminescence element which is excellent in visibility and which can maintain a light emitting function with a high degree of efficacy, also to provide an image forming apparatus which is excellent in visibility and which can maintain a light emitting function with a high degree of efficiency, and as well to provide a portable terminal unit having a light weight and a long operating time.

According to the present invention, there is provided an organic electroluminescence element including a substrate incorporating thereon at least an anode for hole injection, a luminance layer having a luminance zone and a cathode for electron injection, light radiated from the luminance layer is extracted from a surface opposed to the substrate, and an inverted V-like shape structural component having a height higher than that of the luminance layer is formed at least in a part of an element forming surface of the substrate.

BRIEF DESCRIPTION OF THE DRAWINGS

FIG. 3b is a schematic perspective view illustrating a variant form of the embodiment shown in FIG. 3a;

FIG. 9b is a schematic perspective view illustrating a variant form of the embodiment shown in FIG. 9a;

FIG. 22b is a schematic perspective view illustrating a variant form of the embodiment shown in FIG. 22a;

DETAILED DESCRIPTION OF PREFERRED EMBODIMENT OF THE INVENTION

Figure 1:
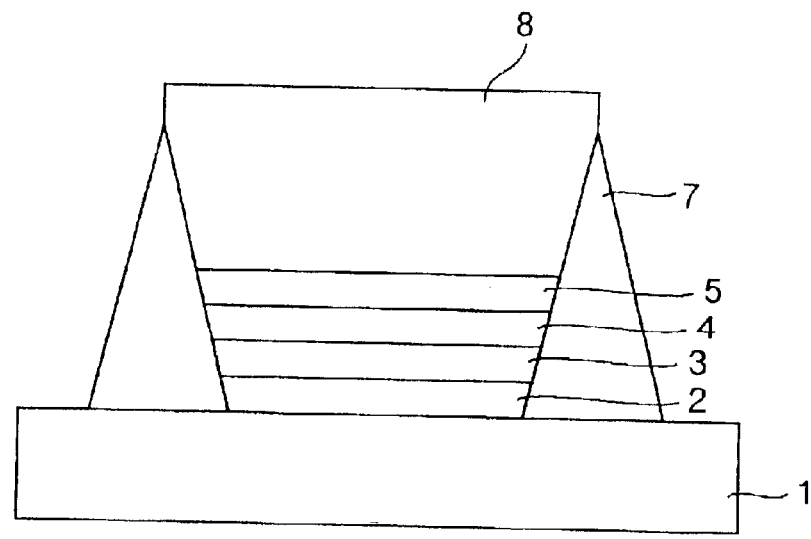
FIG. 1 is a sectional view illustrating an essential part of an organic electroluminescence element in an embodiment 1-1 of the present invention.

At first, explanation will be hereinbelow made of components constituting an organic electroluminescence element according to the present invention.

As to a substrate, the substrate of the organic substrate according to the present invention is transparent or translucent in the case of use of it for a light extracting surface, but may be either transparent or opaque in the case of no use of it for light extracting surface. Further, it has to have a strength for holding, at least, the organic electroluminescence element itself. It is noted that the transparence and the translucence in the present invention are defined so as to have a transparency which does not interfere with the visibility of light emitted from the organic electroluminescence element.

The substrate may be made of a material suitably selected from an inorganic glass group consisting of transparent or translucent soda-lime glass, glass containing barium and strontium, lead glass, aluminosilicate glass, borosilicate glass, barium borosilicate glass, silica glass and the like, a transparent or translucent polymer film group consisting of polyethylene terephthalate, polycarbonate, polymethyl metacrylate, polyethersulfone, polyvinyl fluoride, polypropylene, polyethylene, polyacrylate, amorphous polyolefine, boron group resin and the like, chalcogenoido glass group consisting of $As_2S_3$, $As_{40}S_{10}$, $As_{40}Ge_{10}$ and the like, a metal oxide or nitride group consisting of ZnO, $Nb_2O_5$, $Ta_2O_5$, SiO, $Si_3N_4$, $HfO_2$, $TiO_2$ and the like, or an opaque semiconductor group consisting of slicon, germanium, silicon carbide, gallium arsenic, gallium nitride and the like, any of the above-mentioned transparent substrate materials containing pigment, a metal material having a surface subjected to an insulation process, or the like. Further, it may be a laminated substrate consisting of a plurality of substrate materials laminated one upon another.

Further, the substrate may be formed on its surface or therein with a circuit composed of resistors, capacitors, inductors, diodes, transistors and the like, for driving the organic electroluminescence element.

As to an anode which is a positive electrode for injecting holes, this anode is required for efficiently injecting holes into a luminous layer or a hole transmit layer. A transparent electrode may be used as the anode. The transparent elecdtrode may be made of a metal oxide such as indium tin oxide (ITO), stannic oxide ($SnO_2$), Zinc Oxide (ZnO), formed of a transparent film made of a mixture of SnO:Sb (Antimony) or ZnO:Al (aluminum) or a metal thin film having a thickness which does not appreciably affect the transparency, and made of Al (aluminum), Cu (copper), Ti (titanium), Ag (silver) or the mixture of the former metal, or made of conductive polymer such as polypyrrole. Further, the transparent electrode may be made of a plurality of the above-mentioned transparent electrode materials which are laminated with each other with the use any of various polymerization processes including resistance heat evaporation, electron beam evaporation, sputtering, field polymerization and the like. Further, the thickness of the transparent electrode is preferably set to a value not less than 1 nm in order to have sufficient conductivity and to prevent occurrence of inhomogeneous light emission caused by irregularity on the surface of the substrate. Further, it is more preferably set to a value not greater than 500 nm in order to have sufficient transparency.

Further, in addition to the above-mentioned transparent electrodes, the anode may be made of metal having a large work function, such as Cr (chromium), Ni (nickel), Cu (copper), Sn (tin), W (tungsten), Au (gold) or the like, or ally or oxide thereof. Further, it may be a laminated structure using a plurality of materials mentioned above. It is noted that, in the case of no use of a transparent electrode as the anode, the anode is preferably made of a material which can reflect light in order to utilize the effect of a light angle changing means at maximum. It is noted that in the case of no use of a transparent electrode as the anode, a cathode is formed of a transparent electrode.

Further, the anode may be formed thereon with an amorphous carbon film. In this case, it can also serve as a hole injection electrode. That is, holes are injected into the luminous layer or the hole transport layer from the anode through the intermediary of the amorphous carbon film. The amorphous carbon film is formed between the anode and the luminous layer or the hole transport layer by a sputter technique. As a carbon target for sputtering, isotropic graphite, anisotropic graphite, grassy carbon or the like may be used, and in particular, high purity isotropic graphite is preferable although it should not be specifically limited thereto. The amorphous carbon film is excellent specifically in view of the following points: By measuring the work function of the amorphous carbon film with the use of a surface analyzer manufactured by Riken Keiki Co., an amorphous carbon film exhibit a work function $W_c$=5.40 eV. In particular, the work function of ITO which is in general used for the anode is $W_{ITO}$=5.05 eV, it had better to use the amorphous carbon film in order to efficiently inject holes into the luminous layer or the hole transport layer. Further, in the case of forming the amorphous carbon film by a sputter technique, reactive sputtering is carried out under the atmosphere of a mixed gas consisting of nitrogen or hydrogen and argon since the electric resistance of the amorphous carbon film is controlled. Further, in a thin film forming technique such as a sputter technique, a thin film having a film thickness of not greater than 5 nm, has an island structure, and accordingly, no homogeneous film cannot be obtained. Thus, an amorphous carbon film having a film thickness of not greater than 5 nm cannot produce efficient luminous emission, and accordingly, the effect of the amorphous carbon film cannot be expected. The amorphous carbon film having a film thickness of not less than 200 nm, has a black color tone, and accordingly, light emitted from the organic electroluminescence element cannot be sufficiently transmitted.

Further, the material of the luminous layer is preferably a fluorescent substance which has a fluorescence property in a visible region, having a satisfactory film making ability, and which may be, in addition to $Alq_3$ and be-benzoquinolinol ($BeBq_2$), a fluorescent brightening agent of benzoxazole group including 2,5-bis(5,7-di-t-pentyl-2-benzoxazolyl)-1, 3,4-thiadiazole, 4,4'-bis(5,7-di-(2-methyl-2-butyl)-2-benzoxazolyl)stilbene, 2,5-bis(5,7-di-t-bentyl-2-benzoxozolys) thiophene, 2,5-bis([5-α,α-dimethylbenzil]-2-benzoxazolyl)thiophene, 2,5-bis[5,7-di-(2-methyl-2-butyl)-2-benzoxazolyl)-3,4-diphenylthiophene, 2,5-bis(5-methyl-2-benzoxazolyl)thiophene, 4,4'-bis(2-benzoxazolyl) biphenyl, 5-methyl-2-[2-[4-(5-methyl-2-benzoxazolyl) phenyl]vinyl]benzoxazolyl and 2,[2-(4-choropheyl)vinyl]

naphtha[1,2-d]oxazole, a benzothiazole group including 2,2-(P-phenylenedivynylene)-bisbenzothiazolyl, or a benzimidazole group including 2-[2-[4-(2-benzimidazolyl)phenyl]vinyl]benzimidazole and 2-[2-(4-carboxyphenyl)vinyl]benzoimidazole, 8-hydroxyquinoline group metal complex group including bis(8-quinolinol)magnesium, bis(benzo-8-quinolinole)zinc, bis(2-methyl-8-quinolinolato)-aluminumoxido, tris(8-quinolinole)indium, tris(5-methyl-8-quinolinole)aluminum, 8-quinollitium, tris(5-choloro-8-quinol)gallium, bis(5-choloro-8-quinolinole)calcium, poly(zinc-bis(8-hydroxy-5-quinolinolyl)methane, metal chelate oxinoido compound such as dilithiumepindolidion, styrylbenzene compound including 1,4-bis(2-methylstyryl)benzene), 1,4-(3-methylstyryl)benzene, 1,4-bis(4-methylstyryl)benzene, distyryl benzene, 1,4-bis(2-ethylstyryl)benzene, 1,4-bis(3-ethylstyryl)benzene, 1,4-bis(2-methylstyryl)2-enzene, methylbenzene distyrylpyrazine derivatives including 2,5-bis(4-methylstryl)pyrazine, 2,5-bis(4-ethylstryl)pyridine, 2,5-bis[2-(1-naphthyl)-vinyl]pyridine, 2,5-bis(4-methoxylstryl)pyridine, 2,5-bis[2-(4-bipheynl)vinyl]pryradine, 2,5-bis[2-(1-pyrenyl)vinyl]pyrazine, naphtalimido derivatives, perylene derivatives, oxadiazole derivatives, aldazine derivatives, cyclopentane dien deviatives, strylamin derivatives, coumarin group derivatives or aromatic group dimethylidene derivatives. Further, there may be used anthracene, salicylate, pyrene, coronene or the like. Alternatively, mineral phosphate luminous material including fac-tris(2-phenylpyridine)iridium may be used. Furhter, the luminous layer may be made of not only low molecular materials but also polymeric materials. As to the polymeric material, there may be enumerated methoxy-ethylhexsixy-polyphenylenevinlene (MEH-PPV). If the polymeric material is used, there may be enumerated, as a preferable example, MEH-PPV may be used in combination of polytiophene (poly(ethylenedioxy)tiophene, PEDOT) as the hole transport layer which will be described later.

In addition to a single layer structure having a luminous layer, there may be used either of a two layer structure having a hole transport layer and a luminous layer or having an electron transport layer, and a three layer structure having a luminous layer, a hole transport layer, and a luminous layer and an electron transport layer. However, in the case of the two layer structure or the three layer structure, it is formed through such a lamination that the hole transport layer and the anode, or the electron transport layer and the cathode are adjacent to each other.

Further, the hole transport layer is preferably made of a material in which the mobility of holes is high, which is transparent and which has a high film making ability. In addition to TPD, there may be used a porphyrin compound such as porphine, tetraphenylporphyrin copper, phthalocyanin copper phthalocyanin or titaniumphthalocyanin, aromatic tertiary amine such as 1,1-bis{4-(di-P-trylamino)phenyl}cyclohexane, 4,4'4"-trimethyltriphenylamine, N,N,N',N'-tetrakis(P-tlyl)-P-Phenylenediamine, 1-(N,N-di-P-trylamino)naphthalene, 4,4'-bis(dimethylaminso)-2-2'-dimethyltriphenylmetane, N,N,N',N'-tetraphenyl-4,4'-diaminobiphenyl, N,N'-diphenyl-N, N'-di-m-tryl-4, N,N-diphenyl-N, N'-bis(3-methylphenyl)-1, 1'-4,4'-diamine or 4'-diaminobiphenyl, N-phenyl-carbazole, stilbene compound such as 4-di-P-trylaminostilbene or 4-(di-P-trylamino)-4'-(4-(di-P-trylamino)stylil]stilbene, triazole derivatives, oxadizaole derivative, imidazole derivative, polyarylalkane derivatives, pyrazoline derivatives, pyrazazolone derivatives, phenylenediamine devatives, anylamine derivatives, amino-substituted-chalcone derivatives, oxazole derivatives, strylanthracene derivatives, fluorenone derivatives, hydrazone derivatives, silazane derivatives, or an organic material such as polysilane group aniline copolymer, polymer oligomer, strylamine compound, aromatic dimethylidene or poly3-methylthiophene. Further, there may be also used a polymer disperse group hole transport layer in which a low molecular organic material for a transport layer is dispersed in a polymer such as polycarbonate.

Further, the electron transport layer is made of an oxadiazole derivative such as 1,3-bis(4-tert-butylphenyl-1,3,4-oxadiazole)phenylene(OXD-7), anthraquinodimethane derivative or diphenyl quinone derivative.

The cathode is an electrode for injecting electrons, that is, it is required to efficiently inject electrons into the luminous layer or an electron transport layer, and it is made of metal having a small work function, such as Al (aluminum), In (Indium), Mg(magnecium), Ti (titanium), Ag (silver), Ca (calcium) or Sr (strontium), an alloy or oxide or fluoride of the former metals, a laminated body thereof or the like. In order to maximize the effect of changing light angle, it is preferable to form the cathode which reflects light.

Further, as to the cathode, a high light transmissible superthin film using a metal having a small work function is formed at an interface at which it abuts on the luminous layer or the electron transport layer, and a transparent electrode is laminated on the upper part thereof in order to form a transparent cathode. Mg, Mg-Al alloy, or any one of Al-Li alloy, Sr-Mg alloy, Sr-Mg alloy and Al-Ba alloy as disclosed in Japanese Paten Laid-Open No. H5-121172, Al-Sr Alloy, Al-Ba alloy or the like, or a laminated body such as $LiO_2$/Al or LiF/Al is preferably used as the material of the cathode.

Further, as a film forming process for this cathode, resistance heating evaporation, electron beam evaporation or sputter technique is used.

It is noted that at least either the anode or the cathode may be transparent. Further, both of them may be transparent, but in order to enhance the efficiency of light extraction, one of them is preferably transparent while the other one of them is reflective.

Further, the organic electroluminescence element may be formed at its front surface with a protecting film for isolating the element from the atmospheric air in order to ensure a stability for a long time. As to the material of the protecting film, there may be used a thin filme made of inorganic oxide such as SiON, SiO, SiN, $SiO_2$, $Al_2O_3$ or LiF, inorganic nitride or inorganic fluoride, a glass film made of inorganic xoide, inorganic nitride, inorganic fluoride or a mixture thereof, photoresost, thermosetting resin, a silane group polymer having a sealing effect or the like. The protecting film is formed by evaporation, sputtering or the like, or coating.

It is noted that the electroluminescence element according to the present invention is used in an image forming apparatus for displaying an image, which may be used as a display in a portable terminal unit such as a mobile telephone or a PHS or a PDA, a display such as a television, a personal computer or a car navigation or a display for an AV equipment such as stereo AV equipment or a radio receiver.

Further, it may be used an illuminating device as a light source for a laser printer, a scanner or the like. Alternatively, it may be simply used as a light source in a room light, a light stand or the like.

Among those as mentioned above, it is preferably used as an illuminating device or a light source in an image forming apparatus as a display unit for displaying an image in various electronic equipment, a laser printer, a scanner or the like.

Embodiment 1-1

In an embodiment 1-1, there may be used an inverted V-like structure of either of both reflection type or transparent type.

It is noted here that the material of the inverted V-like structure of an reflection type, is selected from a group consisting of a metallic reflective material using metallic reflection, such as more than one metal selected from a group consisting of Al (aluminum), Ag (silver), Au (gold), Pl (platinum), Cu (Copper), Li (lithium) Cr (chromium), Ti (titanium), Fe (iron), Ge (germanium), In (indium), Mg (magnesium), Ba (barium), Ni (Nickel), Si (Silicon), Sn (tin), W (tungsten), Zn (zinc), Mo (molybdenum), Ta (tantalum) or an alloy thereof, a laminated body in which films made of those metals are laminated one upon another, resin which utilizes light reflection of conductive resin in which conductive fine particles of at least metal powder or the like are dispersed, and resin using white reflection of white resin in which white pigment is dispersed in conductive resin. Alternatively, in the inverted V-like structure of a reflection type, a reflection type material may be formed on an arbitrary material.

Further, the material of an inverted V-like structure of a transparent type is suitably selected from materials for a transparent or translucent substrate, or it may be hardenable resin such as transparent resist, or the like. It is noted that the material used for the structure of a transparent type should be selected such that the refractive index thereof is smaller than that of a transparent flattened material.

It is noted that a transparent flattening structure is such that an irregular structure caused by the inverted V-like structure is flattened, that is, a fluidic transparent material is cast between inverted V-like structures, and is hardened by measures such as ultraviolet radiation, heat or cooling. As the process therefor, there is preferabl used such a process that a material having a fluidity, such as an optical adhesive or resist is applied on the front surface of the element, and is then flattened with the use of a suitable spacer or squeezee before it is hardened.

Further, as the material of the transparent flattening structure, there may be used a material of a transparent or translucent substrate, a transparent resist material, an optical adhesive of an ultraviolet radiation hardenable type or thermosetting type, or a transparent material which a compound thereof.

Further, the relationship between a refracting angle of light at an interface between different media was and a refractive index of the medium comes under Snell's law. Accordingly, in an organic electroluminescence element which radiates light isotropically, light radiated at an angle greater than its critical angle, repeats total reflection at the interface, that is, the light is confined within the element, and accordingly, it cannot be radiated in the atmospheric air. Thus, it is an important purpose in view of improvement in the efficiency of an organic electroluminescence element, that the angle of light transmitted to an interface between the light extraction surface and the atmospheric air is changed in order to change the angle and the quantity of light radiated into the atmospheric air by changing the angle of light with the use of a light angle changing means for changing the angle of light at an interface. As to this light angle changing means, there have been proposed a lens structure, a mesa structure, a prism structure or the like formed on a substrate, and of these structures, the mesa structure is, in particular, effectively used for measures for enhancing the efficiency of light extraction in view of such a reason that the effect for enhancing the efficiency of light extraction is high, and as well, the effect for enhancing the efficiency of the brightness in directions toward the front surface thereof is high. However, in the case of formation of such a structure on a substrate, the formation thereof is difficult since various restrictions to materials and processes used in the structure, those to a method of forming an organic electroluminescence element, and the like are caused. In particular, in the case of use in an image forming apparatus of an active-matrix type, it is very difficult to form a drive circuit for an organic electroluminescence element in which a mesa structure is sustained.

It is noted here that the mesa structure is such that a top of a pyramid is cut off, and may be denoted as a truncated quadrangular pyramid or a truncated cone. In this embodiment, the mesa structure has a truncated quadrangular pyramid shape.

Accordingly, optical simulation was made for the efficiency of light extraction in such a case that the refractive index of a transparent flattening structure is changed on the basis of a structure of an organic electroluminescence element shown in FIG. 1.

Figure 2:
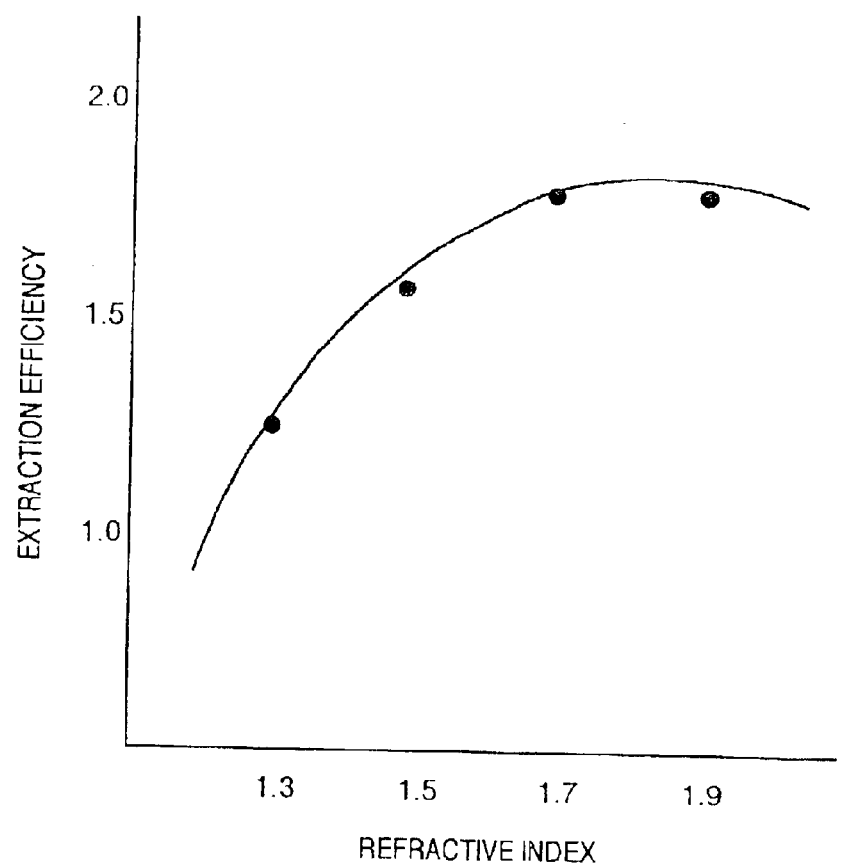
FIG. 2 is a graph showing a result of optical simulation.

FIG. 2 shows the result of the optical simulation. It is noted that the efficiency of light extraction in the case of changing the refractive index of the transparent flattening structure is shown in the form of a relative value with respect to the efficiency of light extraction in a planar substrate having no mesa structure.

Next, specific explanation will be made of a condition of the optical simulation, that is: as to the refractive indices of the layers as follow: luminous layer=1.7, ITO=2.0, substrate=1.5 and air=1.0, and further, as the film thickness of the layers, luminous layer=150 nm, ITO=150 nm, substrate=1 mm, and inverted V-like structure=100 $\mu$m, a tapering angle of the apex part of the inverted V-like structure being set to 40 deg. It is noted that light from the luminous layer were considered to be reflected at the interface between the luminous layer and the cathode, and accordingly, only absorption in the luminous layer, the ITO and the substrate were taken into account. That is, the cathode had a reflectance ratio of 100%, and the luminous layer, the ITO, the substrate and the transparent flattening structure had reflectance ratios of 80%, 97%, 97%, 97%, respectively. It is noted here that the refractive index of the transparent flattening structure was set to 1.3, 1.5, 1.7, 1.9, respectively during the simulation.

In the above-mentioned condition, Fig. shows the value of efficiency of light extraction while the refractive index of the transparent flattening structure is changed, which is obtained by calculation, and it is understood that the value of efficiency of light extraction becomes greater as the refractive index is greater, and it has an infection point around a refraction index value of 1.7 at which the increase rate of the efficiency of light extraction is lowered. From the result of the above-mentioned calculation, as the greater the refractive index of the transparent flattening structure, the greater the efficiency of light extraction, the refractive index of the transparent flattening structure is preferably in a range from 1.4 to 2.5, and in particular, in a range from 1.7 to 1.9.

As the material of the inverted V-like structure for reflecting light, there may be used the material of the above-mentioned inverted V structure of a reflection type. Further, it may be formed of any arbitrary medium. Thus, wiring or a circuit can be located within the V-like structure.

It is noted here that no practical problem is caused even though the apex part of the inverted V-like structure has a shape of a surface such as a flat surface or a curved surface, since it does not appreciably affect the effect relating to the above-mentioned light extraction.

In the case of using an organic electroluminescence element in an image forming apparatus such as a display unit, or in an illumination system such as a light source for a printer, the design as to the above-mentioned light orientation is important. For example, in the case of using it as a display unit in a portable terminal unit or a cash dispenser, it is sufficient that only a user himself can recognize a pattern displayed thereon, that is, it has better that the visibility therearound is low as possible as it can. Alternatively, in the case of using it as a printer light source, it is desirable to project strong light to only a part of a photosensitive medium which corresponds to an aperture, and accordingly, it is sufficient that the light has a brightness only in a normal direction from the aperture, and it is preferable that radiation of light therearound is less. In these cases, it is preferable to set the light radiated from the aperture to be strong substantially in the normal direction, but weak therearound, that is, highly directive light extraction is preferable.

Further, in the case of the provision of a mesa structure in an image forming apparatus such as a display unit, it is important to effectively use light radiated from a pixel, and accordingly, if the direction of the pixel is coincident with the direction of the inverted V-like shape structure, the inverted V-like structure can be arranged without decreasing a light emitting part in the pixel, thereby it is possible to attain efficient light angle changing effect.

It is noted here that in the case of using an organic electroluminescence element in which a mesa structure is formed on a substrate, as an image forming apparatus such as a display unit, light radiated from an arbitrary pixel which comes to another pixel by way of the substrate is radiated into the atmosphere from another pixel, that is, the so-called stray light is caused, resulting in occurrence of deficiency such as lowering of contrast, light bleeding or blurring. Accordingly, it is preferable that the thickness from the mesa structure to the light extraction surface is sufficiently small. In particular, it is important in the case of using a reflection type inverted V-like structure.

Embodiment 1-1

Explanation will be hereinbelow made of an embodiment 1-1 of the present invention with reference to the drawings.

At first, an organic electroluminescence element in the embodiment 1-1 of the present invention will be explained with reference to FIG. 1 which is a sectional view illustrating an essential part of the organic electroluminescence element in the embodiment 1-1 of the present invention.

Referring to FIG. 1, there are shown a substrate 1, an anode 2 formed on the substrate 1, a hole transport layer 3 formed on the anode 2, a luminous layer 4 formed on the hole transport layer 3, a cathode 5 formed on the luminous layer 4, an inverted V-like structure 7 formed on the substrate 1, and a transparent flattening structure 8 formed on the cathode 5.

The organic electroluminescence element in the embodiment 1-1 incorporates a mesa structure consisting of the inverted V-like structure 7 and the transparent flattening structure 8 as a means for enhancing the efficiency of light extraction on the substrate 1 at its front surface on the element side. This mesa structure is adapted to change the angle of light radiated from the luminous layer into an angle which is smaller than a critical angle causing total reflection at an interface between a light extraction surface and the atmospheric air.

It is noted that the materials constituting the organic electroluminescence element and a method of forming thereof should not be limited to those in this embodiment, and they may be those as stated above or those as conventionally well-known.

Further, explanation has been made in the embodiment 1-1 of a two layer structure composed of the hole transport layer and the luminous layer, but the invention should be limited in particular to this configuration, as stated above.

Further, explanation has been made in the embodiment 1-1, of such a case that the anode is formed on the upper surface of the substrate, but the invention should not be limited in particular to this case. For example, the cathode may be formed on the upper surface of the substrate.

Further, a sealing configuration can be obtained by adhering a glass cap to the light extraction surface with the use of UV curable resin or the like without the glass cap making close contact with the light extraction surface, by forming a protecting film on the outer surface of the organic electroluminescence element and so forth. In addition, the combination of the protecting film and a shield structure may be used. Further, there may be used such a structure that the protecting layer is formed, and then, the transparent flattening structure is formed on the upper surface thereof.

As stated above, in this embodiment 1-1. light can be extracted with a high degree of efficiency, thereby it is possible to maintain the function of highly efficient light emission.

The organic electroluminescence element in the embodiment 1-1 of the present invention, can be used as an illumination device or an image forming apparatus.

Embodiment 1-2

Explanation will be hereinbelow made of an image forming apparatus using an organic electroluminescence element organic electroluminescence element in an embodiment 1-2.

Figure 3A:
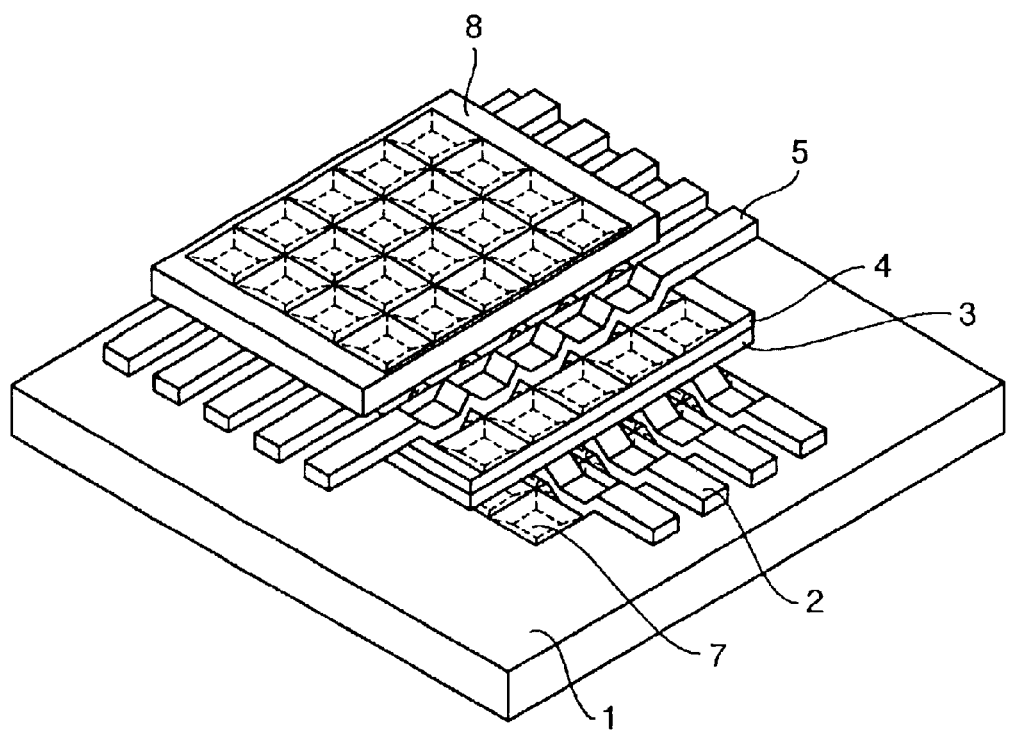
FIG. 3a is a schematic perspective view illustrating an image forming apparatus using an organic electroluminescence element in an embodiment 1-2 of the present invention.

Referring to FIG. 3a which is a schematic perspective view illustrating an image forming apparatus using the organic electroluminescence element in the embodiment 1-2 of the present invention, in the embodiment 1-2, the anode 2 is formed in a line-like pattern so as to have line electrodes in parallel with one another, and the cathode 5 is similarly formed in a line-like pattern so as to have line electrodes in parallel with one another and substantially orthogonal to those of the anode 2. Pixels are defined between the line electrodes of the anode 2 and the line electrodes of the cathodes 5 at crossing points therebetween.

The image forming device is connected to a driver circuit (which is not shown), the anode 2 being positive and cathode 5 being negative, and a d.c. voltage or current is applied between a selected line electrode of the anode 2 and a selected line electrode fo the cathode 5 so as to cause the luminous layer to emit light at a point where both are orthogonal to each other. Thus, it can be used as a simple matrix type image forming apparatus.

The embodiment 1-2 incorporates, on its light extraction surface, the mesa structure composed of the inverted V-like structure 7 and the transparent flattened structure 8, as a means for changing an angle of light. The mesa structure is adapted to change the angle of light radiated from the luminous layer 4 into an angle which is smaller than a critical angle which causes total reflection at the interface between the substrate having a high refraction index, and the atmospheric air, and the mesa structure is arranged periodically at every pixel.

As stated above, in the image forming apparatus in the embodiment 1-2, since light can be extracted efficiently, the efficiency of light extraction can be enhanced, and the function of efficient light emission can be maintained. Further, since the orientation of light is strong in the normal direction, the propagation of light in the light transmittable substrate can be restrained at the light extracting surface, and accordingly, it is possible to maintain a function of highly efficient light emission and to improve the visibility without light bleeding and the like being caused.

Further, explanation has been made in the embodiment 1-2 of the simple matrix type image forming apparatus, the invention can be applied to an active matrix type image forming apparatus, by locating the inverted V-like structure 6 in a non-luminous part of a TFT or the like used for driving, within the element forming surface of the substrate, a function of light emission similar to that of the simple matrix type one can be maintained.

Figure 3B:
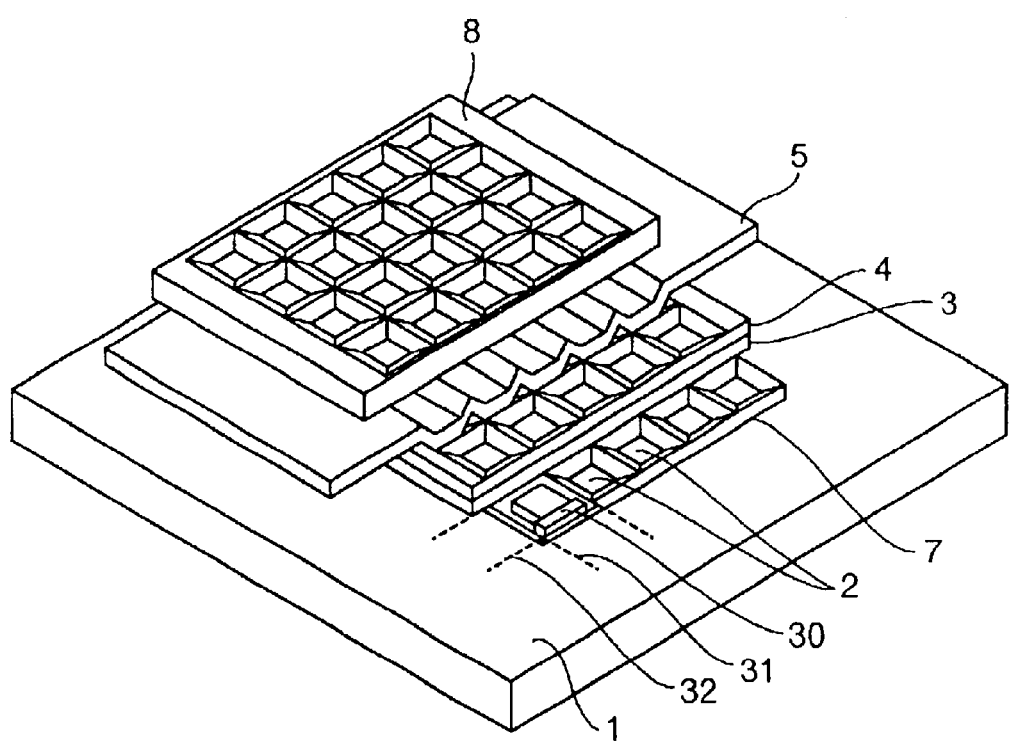

For example, referring to FIG. 3b which shows a perspective view of a variant form of the embodiment 1-2 shown in FIG. 3a, the anode 2 which is patterned so as to have line electrodes. These line electrodes are electrically isolated from each other, and are electrically connected to source lines 32 through the intermediary of switching elements (TFTs) 30 which are connected to gate lines 31 so as to be turned on and off by applying turn-on and -off signals thereto through the gate lines 31. Thus, parts in the luminous layer 4, that is, pixels where the line electrodes of the anode 2 and the line electrodes of the cathode 5 cross to each other luminesce.

Each of the switching elements 30 is formed of a thin film transistor (TFT) having a structure in which a source electrode, a gate electrode and a drain electrode are arranged. That is, a turn-on and -off signals are applied to the gate electrode so as to switch between the source electrode and the drain electrode, and accordingly, current can run between the source electrode and the drain electrode when the turn-of signal is applied, but no current can run between the source-electrode and the drain electrode when the turn-off signal is applied.

The line electrode of the anode 2 is electrically connected to the source electrode when the turn-on signal is applied to the gate line 31. Simultaneously, if a voltage is applied to the source electrode, holes and electrodes are injected into the luminous layer 4 from the anode 2 and the cathode 5, respectively, and accordingly, luminescence is caused in the luminous layer 4. Meanwhile, even when the turn-on signal is applied to the gate line 31, if no voltage is applied to the source electrode, no luminescence is caused in the luminous layer 4.

Further, when the turn-off signal is applied to the gate line 31, the anode 2 is electrically isolated from the source electrode, and accordingly, luminescence is never caused, irrespective of application of a voltage to the source electrode.

As stated above, when the turn-on signal is applied to a gate line while a voltage is applied to a source line, only a pixel associated with these line can selectively emit light. Thus, the line electrodes of the anode 2 which are electrically isolated from one another can selectively emit light, independent from one another, by controlling voltages applied to the gate lines and the source lines. Although a most simple configuration in which a switching element 30 corresponding to one pixel has been explained with reference to FIG. 3b, the switching element may incorporate a signal holding circuit composed of more than two transistors, capacitors and the like so that a pixel which has been applied thereto with the turn-on signal continues light emission until the turn-off signal is applied thereto. Further, the switching element may be composed of a plurality of transistors and a correction circuit for correcting unevenness among the transistors, current and the like.

It is noted that the image forming apparatus in the embodiment 1-2 can be used not only an image forming apparatus itself but an illumination device such a light source for a laser printer or a scanner. Further, without using the linear patterns of the anode 3 and the cathode 5, the whole surface luminance may be effected so as to be merely used as an illumination device.

Reference Example 1-1

A transparent negative resist material (having a refractive index of 1.5) was coated on an opaque substrate made of a composite material of polycarbonate and polyimide by a spin coat process so as to form a resist film having a thickness of 100 $\mu$m which was then subjected to masking, exposure and development so as to have a predetermined pattern, and which was thereafter heated in an oven at a temperature of 220 deg. C. for one hour so as to obtain an inverted V-like structure having a taper angle thereof in a range of 40 to 50 deg.

Next, this substrate was subjected successively to ultrasonic washing with detergent (Semicoclean manufactured by Furuuchi Chemical Co.) for 5 minutes, ultrasonic washing with pure water for 10 minutes, ultrasonic washing with a solution containing one part of hydrogen peroxide and five parts of water with respect to one part of ammonia water by volume, for 5 minutes, and ultrasonic washing with pure water at a temperature of 70 deg.C. for 5 minutes, and thereafter, it was dried by heating after moisture sticking to the substrate was removed by nitrogen blown from a blower.

Next, the substrate with the V-like structure was located in a resistance heating evaporation device which was evacuated up to a degree of vacuum of not greater than $2 \times 10^{-6}$ Torr, and a cathode which was patterned with the use of a metal mask was formed having a film thickness of 150 nm with the use of Al-Li alloy containing 15 at % of Li as an evaporation source.

Next, $Alq_3$ was formed on an cathode by a film thickness of 150 nm similarly in the resistance heating evaporation device so as to form a luminous layer, and then, TPD was formed as a hole transport layer on the luminous layer by a film thickness of about 50 nm. It is noted that the speeds of evaporation of TPD and $Alq_3$ were both 0.2 nm/sec.

Next, it was masked with a metal mask and was then formed on the hole transport layer with an ITO film having a film thickness of 160 nm within a low damage sputter device which was evacuated up to a degree of vacuum of not greater than $2 \times 10^{-6}$ Torr.

Next, a silicon nitride film having a film thickness of 3 $\mu$m as a protecting film was formed on the organic electroluminescence element having irregularities, similarly in the low damage sputter device.

Next, the organic electroluminescence element on which the protecting film was formed, was formed thereon with a reflection film having a film thickness of 100 nm and patterned by a metal mask so as to have a shape of an inverted V-like structure, with the use of Al as an evaporation source in the resistance heating evaporation device which was evacuated up to $2 \times 10^{-6}$ Torr.

Reference Example 1-2

A transparent negative resist material (having a refractive index of 1.5) was coated on a transparent substrate made of polycarbonate by a spin coat process so as to form a resist film having a thickness of 100 μm which was then subjected to masking, exposure and development so as to have a predetermined pattern, and which was thereafter heated in an oven at a temperature of 220 deg. C. for one hour so as to obtain an inverted V-like structure having a taper angle thereof in a range of 40 to 50 deg.

Next, this substrate was subjected successively to ultrasonic washing with detergent (Semicoclean manufactured by Furuuchi Co.) for 5 minutes, ultrasonic washing with pure water for 10 minutes, ultrasonic washing with a solution containing one part of hydrogen peroxide and five parts of water with respect to one part of ammonia water by volume, for 5 minutes, and ultrasonic washing with pure water at a temperature of 70 deg.C for 5 minutes, and thereafter, it was dried by heating after moisture sticking to the substrate was removed by nitrogen blown from a blower.

Next, the substrate with the V-like structure was located in a resistance heating evaporation device which was evacuated up to a degree of vacuum of not greater than $2 \times 10^{-6}$ Torr, and a cathode which was patterned with the use of a metal mask was formed having a film thickness of 150 nm with the use of Al-Li alloy containing 15 at % of Li as an evaporation source.

Next, $Alq_3$ is formed on an cathode by a film thickness of 60 nm similarly in the resistance heating evaporation device so as to form a luminous layer, and then, TPD was formed as a hole transport layer on the luminous layer by a film thickness of about 50 nm. It is noted that the speeds of evaporation of TPD and $Alq_3$ were both 0.2 nm/sec.

Next, it was masked with a metal mask and was then formed on the hole transport layer with an ITO film having a film thickness of 160 nm within a low damage sputter device which was evacuated up to a degree of vacuum of not greater than $2 \times 10^{-6}$ Torr.

Next, a silicon nitride film having a film thickness of 3 μm as a protecting film was formed on the organic electroluminescence element having irregularities, similarly in the low damage sputter device.

Next, the organic electroluminescence element having irregularities and protected by the protecting film was coated thereover with UV curable transparent resin (having a refractive index of 1.6 so as to have a flattening structure with the use of a flattening jig with a 200 μm space having a thickness of 200 μm, which was cured by irradiation of UV thereto.

Reference Example 1-3

A TFT array in which pixel electrodes made of Cr were connected to signal lines through the intermediary of a TFT made of amorphous silicon was formed on a transparent substrate made of glass.

A negative resist material was coated over the front surface of the substrate of the TFT array by a spin coat process so as to form a resist film having a thickness of 5 μm, and was then subjected to exposure and development while non light emitting parts where no pixel electrodes were present was subjected to masking so as to obtain the TFT array substrate in which only the non-like emitting parts were covered thereover with the resist film.

Next, this TFT array substrate was subjected successively to ultrasonic washing with detergent (Semicoclean manufactured by Furuuchi Co.) for 5 minutes and ultrasonic washing with pure water for 10 minutes, and then was dried by heating after moisture sticking to the substrate was removed by nitrogen blown from a blower.

Then, Al is formed on the front surface of the TFT array by a film thickness of about 100 μm in a resistance heating evaporation device which was evacuated up to a degree of vacuum of not greater than $2 \times 10^{-6}$ Torr, and a resist material (OFPR-800 manufactured by Tokyo Ouka CO.) was coated on the front surface of the array substrate by a spin coat process so as to form a resist film having a thickness of 10 μm. Then, it was subjected to masking, exposure and development for patterning in order to cover the non-light emitting part with the resist film. Next, the substrate was soaked in etchant with 50% of Al at a temperature of 60 deg.C. so as to etch the Al film in a portion where no resist film was formed, then after over-etching in the etchant for a while, the resist film was also removed. Finally, the TFT array substrate formed in the non-light emmiting part thereof with an inverted V-like structure made of Al and having a taper angle of 30 to 50 deg. was obtained.

Next, after ultrasonic washing with pure water at a temperature of 70 deg.C. for 5 minutes, moisture sticking to the substrate was removed by nitrogen blow from a blower, and then, the substrate was dried by heating.

Next, the substrate with the V-like structure was formed thereon with a cathode from Al-Li alloy containing 15 at % of Li, as an evaporation source, in a resistance heating evaporation device which was evacuated up to a degree of vacuum of not greater than $2 \times 10^{-6}$ Torr, the thus formed cathode being patterned by a metal mask and having a film thickness of 150 nm.

Next, $Alq_3$ was formed on the cathode so as to form a luminous layer having a film thickness of about 60 nm similarly in the resistance heating evaporation device, and TPD was form on the luminous layer so as to form a hole transport layer having a film thickness of about 50 nm. It is noted that speeds of evaporation of the TPD and the $Alq_3$ was both 0.2 nm/s.

Next, an ITO film having a film thickness of 106 nm was formed on the hole transport layer masked with a metal mask, in a low damage sputter device which was evacuated up to a degree of vacuum of not greater than $2 \times 10^{-6}$ Torr.

Next, a silicon nitride film having a film thickness of 3 μm was formed as a protecting layer on the organic electroluminescence element with irregularities similarly in low damage sputter device.

Next, a transparent resist material was coated over the front surface of the organic electroluminescence element with irregularities, coated thereover with the protecting film, and a flattening structure having a thickness of 200 μm was formed with the use of a flattening jig with a 200 μm spacer, and was then heated and cured in an oven at a temperature of 100 deg.C.

Comparison Example 1-1

An ITO film having a film thickness of 160 nm was formed on a transparent substrate made of glass, similar to the reference example 1-1, and a resist material (OFPR-800 manufactured by Tokyo Ouka Co.) was coated on the ITO film by a spin coat process so as to form a resist film having a thickness of 10 μm, which was then subjected to masking, exposure and development so as to be patterned into a predetermined shape. Next, the substrate was soaked into 50% of hydrochloric acid at a temperature of 60 deg.C so as to etch the ITO film in a part where no resist film was formed, and thereafter, the resist film was removed. Finally, there was obtained the patterned substrate formed thereon with the anode formed of the ITO film with a predetermined pattern.

Then, this patterned substrate was subjected successively to ultrasonic washing with detergent (Semicoclean manufactured by Furuuchi Co.) for 5 minutes, ultrasonic washing with pure water for 10 minutes, ultrasonic washing with a solution in which one part of hydrogen peroxide and 5 parts of water were mixed with respect one part by volume of ammonia water, for 5 minutes and ultrasonic washing with pure water at a temperature of 70 deg.C., and after moisture sticking to the substrate was removed by nitrogen blown from a blower, the substrate was dried by heating.

Further, in a resistance heating evaporation device which was evacuated up to a degree of vacuum of not greater than $2 \times 10^{-6}$ Torr, TPD was formed on the front surface of the patterned substrate on the anode side by about a film thickness of about 50 nm so as to form a hole transport layer.

Next, similarly in the resistance heating evaporation device, $Alq_3$ was formed on the hole transport layer by a film thickness of about 60 nm so as to obtain a luminous layer. It is noted that speeds of evaporation of the TPD and the $Alq_3$ were both 0.2 nm/s.

Similarly in the resistance heating evaporation device, a cathode was formed on the luminous layer by a film thickness of 150 nm a film thickness from Al-Li alloy as an evaporation source containing 15 at % Li.

TABLE 1

|  | Light Emission Efficiency | Visibility at Emission Surface |
|---|---|---|
| Ref. Ex. 1-1 | ○ | ○ |
| Ref. Ex. 1-2 | ◎ | ◎ |
| Ref. Ex. 1-3 | ◎ | ◎ |
| Com. Ex. 1-1 | Δ | Δ |

Next, explanation will be made of an evaluation method and evaluation criteria in Table 1. The light emission efficiency was made by evaluating a degree of brightness of light emission when a constant current was applied to the organic electroluminescence element. The evaluation criteria thereof is such that ◎ is extreme excellent, ○ is excellent, and Δ allowable.

As clearly understood from Table 1, the organic electroluminescence elements stated in the reference examples 1-1, 1-2 and 1-3 all exhibited excellent results in view of the light emission brightness and the visibility at the light emission surfaces thereof in comparison with the organic electroluminescence element in the comparison example 1-1. In particular, the reference examples 1-2 and 1-3 exhibited extreme excellent results in view of the light emission brightness and the visibility at the emission surfaces thereof in the comparison example 1-1. It is understood that the organic electroluminescence elements in the reference examples have high light emission efficiency and excellent visibility in comparison with the comparison example.

Embodiment 2-1

An aperture in an embodiment 2-1 is a surface through which light from a light emitting portion in an organic electroluminescence element is extracted into the atmospheric air, and the light emitting portion is a surface which includes a luminous layer and which actually causes light emission.

It is noted here that although there are various methods of forming an organic electroluminescence element in which the light emitting portion including the luminous layer is formed having an area greater than that of the aperture for light extraction, including a method of stacking a plurality of light transmissible elements one upon another in such a case that the relationship between the aperture and the light emitting portion is parallel, the manufacturing methods thereof are complicated. Thus, in order to materialize the above-mentioned configuration in a simpler way, it is very effective to form the light emitting portion on a surface having an unparallel relationship with respect to the aperture. Further, if an complicated manufacturing method can be used, the organic electroluminescence element having a larger area can be obtained by stacking unparallel surfaces as mentioned above.

It is noted here that the irregular structure may be made of a material similar to the above-mentioned substrate material. Further, in the case of setting the aperture for light extraction at a surface of the substrate, it is preferable to use a transparent material for the irregular structure.

It is noted here that as a method of forming the irregular structure, there may be used a method forming irregularities by stamping or grinding the surface of the substrate, a method in which exposure and development are made with the use of a material having high processability, such as a resist material, a method of dripping in accordance with irregularities and the like. For example, there may be used a method in which resist or the like is introduced into an inject printer, instead of an ink, so as to carry out printing in order to obtain a suitable irregular pattern, a method in which resist is applied on a surface in its entirety, and is roughened so as to form irregularities when the resist has a suitable hardness, a method of applying a sheet-like material in which an irregular structure is formed, and a method in which an irregular structure is formed on a certain medium, and then it is transferred with the use of a heat or a pressure.

It is noted here that the irregular structure is the one which includes a surface formed on the front surface of the substrate and having an unparallel relationship with respect to the substrate. Specifically, it has a shape such as a trigonal pyramid, a quadrangular pyramid, a cone and a polygonal pyramid, and further a truncated trigonal pyramid having a planer apex, a truncated quadrangular pyramid, a truncated cone, or any other truncated polygonal pyramid. Alternatively, it has a shape having a spherical surface or a paraboloid or it has a structure having a shape other than a planar surface, or a composite thereof. It is preferable to have a symmetric structure in order to obtain an isotropic visual performance, and is more preferable to have a structure which are symmetric with respect to a height wise axis. Alternatively, by locating a plurality of arbitrary structures which are sufficiently tiny with respect to pixels, there may be obtain an isotropic visual performance. For example, in the case of using the organic electroluminescence element in a display unit or the like, the pixels in the center part thereof are allowed to have directivity in the normal direction, but pixels in the peripheral part thereof are allowed to have directivity in directions toward the center, and so forth, it is possible to aim at further saving consumption power.

It is noted here that the transparent flattening structure may be made of a material used for the above-mentioned transparent substrate, a transparent resist material, a transparent adhesive or a transparent material in combination thereof. Alternatively, it may be used by suitably selecting a group consisting of a sheet having an irregular structure corresponding to irregularities on a substrate which is formed in a sheet-like shape, composite measures made of adhesive-like transparent resin or the like, etc.

Further, a transparent flattening structure for forming the aperture used in the case of using a surface on the side opposed to the substrate as the light extraction surface, into a planar surface, has irregularities corresponding to an irregular structure formed on the front surface of the substrate, and has a surface opposed thereto, which is a planar surface. This transparent flattening structure may be formed by applying a structure having an irregular surface corresponding to an irregular structure formed on the front surface of the substrate, on it with the use of contact measures such as transparent resin, or by casting a transparent material having a fluidity onto an organic electroluminescence element formed on an irregular structure, or by curing the resin with the use of UV radiation, heating, cooling or the like. As the transparent material having a fluidity, there may be used an optical adhesive, a resist material or the like.

It is noted here that in the case of an internal luminescence type element such as an organic electroluminescence element, light radiated from a fluorescent substance in the luminous layer, is emitted omnidirectionally around the fluorescent sbstance is refracted and reflected under the Snell's law when it passes through the interface between medias, and in the case of the incident side medium having a refractive index greater than that of the emergent side medium, light which is incident at an angle greater than that angle with which the emergent angle of a refracted wave becomes 90 deg., that is, a critical angle, cannot transmit through the interface, but is totally reflected so that the light cannot be extracted into the atmospheric air. Accordingly, the above-mentioned irregular structure is preferably the one which can increase the area of the light emitting portion in comparison with the aperture, and which can effectively extract light. In view of the facility of designing the above-mentioned light extraction and the facility of forming the structure thereof, the irregular structure is preferably isotropic or of the assembly of such structures, and in particular, it is preferably of a shape having a quadrangular pyramid, a cone or a spherical shape having a suitable curvature.

Figure 4:
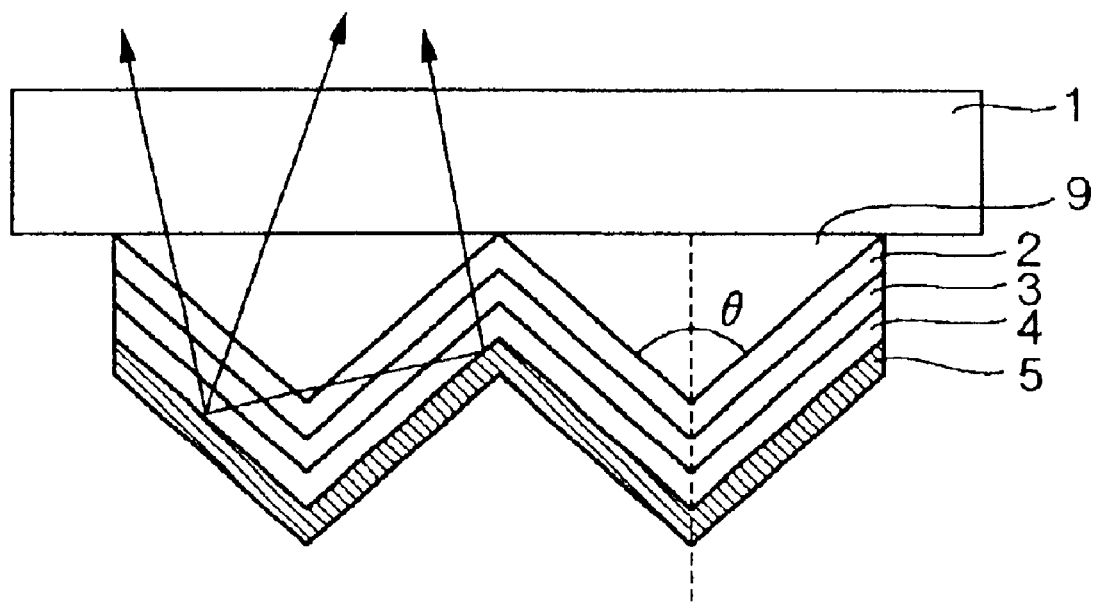
FIG. 4 is a conceptual view for explaining the configuration of layers of an organic electroluminescence element according to the present invention.

Referring to FIG. 4 which is a conceptual view for explaining a laminated configuration of an organic electroluminescence element according to the present invention, a substrate formed thereon a quadrangular pyramid-like irregular structure 9, an anode 2, a luminous layer 4 and a cathode are laminated successively one upon another. It is noted that θ is an apex angle in the irregular structure 9.

The area of the light emitting portion in the organic electroluminescence element having the above-mentioned configuration, becomes 1/sin (90−θ/2) with respect to the area of the aperture, that is, if the apex angle θ of the irregular structure 9 is 80 deg., the area of the light emitting portion becomes 1.3 times as large as that of the aperture. That is, in view of the formula, 1/sin (90−θ/2), the smaller the apex angle θ of the irregular structure 9, the larger the area of the light emitting portion, thus, it is understood that the apex angle θ of the irregular structure is advantageously set to be smaller in order to increase the light emitting area.

However, in the case of using such an irregular structure, since the efficiency of light extraction varies depending upon a value of the apex angle θ of the irregular structure and a refractive index of the irregular part, it has to consider the efficiency of light extraction for this structure. As indicated by the arrow in FIG. 4, there may be presented light which is emitted from the luminous layer 4, and is directly extracted into the atmospheric air through the intermediary of the irregular structure 9, light which comes to the luminous layer 4 on the opposite side by way of the irregular structure 9, and is then extracted into the atmospheric air after it is reflected by the cathode 5, light which is totally reflected at the interface, and is extracted after such reflection is repeated, and light which is totally reflected so that it cannot be extracted.

Thus, on the basis of the configuration of the organic electroluminescence element shown in FIG. 4, optical simulation was carried out in such a case that the apex angle θ of the irregular structure is changed.

Figure 5:
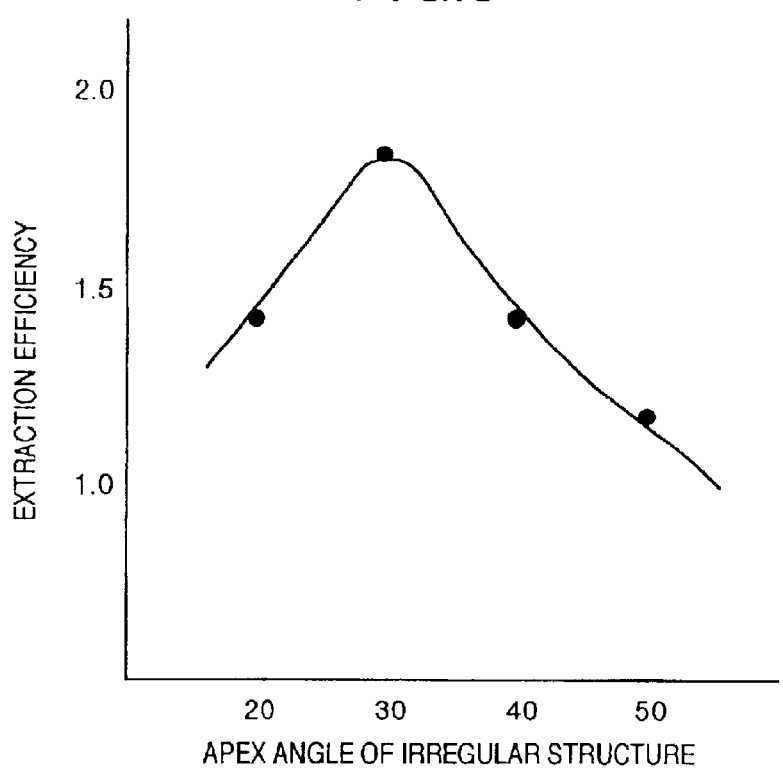
FIG. 5 is a graph showing a result of optical simulation.

Referring to FIG. 5 which is a graph showing results of the optical simulation, the efficiency of light extraction in such a case that the apex angle θ of the irregular structure is changed is exhibited in the form of a relative value with respect to an efficiency of light extraction in a planer substrate with no irregular structure.

Here, explanation will be specifically made of a condition of the optical simulation: as to refractive indices of the layers, the luminous layer=1.7, ITO=2.0, the substrate=1.5, the irregular structure=1.7 and the atmospheric air=1.0, and as to film thickness of the layers, the luminous layer=150 nm, ITO=150 nm, the substrate=1 nm, and the irregular structure=10 μm. Further, it was estimated that the light from the luminous layer is all reflected at the interface between the luminous layer and the cathode, and it was merely considered of absorption in the luminous layer, the ITO and the substrate. That is, a reflectance factor of the cathode was 100%, and transmission factors of the luminous layer, the ITO, the substrate and the irregular structure were 80%, 97%, 97% and 97%, respectively. It is noted here that the apex angle θ of the irregular structure was changed successively to values, that is, θ=140, 120, 100 and 80 during the simulation.

With the above-mentioned condition, results of calculation of values of the extraction efficiency by changing the apex angle θ of the irregular structure are shown in FIG. 5. It is understood that the value of the extraction efficiency becomes maximum around 120 deg. of the apex angle θ of the irregular structure.

In view of the foregoing, consideration will be made of the use life of the organic electroluminescence element in the case of the irregular structure having a refractive index of 1.7 and an apex angle θ=120 deg. of the irregular structure. In this case, as shown in FIG. 5, the efficiency of the element is 1.7 times as high as that of an organic electroluminescence element with no irregular structure. If light is emitted with the same brightness as that of the organic electroluminescence element with no irregular structure, the light required in the aperture may be 1/1.7 as the efficiency of light extraction is 1.7 times as high as that of the organic electroluminescence element with no irregular structure, and the brightness in the light emitting portion is (1/1.7)×(1/1.15)=1/1.96, that is, it may be substantially ½ as the area of the light emitting portion is 1.15 times as large as that of the aperture. Accordingly, the element is extremely effective in view of the use life. Further, as the efficiency of the element is 1.7 times as high, with the above-mentioned irregular structure, it is possible to materialize an element having a high degree of efficiency and a long use life.

As understood from the results of the optical simulation as stated above, it is preferable that the irregular structure preferably has a surface having an angle in a specific angle range in order to enhance the efficiency of light extraction.

Further, in such a case that the organic electroluminescence element is formed of a thin film having a thickness of about 150 nm, and the irregular structure is formed with a sharp angle, since deficiency such as a shot-circuit occurs at this angle, the angle of the irregular structure preferably be gentle, and further, it is preferable to set the irregular structure in an angular range from 60 to 170 deg. with respect to the normal direction of the substrate, and more preferable in an angular range from 100 to 140 deg.

Explanation will be made of optical simulation relating to the efficiency of light extraction on the basis of the organic electroluminescence element shown in FIG. 4, which was carried out in such a way that the refractive index of the irregular structure was changed.

Figure 6:
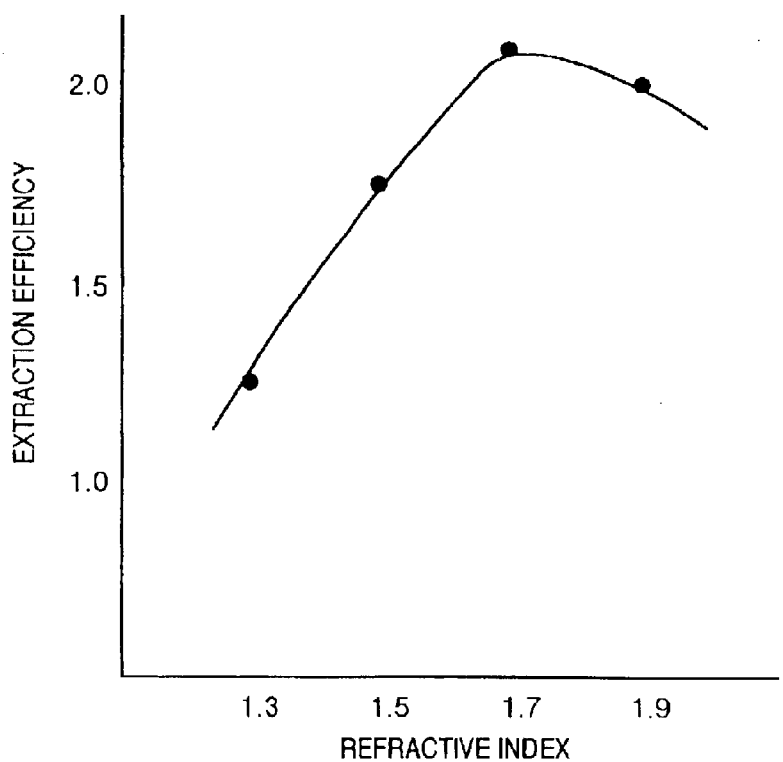
FIG. 6 is a graph showing a result of optical simulation.

Referring to FIG. 6 which is a graph showing results of the optical simulation, the efficiency of light extraction by changing the refractive index of the irregular structure is shown in the form of a relative value with respect to the efficiency of light extraction of a planar substrate with no irregular structure.

Next, explanation will be specifically made of a condition of the optical simulation: as to refraction indices of the layers, the luminous layer=1.7, the ITO=2.0, the substrate=1.5, the air=1.0, and as to the film thicknesses of the layers, the luminous layer=150 nm, the ITO=150 nm, the substrate=1 mm, the irregular structure=10 $\mu$m, and as to the apex angle $\theta$ of the irregular structure, $\theta$=120 deg. It was estimated that light from the luminous layer is totally reflected at the interface between luminous layer and the cathode, and only absorption in the luminous layer, the ITO and the substrate were considered. That is, the reflectance factor of the cathode was 100%, and the luminous layer, the ITO, the substrate and the irregular structure were 80%, 97%, 97% and 97%, respectively. Further, the refractive index of the irregular structure were changed successively to 1.3, 1.5, 1.7 and 1.9 during the simulation.

Referring to FIG. 6 which shows values of the efficiency of light extraction which are calculated by changing the refraction index of the irregular structure, it is understood that the value of the efficiency of light extraction becomes maximum around a refraction index of 1.7.

Further, of the irregular structure formed on the front surface of the substrate and the transparent flattening structure, the one corresponding to the aperture is preferably be made of a transparent material having a refraction index which has a small difference from that of an organic substance of which the luminous layer is made, and as understood from the result of the optical simulation, it is preferably made of a material having a specific index in order to increase the efficiency of light extraction. Thus, the refraction index of the material of which the irregular structure is made is preferably in a range from 1.4 to 2.0, and more preferably in a range from 1.7 to 1.9.

As to a material having a high refractive index used as such, fluoride glass such as BaF, resin having a high refractive index and the like may be enumerated. For example, LaSF has a refractive index of 1.8, BaSF 1.7, polycarbonate 1.6 and acryl ate 1.5. Alternatively, if the irregular structure is tiny, since the transmission factor may be small more or less in the visible range, there may be used an inorganic oxide such as $TiO_3$, or a material having a small transmission factor, such as a transparent resist or a transparent adhesive.

In the case of using the irregular structure or the like in the present invention, by forming the irregular structure in an isotropic or linear structure shape, the orientation of light can be directive, or by forming the irregular structure in an anisotropic or nonlinear shape, the orientation of light can be diffusive. Alternatively, by forming a light converging member such as a lens array in the aperture of an element having no directivity, directive light emission can be obtained, or by forming a member scattering light in the aperture of a highly directive element, uniform light emission having no directivity can be obtained.

For example, in the case of using the element as a display in a portable terminal unit or a cash dispenser, it is sufficient that the display pattern can be recognized only by a user himself, and it is preferable that the visibility therearound is low. Alternatively, in the case of using it as a light source in a printer, since it is desired that strong light is projected onto a part of a photosensitive medium corresponding to the aperture, it is preferable that the light may have a brightness only in the normal direction to the opening while the radiation of light in direction toward the periphery thereof is less. In the above-mentioned case, light emitted from the aperture is preferably radiated so as to be strong in a substantially normal direction therefrom but to be weak in directions toward the periphery thereof, that is, it is preferable to extract light having a high directivity.

Alternatively, in the case of the element as a display unit for a plurality of observers, such as a television or a advertising display unit, it is preferable for the display pattern thereof that the visibility is high not only in the normal direction but also directions toward the periphery thereof, and in the case of using it as a light source for interior indoor lightings, it is preferable to uniformly irradiate light onto an object to be illuminated. In the above-mentioned case, it is preferable that light radiated from the aperture is uniformly irradiated in all directions, that is, it is preferable to extract uniform light having no directivity. In a display unit using an organic electroluminescence element formed therein with a irregular structure, the visibility would be lowered due to affection by moiré or the like. In order to suppress such lowering of the visibility, it is preferable that the irregular structure is arranged in random or the irregular structure is sufficiently small.

In the case of the irregular structure in the present invention, by forming the irregular structure in an isotropic or linear configuration, the orientation of light may be directive, or by forming the irregular structure in an anisotropic or nonlinear configuration, the orientation of light may be diffusive. Alternatively, by forming a light converging member such as a lens array in the aperture of an element having no directivity, light emission having a high directivity may be obtained, or by forming a member for scattering light in the aperture of an element having a high directivity, uniform light emission having no directivity can be obtained.

In a display unit using an organic electroluminescence element formed therein with a irregular structure, the visibility would be lowered due to affection by moiré or the like. In order to suppress such lowering of the visibility, it is preferable that the irregular structure is arranged in random or the irregular structure is sufficiently small.

In the case of using an organic electroluminescence element in an image forming apparatus such as a display unit, or in an illumination system such as a light source for a printer, the design as to the above-mentioned light orientation is important. For example, in the case of using it as a display unit in a portable terminal unit or a cash dispenser, it is sufficient that only a user himself can recognize a pattern displayed thereon, that is, it had be better that the visibility therearound is low as possible as it can. Alternatively, in the case of using it as a printer light source, it is desirable to project strong light to only a part of a photosensitive medium which corresponds to an aperture, and accordingly, it is sufficient that the light has a brightness only in a normal direction from the aperture, and it is preferable that radiation of light therearound is less.

Embodiment 2-1

Explanation will be hereinbelow made of an electroluminescence element in an embodiment 2-1 of the present invention.

Figure 7:
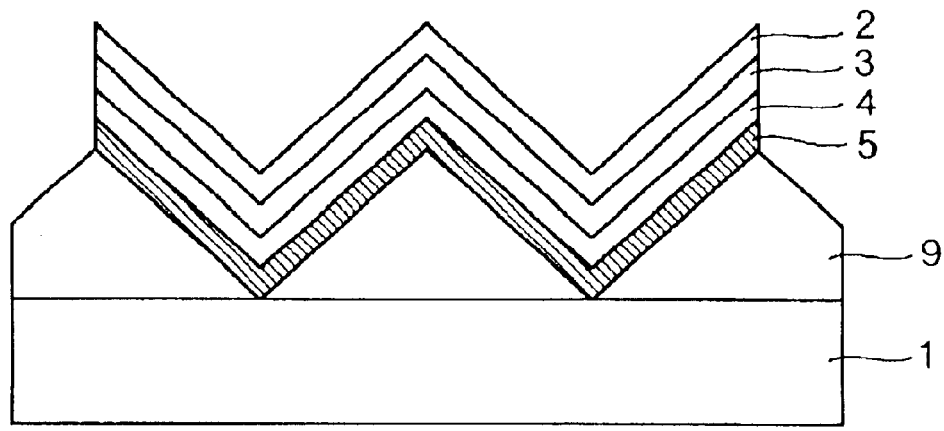
FIG. 7 is a sectional view illustrating an essential part of an organic electroluminescence element in an embodiment 2-1 of the present invention.

Referring to FIG. 7 which is a section view illustrating an essential part of the organic electroluminescence element in the embodiment 2-1, there is shown an irregular structure 9 formed on a substrate 1.

The organic electroluminescence element in the embodiment 2-1 incorporates the irregular structure 9 at a surface of the substrate 1 which makes contact with a cathode 5. With this irregular structure 9, the area of a luminous layer 4 becomes larger in comparison with the area of the light extraction aperture, and light radiated from the luminous layer 4 can be efficiently extracted into the atmospheric air.

Further, in a sealing configuration, a suitable measure can be used in such a way that a protecting film is formed for sealing. In addition, the protecting film may be used in combination of a shield member or the like.

As mentioned above, according to the configuration of this embodiment, light can be efficiently extracted, and the light emission with a high degree of efficiency and a long use life can be maintained since the effective area of the luminous layer can be increased.

Embodiment 2-2

Explanation will be hereinbelow made of an organic electroluminescence element in an embodiment 2-2.

Figure 8:
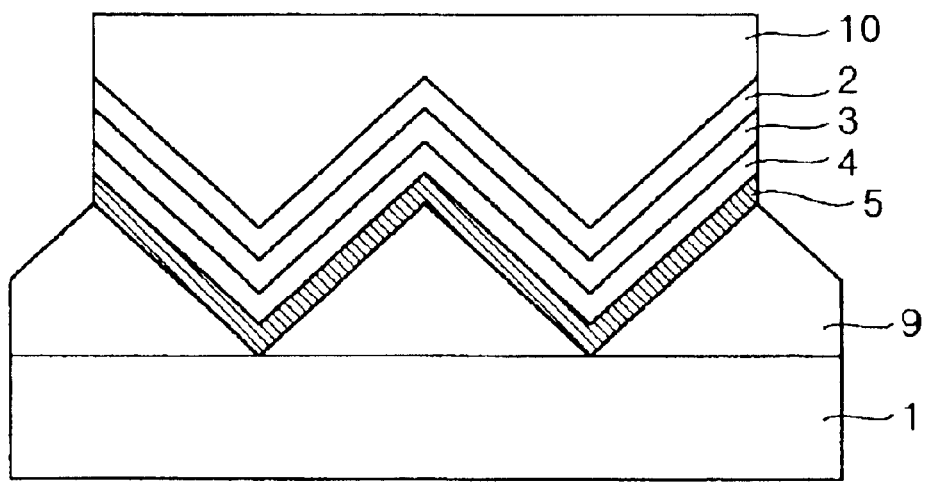
FIG. 8 is a sectional view illustrating an essential part of an organic electroluminescence element in an embodiment 2-2 of the present invention.

Referring to FIG. 8 which is a sectional view illustrating an essential part of the organic electroluminescence element in the embodiment 2-2, there is shown a transparent flattening structure 10 formed on an anode 2.

The organic electroluminescence element in the embodiment 2-2 incorporates the irregular structure 9 at a surface of the substrate 1 which makes contact with an anode on the substrate. With this irregular structure 9, it is noted that the area of a luminous layer 4 becomes larger in comparison with the area of the light extraction aperture, and with the transparent flattening structure 10, light radiated from the luminous layer 4 can be efficiently extracted into the atmospheric air. The materials from which the irregular structure and the transparent flattening structure are made, and the forming method thereof may be suitably selected from the above-mentioned materials and forming methods, or materials and forming methods which have been conventionally well-known so as to prevent obstruction against light emission from the luminous layer.

Although explanation has been made of such a case that the cathode 5 is formed on the upper surface of the substrate 1 in the embodiment 2-2, the present invention should not be limited in particular to this configuration. For example, the anode 2 may be formed on the upper surface of the substrate 1.

As mentioned above, according to the configuration of this embodiment, light can be efficiently extracted, and the light emission with a high degree of efficiency and a long use life can be maintained since the effective area of the luminous layer can be increased.

The organic electroluminescence element in the embodiment 2-2 may be used as an illumination device or an image forming apparatus such as a display unit.

Embodiment 2-3

Explanation will be hereinbelow made of an image forming apparatus using an organic electroluminescence element in an embodiment 2-3 of the present invention.

Figure 9A:
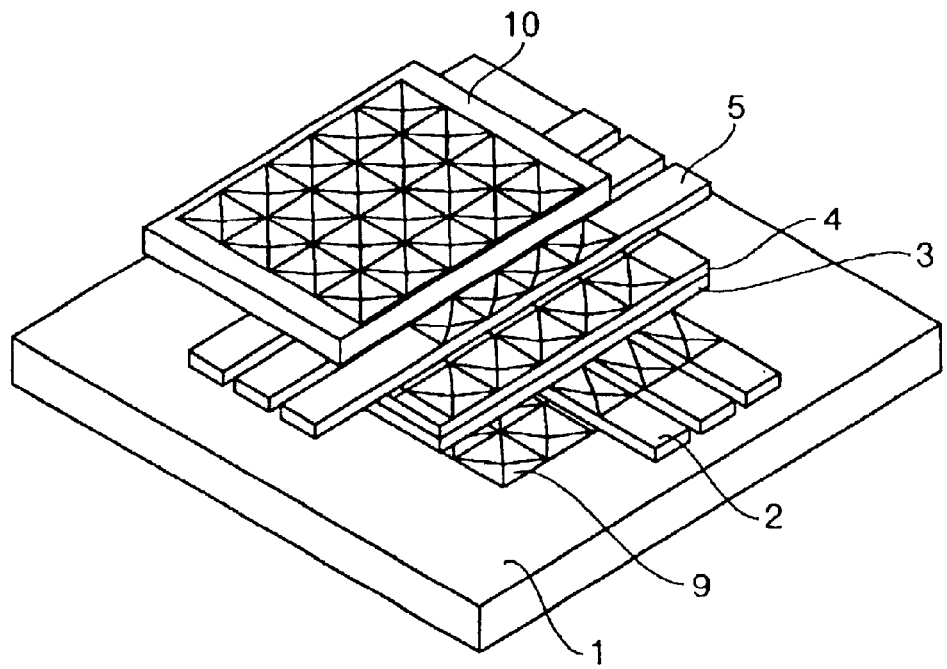
FIG. 9a is a schematic perspective view illustrating an organic electroluminescence element in an embodiment 2-3 of the present invention.

Referring to FIG. 9a which is a schematic perspective view illustrating an image forming apparatus using the organic electroluminescence element in the embodiment 2-3 of the present invention, in this embodiment 2-3, an anode 2 is linearly patterned so as to have line electrodes, and a cathode 5 is also linearly patterned in a similar way so as to have line electrodes orthogonal to these of the anode 2. The image forming apparatus is connected to a drive circuit (driver) as a driving means, which is not shown with the anode 2 being connected to the positive side and the cathode 5 to the negative side, and a d.c. voltage or a d.c. current is applied between a selected electrode of the anode 2 and a selected electrode of the cathode 5 so that the luminous layer 4 emits light a from a position where they are orthogonal to each other. Accordingly, it can be used as a simple matrix type image forming apparatus.

In the embodiment 2-3, the substrate 1 incorporates an irregular structure 9 at a surface which makes contact with the anode 2. With the irregular structure 9, the area of the luminous layer becomes larger in comparison with the area of the pixel aperture, and the light emitting surface is flattened by the transparent flattening structure 10. Thus, light can be efficiently extracted in view of the combination with the irregular structure 9 which is optically desired. Further, although FIG. 9 shows such a case that the size of the luminous layer is equal to that of the pixel, it is preferable that the size of the irregular structure is sufficiently small in comparison with the size of the pixel, and accordingly, a plurality of irregular structures are located in one pixel in order to avoid occurrence of a visual problem such as moiré.

As stated above, also in the image forming apparatus in the embodiment 2-3, the effective area of the luminous layer can be increased, and light can be efficiently extracted, thereby it is possible to maintain a light emitting performance with a high degree of accuracy and a long use life. It is noted that the materials and the method as stated above and those conventionally known may be also be applied to the materials and the methods for forming the anode 2, the hole transport layer 3, the luminous layer 4 and the cathode 5.

Further, in the embodiment 2-3, although the explanation has been made of the simple matrix type image forming apparatus, an active matrix type image forming apparatus is also applicable. In this case, an irregular structure for increasing the area of the luminous layer without lowering the light emission may be formed in a zone where a pixel is formed.

Alternatively, by forming an irregular structure on a drive circuit such as TFT, the area of the aperture can be increased, thereby it is possible to form an image forming apparatus with a high degree of efficiency and a long use life.

Figure 9B:
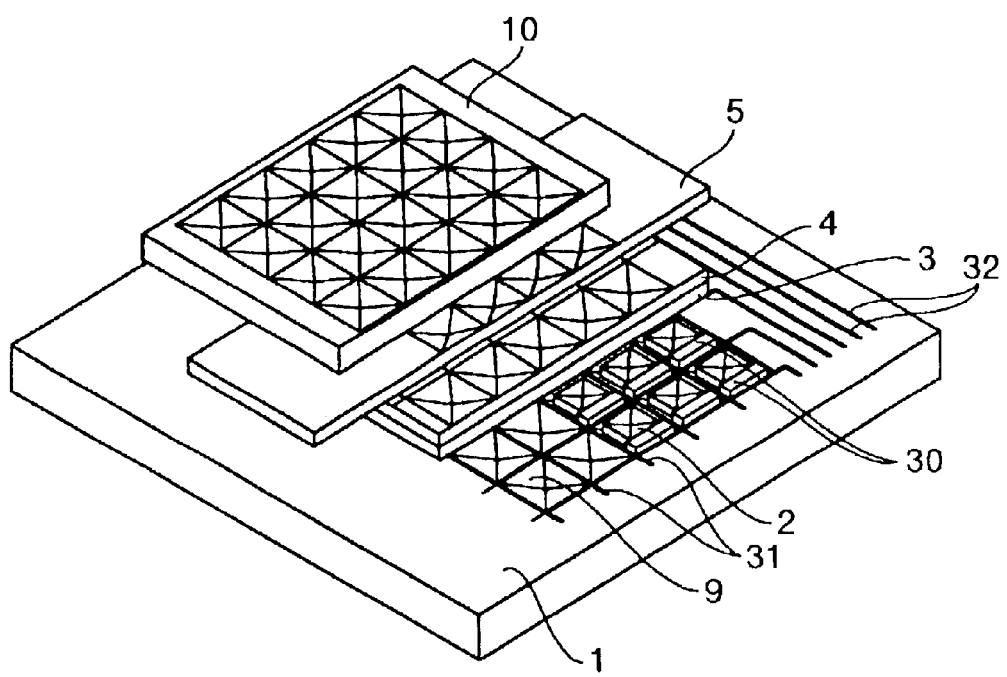

For example, referring to FIG. 9b which shows a perspective view of a variant form of the embodiment 2-3 shown in FIG. 9a, the anode 2 which is patterned so as to have line electrodes. These line electrodes are electrically isolated from each other, and are electrically connected to source lines 32 through the intermediary of switching elements (TFTs) 30 which are connected to gate lines 31 so as to be turned on and off by applying turn-on and -off signals thereto through the gate lines 31. Thus, parts in the luminous layer 4, that is, pixels where the line electrodes of the anode 2 and the line electrodes of the cathode 5 cross to each other luminesce.

Each of the switching elements 30 is formed of a thin film transistor (TFT) having a structure in which a source electrode, a gate electrode and a drain electrode are arranged. That is, a turn-on and -off signals are applied to the gate electrode so as to switch between the source electrode and the drain electrode, and accordingly, current can run between the source electrode and the drain electrode when the turn-of signal is applied, but no current can run between the source-electrode and the drain electrode when the turn-off signal is applied.

The line electrode of the anode 2 is electrically connected to the source electrode when the turn-on signal is applied to the gate line 31. Simultaneously, if a voltage is applied to the source electrode, holes and electrodes are injected into the luminous layer 4 from the anode 2 and the cathode 5, respectively, and accordingly, luminescence is caused in the luminous layer 4. Meanwhile, even when the turn-on signal is applied to the gate line 31, if no voltage is applied to the source electrode, no luminescence is caused in the luminous layer 4.

Further, when the turn-off signal is applied to the gate line 31, the anode 2 is electrically isolated from the source electrode, and accordingly, luminescence is never caused, irrespective of application of a voltage to the source electrode.

As stated above, when the turn-on signal is applied to a gate line while a voltage is applied to a source line, only a pixel associated with these line can selectively emit light. Thus, the line electrodes of the anode 2 which are electrically isolated from one another can selectively emit light, independent from one another, by controlling voltages applied to the gate lines and the source lines. Although a most simple configuration in which a switching element 30 corresponding to one pixel has been explained with reference to FIG. 3b, the switching element may incorporate a signal holding circuit composed of more than two transistors, capacitors and the like so that a pixel which has been applied thereto with the turn-on signal continues light emission until the turn-off signal is applied thereto. Further, the switching element may be composed of a plurality of transistors and a correction circuit for correcting unevenness among the transistors, current and the like.

Further, in the embodiment 2-3, although explanation has been made such that the light extracting surface is set on the surface side opposed to the substrate (on the transparent flattening structure 10 side), the light extracting surface may be set on the substrate 1 side. In this case, an electrode on the substrate 1 side is transparent while an electrode on the light extraction side is reflective (or absorptive), and a flattening structure or a protecting layer is formed as necessary on the reflective electrode. At this stage, it is not necessary to make the flattening structure transparent.

Further, in the embodiment 2-3, although explanation has been made of the case of such a configuration that the anode 2 is formed on the upper surface of the substrate 2, the present invention should not be limited only to this configuration, but the cathode 5 may be formed on the substrate 1 and the irregular structure 9 so as to have such a configuration that the luminous layer 4, the hole transport layer 3, the anode 2 and the transparent flattening structure 10 may be laminated one upon another in the mentioned order.

It is noted that the organic electroluminescence element according to the present invention may be used not only as an image forming apparatus for displaying an image but also as an illumination device serving as a light source for a laser printer, a scanner or the like. Further, without the anode 2 and the cathode 5 being linearly patterned, whole surface light emission may be effected so as to merely use it as an illumination device.

Reference Example 2-1

A transparent material was coated on a transparent substrate made of glass by a spin coat process so as to form a resist film having a thickness of 10 μm was then subjected masking, exposure and development so as to pattern the resist film in a predetermined configuration, and thereafter, the substrate was heat-treated at a temperature of 220 deg.C. so as to obtain a substrate with a tiny irregular structure which is periodically arrayed. Then, an ITO film having a film thickness of 160 nm was formed on the irregular structure of the substrate, then, a resist material (OFPR-800 manufactured by Tokyo Ouka Co.) for patterning was coated on the ITO film by a spin coat process so as to form a resist film having a thickness of 50 μm, and then the resist film was subjected to masking, exposure and development which correspond thereto, so as to pattern the resist film in a predetermined configuration. Next, the substrate was soaked in 50% of hydrochloric acid at a temperature of 60 deg.C., so as to etch the ITO film in a part where no resist film was formed, and thereafter, the resist film for patterning ITO film was also removed so as to obtain the patterned substrate in which an anode formed of the ITO film having a predetermined pattern is formed.

Next, the patterned substrate was subjected successively to ultrasonic washing with detergent (Semicoclean manufactured by Furuuchi Chemmical Co.) for 5 minutes, ultrasonic washing with pure water for 10 minutes, ultrasonic washing with a solution containing one part of hydrogen peroxide and five parts of water with respect to one part of ammonia water by volume, for 5 minutes, and ultrasonic washing with pure water at a temperature of 70 deg.C for 5 minutes, and thereafter, it was dried by heating after moisture sticking to the substrate was removed by nitrogen blown from a blower.

Next, the patterned substrate was located in a resistance heating evaporation device which was evacuated up to a degree of vacuum of not greater than $2 \times 10^{-6}$ Torr, and TPD as the hole transport layer was formed by a film thickness of about 50 nm.

Next, $Alq_3$ is formed on the hole transport layer by a film thickness of 50 nm similarly in the resistance heating evaporation device so as to form a luminous layer. It is noted that the speeds of evaporation of TPD and $Alq_3$ were both 1.0 nm/sec.

Next, similarly in the resistance heating evaporation device, a cathode was formed on the luminous layer by a film thickness of 150 nm from Al-Li alloy containing 15 at % of Li, used as an evaporation source.

Reference Example 2-2

By impressing a block in which several cones were arrayed in a surface made of steel on a transparent substrate made of polycarbonate, so as to obtain the substrate with an irregular structure having cones which was densely arranged in the surface and which havea height of 50 μm and an apex angle of 120 deg. Then, an ITO film having a film thickness of 160 nm was form on the irregular structure of the substrate with the use of metal mask so as to obtain the patterned substrate on which an anode made of the ITO film having a predetermined pattern.

Next, the patterned substrate was subjected successively to ultrasonic washing with detergent (Semicoclean manufactured by Furuuchi Chemcial Co.) for 5 minutes, ultrasonic washing with pure water for 10 minutes, ultrasonic washing with a solution containing one part of hydrogen peroxide and five parts of water with respect to one part of ammonia water by volume, for 5 minutes, and ultrasonic washing with pure water at a temperature of 70 deg.C for 5 minutes, and thereafter, it was dried by heating after moisture sticking to the substrate was removed by nitrogen blown from a blower.

Next, the patterned substrate was located in a resistance heating evaporation device which was evacuated up to a degree of vacuum of not greater than $2 \times 10^{-6}$ Torr, and TPD as the hole transport layer was formed by a film thickness of about 50 nm.

Next, $Alq_3$ is formed on the hole transport layer by a film thickness of 50 nm similarly in the resistance heating evaporation device so as to form a luminous layer. It is noted that the speeds of evaporation of TPD and $Alq_3$ were both 1.0 nm/sec.

Next, similarly in the resistance heating evaporation device, a cathode was formed on the luminous layer by a film thickness of 150 nm from Al-Li alloy containing 15 at % of Li, used as an evaporation source.

Reference Example 2-3

A substrate made of glass was prepared, and the front surface thereof was heated and softened, and by impressing the block which was made of steel and on which quadratic pyramids were periodically arrayed, onto the front surface of the substrate so as to transfer an irregular structure having a predetermined configuration thereonto, thus, there was obtained the substrate with the irregular structure in which quadratic pyramids each having a height of 30 μm and an apex angle of 120 deg. and having a square bottom surface were densely arrayed. Then, the substrate with the irregular structure was subjected successively to ultrasonic washing with a detergent (Semicoclean manufactured by Furuuchi Chemical Co.) for 5 minutes, ultrasonic washing with pure water for 10 minutes, ultrasonic washing with a solution mixed therein with a part of hydrogen peroxide and five parts of water with respect to a part of ammonia water by volume, for 5 minutes, and ultrasonic washing with pure water at a temperature of 70 deg.C for 5 minutes, and thereafter, it was dried by heating after moisture sticking thereto was removed by nitrogen blown from a blower.

Next, the irregular structure formed on the substrate was covered with a metal mask in a resistance heating evaporation device which was evacuated up to a degree of vacuum of not greater than $2 \times 10^{-6}$ Torr, and then a cathode was formed thereon by a film thickness of 150 nm from Al-Li alloy containing 15 at % of Li, which served as an evaporation source.

Next, similarly in the resistance heating evaporation device, $Alq_3$ was formed on the Al-Li alloy by a film thickness of about 50 nm so as to obtain a luminous layer, and similarly, TPD was formed on the luminous layer by a film thickness of about 50 nm so as to obtain a hole transport layer. It is noted that evaporation speeds of both TPD and $Alq_3$ were both 1.0 nm/S.

Next, an ITO film having a film thickness of 160 nm, which was patterned into a predetermined configuration with the use of a metal mask was formed on the luminous layer in a low damage sputter device which was evacuated up to a degree of vacuum of $2 \times 10^{-6}$ Torr so as to obtain an organic electroluminescence element having an irregular configuration.

Next, similarly in the low damage sputter device, a silicon nitride film having a film thickness of 3 μm was formed as a protecting film on the front surface of the organic electroluminescence element having an irregular configuration.

Next, UV curable transparent resing was coated planarly by a thickness of 50 μm with the use of a spin coat process so as to flatten irregularities of the organic electroluminescence element having an irregular configuration and covered thereover with the protecting film, and was then cured by UV radiation.

Comparison Example 2-1

Similar to reference example 2-1, after an ITO film having a film thickness of 160 nm was formed on a transparent substrate made of glass, a resist material (OFPR-800 manufactured by Tokyo Ouka Co.) was coated on the ITO film with the use of a spin coat process so as to form a resist film having a thickness of 10 μm, and the substrate was then subjected to masking, exposure and development so as to pattern the resist film into a predetermined configuration. Then, the substrate was soaked in 50% of hydrochloric acid at a temperature of 60 deg.C., so as to etch the ITO film in a part where no resist film was formed, and thereafter, the resist film was removed so as to obtain a patterned substrate formed thereon with an anode made of the ITO film having a predetermined pattern.

Then, the patterned substrate was subjected successively to ultrasonic washing with a detergent (Semicoclean manufactured by Furuuchi chemcial Co.) for 5 minutes, ultrasonic washing with pure water for 10 minutes, ultrasonic washing with a solution mixed therein with a part of hydrogen peroxide and five parts of water with respect to a part ammonia water by volume, for 5 minutes, and ultrasonic washing with pure water at a temperature of 70 deg.C. for 5 minutes, and thereafter, it was dried by heating after moisture sticking thereto was removed by nitrogen blown from a blower.

Next, TPD was formed by a film thickness of about 50 nm on the front surface of the patterned substrate on the anode side so as to obtain a hole trasport layer in a resistance heating evaporation device which was evacuated up to a degree of vacuum of not greater than $2 \times 10^{-6}$ Torr.

Next, similarly in the resistance heating evaporation device, $Alq_3$ was formed on the hole transport layer by a film thickness of about 60 nm on the hole trasport layer so as to have a lumnious layer. It is noted that evaporation speeds of both TPD and $Alq_3$ were both 0.2 nm/S.

Next, similarly in the resistance heating evaporation device, a cathode was formed on the luminous layer by a film thickness of 150 nm from Al-Li alloy containing 15 at % of Li, as an evaporation source.

TABLE 2

|  | Excitation Life | Emission Efficiency | Visibility at Emitting surface |
|---|---|---|---|
| Ref. Ex. 2-1 | ◉ | ○ | ◉ |
| Ref. Ex. 2-2 | ○ | ○ | ○ |

TABLE 2-continued

|  | Excitation Life | Emission Efficiency | Visibility at Emitting surface |
|---|---|---|---|
| Ref. Ex. 2-3 | ◉ | ◉ | ◉ |
| Com. Ex. 2-1 | Δ | Δ | Δ |

Next, explanation will be made of an evaluation method or evaluation criteria for evaluation items in table 2.

The excitation life of the elements was evaluated in such a way that, by applying a current so as to obtain a predetermined initial brightness in the aperture of the organic electroluminescence element, a time by which the brightness was reduced to its half value was evaluated while the above-mentioned current value was maintained. As to the evaluation criteria, ◉ exhibits extreme excellence, ○ excellence and Δ allowability with respect to the excitation life of the element in the comparison example.

The efficiency of light emission of the elements was evaluated in such a way that, by applying a predetermined current to the organic electroluminescence element so as to obtain an initial brightness, and this initial brightness was evaluated. As to the evaluation criteria, ◉ exhibits extreme excellence, ○ excellence and Δ allowability with respect to the brightness of light emission of the element in the comparison example.

The visibility at the light emitting surface was evaluated such that a degree of visibility was visually checked as to light bleeding or light blurring when the organic electroluminescence element was used as an image forming apparatus having 300 μm pixels. The evaluation was made at three stages: ◉, ○ and Δ, and as to the evaluation criteria, ◉ denotes extreme excellence, ○ excellence and Δ allowability.

As understood from table 2, it was resulted that the organic elelctroluminescence element in the reference example 2-1, 2–2, 2-3 were all excellent in comparison with the organic electroluminescence element in the comparison example 2-1 in view of the excitation life, the brightness and the visibility at the light emitting surface. In particular, it was resulted that the reference example 2-1 was extremely excellent in view of the excitation life and the visibility at the light emitting surface while the reference example 2-2 was extremely excellent in view of all the excitation life, the brightness and the visibility at the light emitting surface in comparison with the comparison example 2-1. It is understood that the organic electroluminescence element according to the present invention can exhibit a long use life, a high degree of light emission and a high degree of visibility which are remarkable in comparison with the organic electroluminescence element in the comparison example.

Embodiment 3-1

At first explanation will be made of the function of a light angle changing panel.

In an organic electroluminescence element in which the relationship between a refraction angle at an interface between different media and a refraction index of a medium follows the Snell's Law, and light is isotropically radiated, light which is radiated at an angle greater than a critical angle repeats total refelction at the interface so that it is confined within the element, that is, it cannot be extracted into the atmospheric air.

Accordingly, it is important for an organic electroluminescence element that by changing the angle of light with the use of a means for changing the angle of light at the interface, the angle of light coming to the interface between the light extracting surface and the atmospheric air is changed so as to improve the angle and the quantity of light radiated into the atmospheric air.

Although various structures such as a lens structure, an irregular structure and a prism structure have been proposed as a light angle changing means provided on a substrate, in the case of the formation thereof on a surface of the substrate, it is required to enable the substrate to have a supporting capability, and accordingly, a structure which is appropriately designed should be formed. Thus, various restrictions are imposed to materials used for the structure, and methods forming the structure, and further, since the structure was present in the upper part of the substrate, it is required to form a luminous layer on the substrate without the structure being damaged, restrictions being imposed to method of forming the luminous layer or the like. Thereby, the materialization thereof is difficult. In particular, it is difficult form a display unit using an organic electroluminescence element in the structure, and accordingly, in the case of a simple matrix display unit, it is extremely difficult to form electrodes opposed to the substrate formed in the structure in a thin strip-like pattern.

On the contrary, with the organic electroluminescence element according to the present invention, the light angle changing can be materialized with no various restrictions to both portion of the organic electroluminescence element and light angle changing panel since an organic electroluminescence light emitting portion which includes the substrate and which is composed of the anode, the luminous layer, the cathode and the like, being laminated on the substrate, and the light angle changing panel are manufactured, separate from each other, and are then both joined to each other.

As the light angle changing panel as configured as mentioned above, there may be presented such a configuration that a structure such as a lens structure, an irregular structure or a prism structure is formed in the panel, or such a configuration that a distribution of refraction indices is provided in the panel so as to change the angle of light.

Figure 10A:
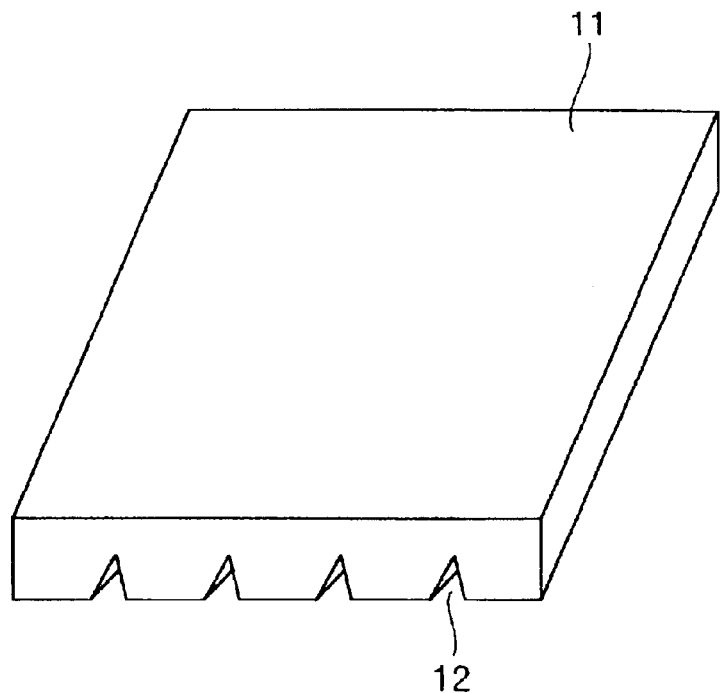
FIG. 10a is a perspective view illustrating an example of a light angle changing panel in an embodiment of the present invention, as viewed from the top side thereof.
Figure 10B:
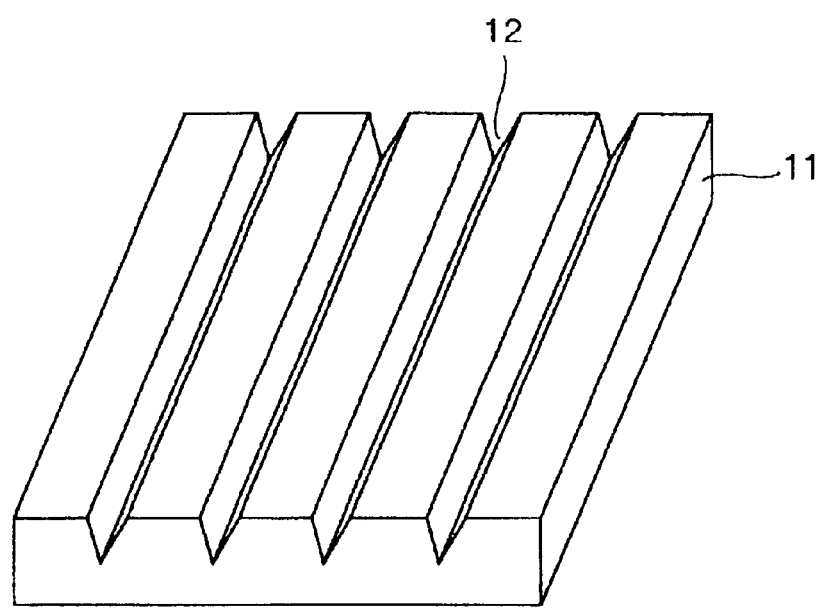
FIG. 10b is a perspective view illustrating an example of a light angle changing panel in an embodiment of the present invention, as viewed from the bottom side thereof.

Inter alia, as a configuration which can be formed by a simple manufacturing process and which is effective for enhancing the efficiency of light extraction, a light angle changing panel formed of a planar panel substrate and having a plurality of grooves which are parallel in one direction within the in-plane direction, is effective. With the use of the light angle changing panel having the above-mentioned configuration, the light extraction with a high degree of efficiency can be materialized. Referring to FIGS. 10a and 10b which are views illustrating an example of a light angle changing panel in the embodiment of the present invention, in which FIG. 10a is a perspective view illustrating the top surface of the panel while FIG. 10b is a perspective view illustrating a bottom surface of the same, there are shown the light angle changing panel 11 and grooves 12. As shown in FIGS. 10a and 10b, the light angle changing panel 11 is formed of a planar panel substrate formed thereon with a plurality of grooves 12 which are parallel with each other in one direction in the in-plane direction.

Figure 11A:
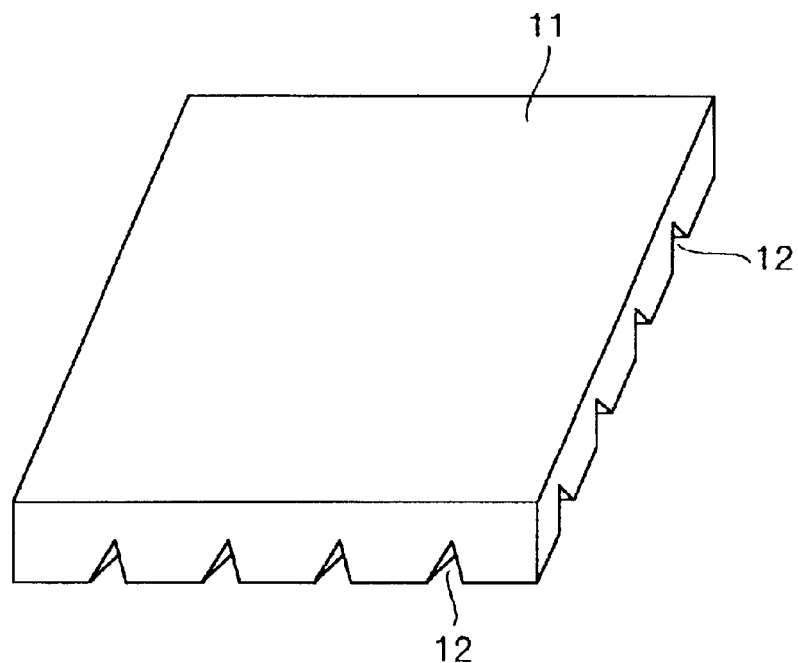
FIG. 11a is a perspective view illustrating an example of a light angle changing panel in an embodiment of the present invention, as viewed from the top side thereof.
Figure 11B:
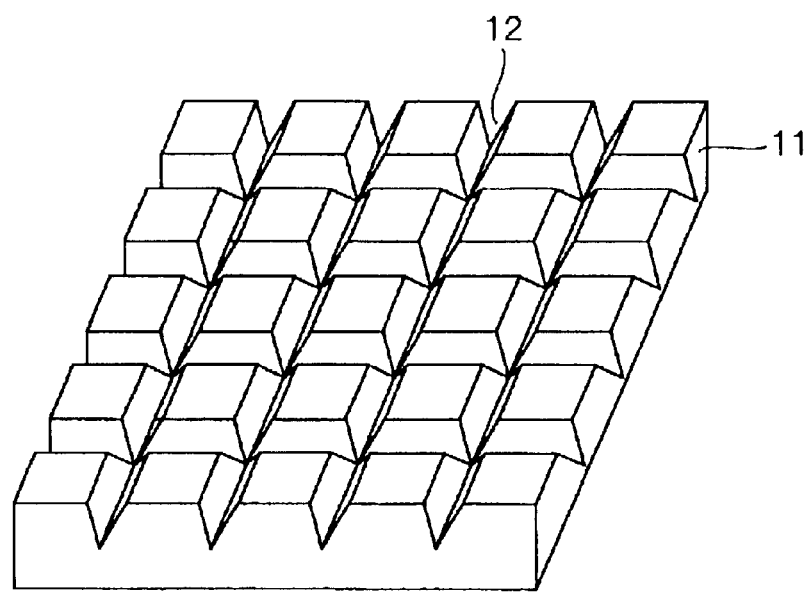
FIG. 11b is a perspective view illustrating an example of a light angle changing panel in an embodiment of the present invention, as viewed from the bottom side thereof.

Further, in the case of the panel having a plurality of grooves in one direction, the light angle is changed only in one direction, and accordingly, it is difficult to effectively change the light angle. Thus, with the use of a light angle changing panel having a plurality of grooves which are parallel in two directions orthogonal to each other in the plane, the manufacture thereof is facilitated while the light extraction with a high degree of efficiency can be materialized. Referring to FIGS. 11a and 11b which show an example of a light angle changing panel in the embodiment of the present invention, in which FIG. 11a is a perspective view illustrating the top surface of the panel while FIG. 11b is a perspective view illustrating the bottom surface of the panel, the light angle changing panel is formed of a planar panel substrate formed therein with a plurality of grooves 12 which are parallel in two direction orthogonal to each other in the plane.

Figure 12:
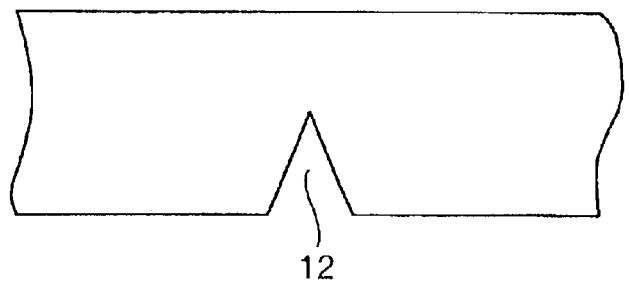
FIG. 12 is a sectional view illustrating a groove formed in the light angle changing panel in an embodiment of the present invention.

Further, although the grooves formed in the light angle changing panel may have any one of shapes if it includes at least a surface which is not in parallel with the panel surface, rectilinear V-like grooves each having a V-like sectional shape are preferable as the grooves formed in the light angle changing panel in view of facilitating a manufacturing process and facilitating a design for light extraction. Referring to FIG. 12 which is a view illustrating the sectional shape of the groove formed in the light angle changing panel in the embodiment of the present invention, the groove 12 has a V-like shape which are rectilinear.

Figure 13:
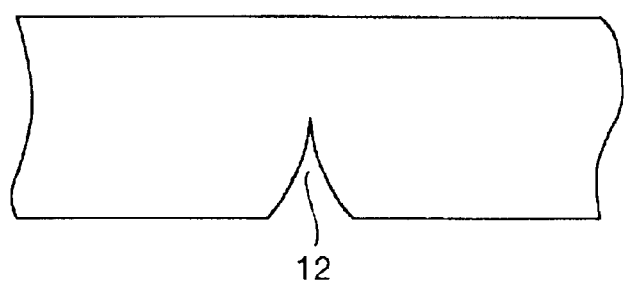
FIG. 13 is a sectional view illustrating a groove formed in a light angle changing panel in an embodiment of the present invention.

In order to enhance the efficiency of light extraction, the grooves formed in the light angle changing panel preferably have a sectional shape with which light can be efficiently extracted in accordance with an angle of light arriving at a side surface and the orientation of light can be optionally designed so as to enhance the intensity of light in the normal direction, and accordingly, they are preferably curvilinear V-like grooves having two inward convex curves in a V-like shape. Referring to FIG. 13 which is a view illustrating a sectional shape of a groove formed in the light angle changing panel in the embodiment of the present invention, there is shown a groove 12. As shown in FIG. 13, the groove has a substantially V-like shape having inward convex curves.

It is noted that the substantially V-like shape according to the present invention is a sectional shape of a groove defined by two surfaces having a nonparallel relationship with the panel surface, and the panel surface, that is, a substantially triangular shape which may be such a substantially triangular shape that its apices are like to a surface which is planar or curved. Further, the rectilinear V-like shape is a groove having the above-mentioned V-like shape whose sectional shape is characterized by two surfaces having a nonparallel relationship with the panel surface, which are planar, and the curvilinear V-like shape defined by inward convex curves is a groove having the above-mentioned V-like sectional shape in which two surface having a nonparallel relationship with the panel surface are such curved surfaces as to be convex inward of a triangular shape.

With the provision of the above-mentioned light angle changing panel, of the light radiated from the luminous layer, the light which is oblique to the light emitting surface and which is likely to be confined in the element due to total reflection can be changed in its angle by total reflection at the interface between the panel and the air in the V-like groove in the panel, and accordingly, it can be extracted in the atmospheric air, thereby it is possible to enhance the efficiency of light extraction and the ling intensity in the normal direction. That is, since the light which is totally reflected before it comes to the light angle changing panel, is not subjected to light angle changing, the light is preferably prevented from passing through an air layer before the light comes to the light angle changing panel from the luminous layer, and further, the light is more preferably prevented from passing through a layer having a low refractive index until it comes to the panel.

In the case of forming the light angle changing panel, although it goes without saying that attention should be directed to the efficiency of light extraction which directly affects the efficiency of the organic electroluminescence element, the attention should be directed to a use-life of the element and a contrast in the case of using the element as a display unit, in addition to the efficiency of the element. Thus, consideration should be taken for a contact area between the light emitting portion of the organic electroluminescence element and the light angle changing means and a distance between the organic electroluminescence element and the light angle changing means.

In the case of joining the light angle changing panel to the image forming apparatus such as a display unit using the organic electroluminescence element, it is important to effectively use light radiated from pixels, and if the direction of the pixel is coincident with the direction of the groove, the groove can be arranged without decreasing the area of a light emitting portion within the pixel, and accordingly, the light angle changing with a high degree of efficiency can be made.

Figure 14:
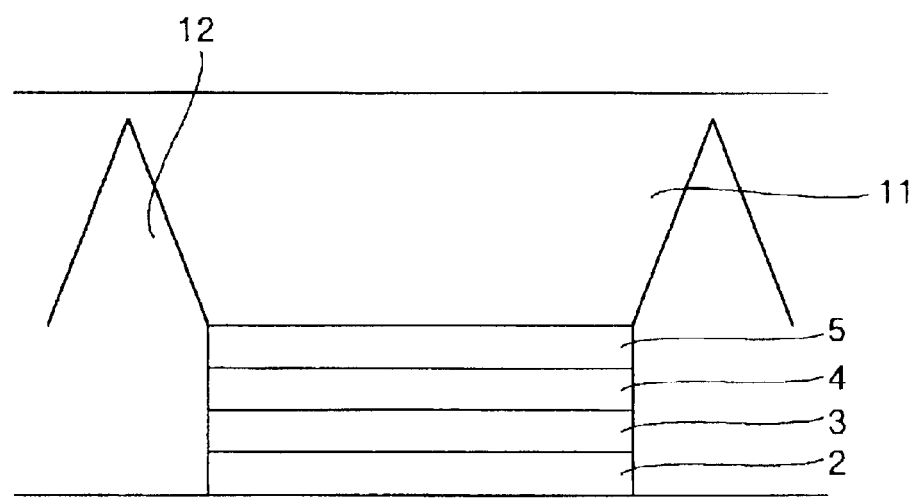
FIG. 14 is a sectional view illustrating an essential part of an organic electroluminescence element in an embodiment of the present invention.
Figure 14:

Referring to FIG. 14 which is a sectional view illustrating an essential part of the organic electroluminescence element in an embodiment of the present invention, the pitches of the V-like grooves 12 in each direction are set to be equal to pitches of light emitting parts in each direction corresponding to each pixel, and the center of the V-like groove 12 is set to a substantially middle point of a line connecting the pixels, and accordingly, the positional relationship between the light emitting parts and the V-like grooves 12 can be set to be identical so that the efficiency of light extraction becomes similar at any of pixels, thereby it is possible to obtain a satisfactory image.

Figure 15:
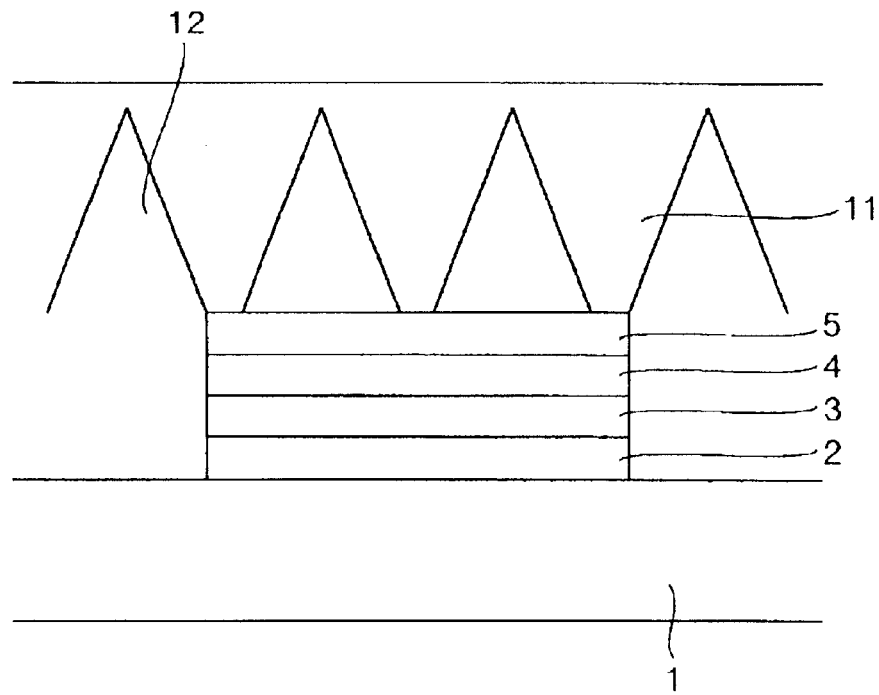
FIG. 15 is a sectional view illustrating an essential part of an organic electroluminescence element in an embodiment of the present invention.

Further, referring to FIG. 15 which is a sectional view illustrating an essential part of organic electroluminescence element in an embodiment of the present invention, pitches of the V-like grooves 12 in each direction are set to be smaller than pitches of light emitting parts in each direction, corresponding to each pixel, and accordingly, a plurality of V-like grooves 12 can be formed in the light emitting part. Thus, the positional relationship between the light emitting part and the V-like groove 12 can be identical without severe positional alignment being required, and accordingly, the efficiency of light extraction becomes similar at any of pixels, thereby it is possible to obtain a satisfactory image.

Figure 16:
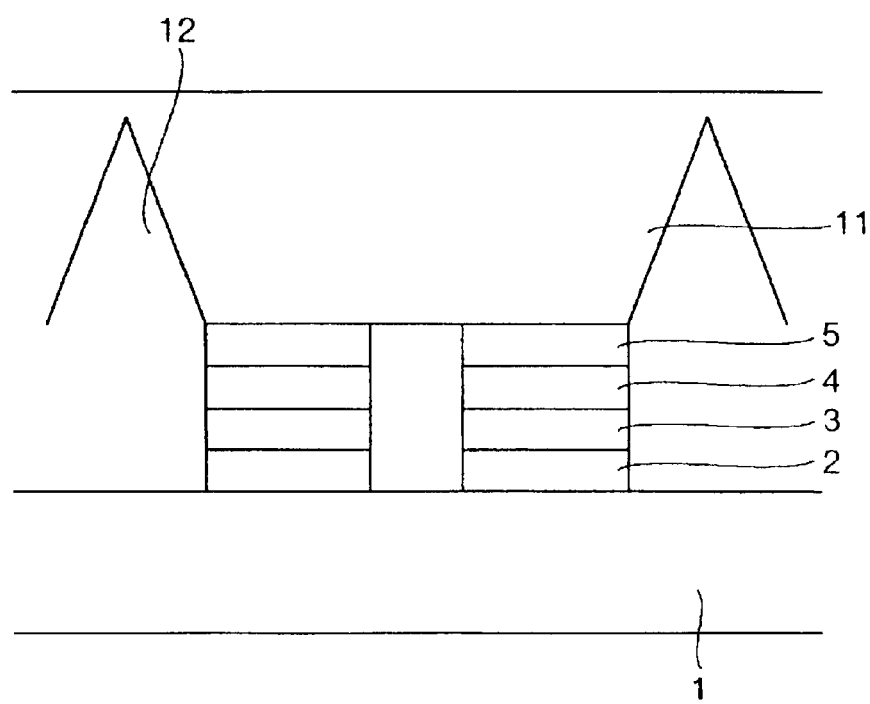
FIG. 16 is a sectional view illustrating an essential part of an organic electroluminescence element in an embodiment of the present invention.

Further, referring to FIG. 16 which is a sectional view illustrating an essential part of the organic electroluminescence element in an embodiment of the present invention, pitches of the V-like grooves 12 in each direction are set to be larger than pitches of light emitting parts in each direction, corresponding to each pixel, and accordingly, the size of the V-like groove 12 can be increased so that the panel can be simply formed, thereby it is possible to facilitate a positional alignment process.

Should an organic electroluminescence element in which a light angle changing panel is formed on a substrate is used as an image forming apparatus such as a display panel, light radiated from an arbitrary pixel would come to a light angle changing panel in another pixel before the light comes to the light angle changing panel, and it would radiated from the another pixel, causing the so-called stray light. Thus, deficiency such as lowering of contrast, light bleeding or blurring would be caused.

Thus, it is preferable to set the thickness from the luminous layer to the light angle changing panel to a sufficiently small value, and the distance between the luminous layer to the convex surface defined by the V-like groove is preferably set to be smaller than the length of one side of a pixel, thereby it is possible to reduce the affection by the stray light.

In order to prolong the use life of the organic electroluminescence element, it is effective to increase the area of the light emitting part with respect to the size of the pixel. However, in the case of the light angle changing by the V-like groove, since the area of the convex surface defined by the V-like groove becomes smaller with respect to the pixel, setting the area of the convex surface to be equal to the area of the luminous layer in the pixel is disadvantageous in view of the long life of the element. Thus, the area of the convex surface defined by the V-like groove is set to be smaller than the area of the luminous layer in the pixel, thereby it is possible to materialize the organic electroluminescence element having a high degree of efficiency and a long use life.

Further, in the case of using the organic electroluminescence element as a display device or the like, or an illumination device such as a light source for a printer, it is important to design the orientation of light as stated above. For example, in the case of using the element as a display unit in a portable terminal unit or a cash dispenser, it is sufficient that a display pattern thereon can be recognized only by a user himself, that is, it is preferable that the visibility therearound is lower. Further, in the case of using the element as a light source in a printer, since it is desired that strong light is projected onto only a part of a photosensitive medium corresponding to the aperture, it is sufficient that the light has a brightness in a direction normal to the aperture, and it is preferable that radiation of light in direction toward the periphery is less. In such cases, light projected from the aperture is preferably strong in the normal direction but is weak in directions toward the periphery, that is, it is preferable to extract highly directive light.

Further, for example, in the case of using the organic electroluminescence element as a television or a display unit for advertisement, which are observed by several persons, the display pattern thereon is preferably highly visible from the periphery thereof in addition to the visibility in the normal direction. Further, in the case of using the element as a light source for interior illumination or the like, the light is preferably irradiated in a uniform manner to an object to be illuminated. In the above-stated cases, light radiated from the aperture is preferably radiated uniformly in all directions, that is, it is preferable to extract uniform light with no directivity.

In the case of using the light angle changing panel according to the present invention, the sectional shape of the V-like groove is set to be symmetric in order to allow the orientation of light to have strong directivity in the normal direction, and further, the orientation of light can be identical for all pixels. Further, the sectional shape of the V-like groove is set to be asymmetric so that the direction of the orientation of light can be changed, and accordingly, the orientation can be designed in accordance an arrangement of the pixels in the peripheral part or the center part. Alternatively, the V-like shape is set to be asymmetric and random, and accordingly, light can be isotropically radiated. Further, the light extraction surface of the light angle changing panel is set to be a light scattering surface in order to scatter light to be extracted, and accordingly, the orientation of light becomes uniform, thereby it is possible to isotropically radiate light.

With the light angle changing panel having the above-mentioned configuration, there may be materialized the organic electroluminescence element in which the visibility characteristic such as the orientation of light can be designed, and the use life can be prolonged due to an increase in the light emission area and which can maintain light emission with a high degree of efficiency.

Further, in the case of joining the light angle changing panel to the element, should the panel be directly joined onto a transparent electrode, there would be caused deficiencies such that the use life and the efficiency of the organic electroluminescence element are affected by moisture or reactive gas contained in an adhesive for joining, exertion of a force upon the panel during joining or after joining would cause the transparent electrode from peeling off from the luminous layer, or shot-circuit between electrodes would hinder the element from emitting light.

Thus, a protecting film is formed on the transparent electrode in order to alleviate damages, and the light angle changing panel is affixed thereon. Thus, the above-mentioned deficiency can be eliminated, thereby it is possible to materialize the emission of light with a high degree of efficiency.

In the case of joining the light angle changing panel to the element with the use of a binder such as an adhesive capable of optical coupling or liquid medium such as optical coupling liquid, the binder would possibly enter the inside of the V-like groove. In particular, the smaller the pitches of the V-like grooves, the harder the application of the binder, or the binder would enter at a higher rate due to such a reason that capillary action occurs.

It is noted that the optical binder is made of a material having a refractive index which is substantially equal to that of the light angle changing panel or the luminous layer in order to prevent the light from being totally reflected before the light is incident upon the light angle changing panel, as stated above. Should the material having the above-mentioned refractive index enter into a V-like groove, the efficiency of light angle changing is decreased in the V-like groove. In order to reduce such an affection, it is effective to reserve the optical path at the side surface of the V-like groove, and accordingly, a light reflecting surface is formed on a side surface of the groove, or a surface made of a material having a refractive index smaller than that of the light angle changing panel is formed on a side surface of the V-like groove. Thereby it is possible to materialize the emission of light with a high degree of efficiency.

If the material of the substrate is different from the material of the light angle changing panel, thermal expansion of several components would cause problems. That is, in a practical temperature range for the organic electroluminescence element, the dimensions of the light angle changing panel and the substrate would vary due to thermal expansion, and accordingly, there may be caused such a disadvantage that an affixed part of the light angle changing panel would possibly peel off, and so forth. Accordingly, in order to suppress such a disadvantage, it is important that the thermal explanation coefficient of the light angle changing panel is set to be equal to that of the substrate as possible as it can, and accordingly, the thermal expansion coefficient of the material of the light angle changing panel is preferably not less than 80% but not greater than 120% of the thermal expansion coefficient of the substrate. Further, it is preferable to form the light angle changing panel so as to be split into pieces for every more than one of pixels without the light angle changing panel being integrally formed.

With the light angle changing panel having the above-mentioned configuration, it can be simply joined to the substrate, thereby it is possible to materialize the organic electroluminescence element which can exhibit a light emission performance with a high degree of efficiency.

Next, explanation will be made of the light angle changing panel. The light angle changing panel may be formed of a material suitably selected from a group consisting of transparent or translucent materials among the materials of the substrate. It is preferable that the panel is made of a material with which light radiated from the luminous layer can be extracted with a high degree of efficiency, and accordingly, the material with which a structure such as a V-like structure can be simply formed on the front surface of the panel is preferably used. Further, as to a method of forming V-like grooves, there may be used a method of forming V-like grooves directly in the material of the substrate with the use of a fabricating tool such a bite or a grinding wheel, a molding method in which V-like grooves are formed in a die with the use of the above-mentioned tool, then are transferred onto a secondary die through cold or hot working, and finally, the light angle changing panel is formed with the use of the secondary die.

A member for affixing the light angle changing panel, is preferably the one which is transparent or translucent, and which is capable of optical coupling between the light extracting layer and the panel before the panel is affixed and which can be prevent total reflection at an interface with respect to the light extraction layer. The material of the affixing member, may be selected from a group consisting of curable optical coupling materials including a transparent resist material and a transparent optical adhesive, and non-curable optical coupling materials such as an optical coupling liquid, e.g. ethylene glycol. In order to effectively utilize the effect of the light angle changing panel, the material which has a refractive index higher than that of the panel or the luminous layer is preferably selected.

In the case of affixing the light angle changing panel, since it is difficult to carry out light angle changing which, efficiently for all light, light which cannot be extracted by light angle changing at one time, is totally reflected at the interface to the air, and is again propagated inward so as to come to the cathode. Alternatively, since light is isotropically radiated in the luminous layer, a half of the light radiated in the luminous layer comes to the cathode before it arrives at the light extracting surface. In such a case, if the cathode is made of a material which reflects light, the light arrives at the cathode is reflected, and is again propagated in the light extracting direction so as to be possibly used as effective light. In order to exhibit the above-mentioned effect, the cathode is preferably made of a material which can reflect light, and further, the light reflection factor is preferably not less than 50%. This is because the rate of enhancing the efficiency by the light angle changing is about twice. Thus, if the light reflection factor is not less than 50%, that is, if a loss of light at the cathode is not greater than 50%, the effective light extraction is possible. With a conventional organic electroluminescence element, it has been required that the reflectivity of the cathode is extremely high. However, by enhancing the efficiency of light extraction, it is possible to enlarge the flexibility of selecting the material, the film thickness, the forming method and the like of the cathode. Further, it goes without saying that those as mentioned above can also be applied to the anode if the cathode is used as a transparent electrode.

Alternatively, in order to suppress lowering of contrast caused by external light such as sunlight or light from a fluorescent lamp which is incident upon the light extracting surface of the organic electroluminescence element, it is effective that either the cathode or the anode is light-absoprtive. Explanation will be hereinbelow made of an organic electroluminescence element in an embodiment 3-1 of the present invention with reference to FIG. 14.

The organic electroluminescence element in this embodiment incorporates a light angle changing panel 11 formed therein with V-like grooves 7 as means for enhancing the efficiency of light extraction on a front surface of a substrate on the element side. Further, it is preferable that the light angle changing panel 11 can change the angle of light emitted from luminous layer 4 into a value which is smaller than a critical angle which causes total reflection at an interface between a light extraction surface and the air. The material and the forming method of the light angle changing panel may be suitably selected from the above-mentioned materials and the forming methods or conventional materials or methods so as to prevent hindrance to the extraction of light from the luminous layer 4.

Further, in this embodiment, explanation has been made of the case of such a configuration that the anode 2 is formed on the upper surface of the substrate 1, the present invention should not be limited to this configuration, but it is possible to form the cathode 5 on the upper surface of the substrate 1.

Further, as to the sealing configuration, a glass cap can be affixed to the substrate with the use of UV curable resin or the like while the light extracting surface and the glass cap are prevented from making contact with each other. Alternatively, there may be used a suitable measure such that a protecting film is formed on the front surface of the organic electroluminescence element so as to effect sealing and so forth. In addition, the protecting layer and a shield member or the like may be used in combination with no problems. Further, the light angle changing panel may be affixed on the upper surface of a protecting layer formed on the organic electroluminescence element.

As mentioned above, according to this embodiment, light which has been wasted in the conventional configuration can be extracted, and accordingly, the efficiency of light extraction can be enhanced, thereby it is possible to maintain the light emission characteristic with a high degree of efficiency.

Further, it goes without saying that the organic electroluminescence element in this embodiment can be used as an illumination device or a display unit.

Embodiment 3-2

Figure 17:
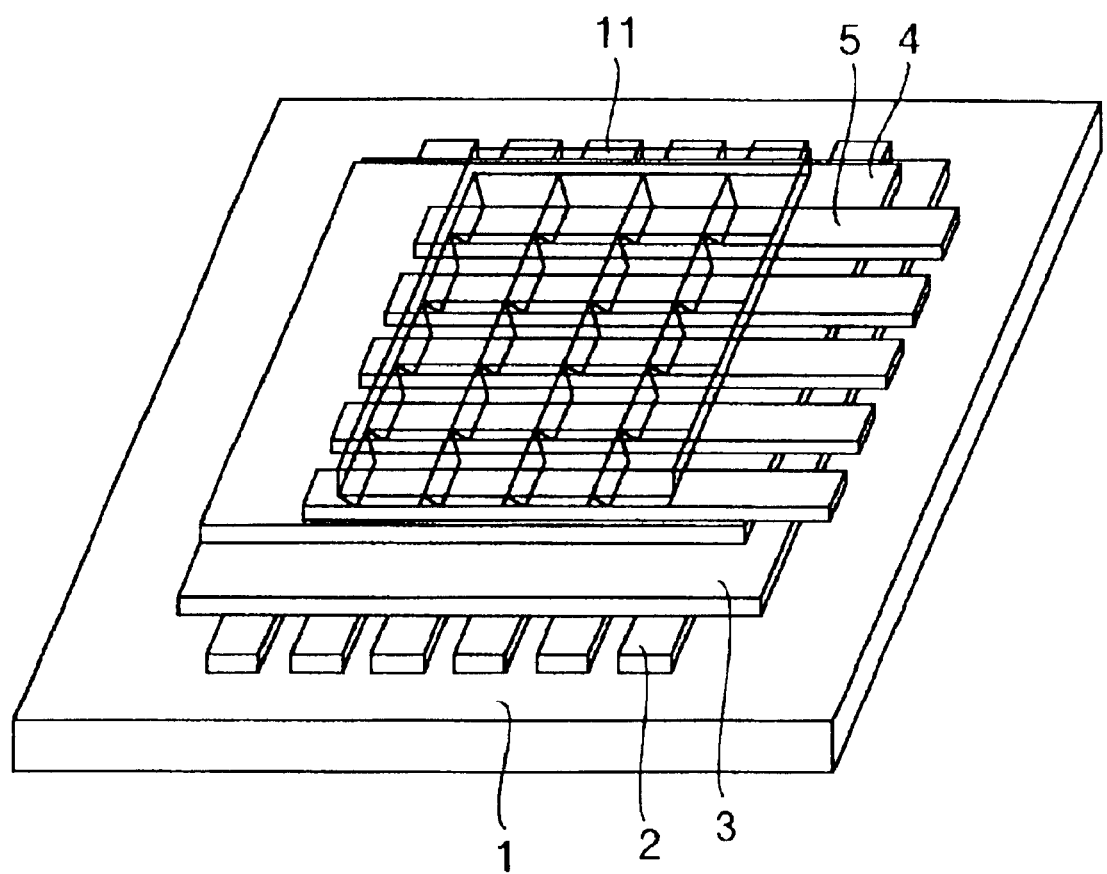
FIG. 17 is a schematic perspective view illustrating a display unit using an organic electroluminescence element in an embodiment of the present invention.

Next, explanation will be made of a display unit using the organic electroluminescence element according to the present invention with reference to FIG. 17 which is a schematic perspective view illustrating the display unit using the organic electroluminescence element in the embodiment of the present invention.

In this embodiment, the anode 2 is rectilinearly patterned, and the cathode 5 is also rectilinearly patterned similarly, being orthogonal to the former.

Further, the display unit is connected to a drive circuit (driver) as a drive means which is not shown, the anode 2 being set on the positive side while the cathode 5 being set on the negative side. When a d.c. voltage or a d.c. current is applied between a selected line electrode of the anode 2 and a selected line electrode of the cathode 5, the luminous layer 4 emits light at a position, that is, a pixel where they are orthogonal to each other. Thus, it is possible to use as a simple matrix type display unit.

In this embodiment, a panel on which V-like grooves are formed is incorporated as a light angle changing panel 11 on a surface of the substrate 1 on which the element is formed. Further, it is preferable that the light angle changing panel can change the angle of light emitted from the luminous layer into a value which is smaller than a critical angle which causes total reflection at the interface between the substrate and the air.

As stated above, even in the display unit in this embodiment, the light which has been wasted in a conventional configuration can be extracted, and accordingly, the efficiency of light extraction is enhanced, thereby it is possible to maintain the light emission performance with a high degree of efficiency. Further, in the display unit in this embodiment, since the orientation of light is strong in the normal direction, the propagation of light in the light transmissible substrate can be suppressed at the light extracting surface, thereby it is possible to maintain the light extraction performance with a high degree of efficiency and to materialize a display unit with no light bleeding and with a high degree of visibility.

Further, explanation has been made of the display unit of a simple matrix type in this embodiment, it may be of an active matrix type. Of the element forming surface of the substrate, a non-light emitting part such as TFT used for excitation is provided with a V-like structure, the area of the light emitting part can be effectively utilized, thereby it is possible to maintain the light emission performance with a high degree of efficiency, similar to the case of the simple matrix type.

It is noted that the organic electroluminescence element according to the present invention may be used not only as a display unit for displaying an image, but also as an illumination device such as a light source for a laser printer, a scanner or the like. Further, without rectilinearly patterning the anode 2 and the cathode 3, light emission is made over the entire surface thereof, and accordingly, it may be merely used as an illumination device.

Reference Example 3-1

An Al film having a film thickness of 160 nm was formed on a substrate made of glass, and thereafter, a resist material (OFPR-800 manufactured by Tokyo Ouka Co.) was coated on the Al film with the use of a spin coat process so as to form a resist film having a thickness of 10 $\mu$m. Then, it was subjected to masking, exposure and development so as to pattern the resist film into a predetermined configuration. Next, this substrate was soaked in 50% of hydrochloric acid at a temperature of 50 deg. C. so as to etch the Al film in a part where no resist film was formed, and thereafter, the resist film was also removed so as to obtained a patterned substrate having the Al film with a predetermined pattern.

Next, the patterned substrate was cleaned by ultrasonic washing with pure water at 70 deg.C., for 5 minutes, and was dried by heating after moisture sticking to the substrate was removed by nitrogen blown from a blower.

Then, AlQ$_3$ was formed on the anode by a film thickness of about 60 nm so as to obtain a luminous layer in a resistance heating evaporation device which was evacuated up to a degree of vacuum of not greater than 2×10$^{-6}$ Torr, and TPD was formed on the luminous layer by a film thickness of about 50 nm so as to obtain a hole transport layer. It is noted that evaporation speeds of TPD and Alq$_3$ were both 0.2 nm/s.

Next, the substrate was masked with a metal mask so as to form an ITO film having a film thickness of 160 nm on the hole transport layer in order to obtain a transparent electrode in a low damage sputter device which was evacuated up to a degree of vacuum of not greater than 2×10$^{-6}$ Torr.

Similarly in the low damage sputter device, a silicon oxide film having a film thickness of 3 $\mu$m was formed on the ITO film.

Next, a transparent resin plate made of polycarbonate was cut by a steel bite in which V-like grooves were formed at pitches corresponding to pixels defined by the anode and the cathode which were patterned, in one direction so as to obtain a light angle changing panel formed therein with V-like grooves which are parallel in one direction within the in-plane direction.

Next, an optical adhesive was uniformly applied on the front surface of the protecting film, and is then fixed thereto the light angle changing panel.

Reference Example 3-2

A transparent substrate made of glass was cleaned by being successively subjected to ultrasonic washing with a detergent (Semicoclean manufactured by Furuuchi Chemical Co.) for 5 minutes, ultrasonic washing with pure water for 10 minutes, ultrasonic washing with a solution in which a part of hydrogen peroxide and five parts of water were mixed with respect to one part of ammonia water by volume for 5 minutes, and ultrasonic washing with pure water at 70 deg.C for 5 minutes, and was then dried by heating after moisture sticking to the substrate was removed by nitrogen blown from a blower.

Next, the substrate was located in a resistance heating evaporation device which was evacuated up to a degree of vacuum of not greater than 2×10$^{-6}$ Torr, and a cathode patterned by a metal mask was formed by a film thickness of 150 nm from Al-Li alloy containing 15 at % of Li, as an evaporation source.

Then, similarly in the resistance heating evaporation device, AlQ$_3$ was formed on the cathode by a film thickness of about 60 nm so as to obtain a luminous layer, and TPD was formed on the luminous layer by a film thickness of about 50 nm so as to obtain a hole transport layer. It is noted that evaporation speeds of TPD and Alq$_3$ were both 0.2 nm/s.

Next, the substrate was masked by a metal film so as to form an ITO film having a film thickness of 160 nm on the hole transport layer in a low damage sputter evaporation device which was evacuated up to a degree of vacuum of 2×10$^{-6}$ Torr.

Next, similarly in the low damage sputter device, a silicon nitride film having a film thickness of 3 $\mu$m was formed as a protecting film on the irregular structure having an irregular configuration.

Then, a transparent resin plate made of PMMA (acryl) was cut by a steel byte formed therein symmetric V-like grooves which were formed at pitches corresponding to pixels defined by the patterned anode and cathode, and the transparent resin plate formed therein with the V-like grooves was turned by an angle of 90 deg., and was similarly cut by using the same steel byte, so as to obtain an light angle changing panel in which V-like grooves were formed in parallel with one another in two directions orthogonal to each other in a plane.

Next, an optical binder made of ethylene glycol was uniformly applied on the outer surface of the above-mentioned protecting film, and with the use of surface tension thereof, the light angle changing panel was affixed thereto. Thereafter, the light angle changing panel was fixed at its four corners with the use of an adhesive.

Reference Example 3-3

A transparent substrate made of silicon was cleaned by being successively subjected to ultrasonic washing with a detergent (Semicoclean manufactured by Furuuchi Chemical Co.) for 5 minutes, ultrasonic washing with pure water for 10 minutes, ultrasonic washing with a solution in which a part of hydrogen peroxide and five parts of water were mixed with respect to one part of ammonia water by volume for 5 minutes, and ultrasonic washing with pure water at 70 deg.C. for 5 minutes, and was then dried by heating after moisture sticking to the substrate was removed by nitrogen blown from a blower.

Next, the substrate was located in a resistance heating evaporation device which was evacuated up to a degree of vacuum of not greater than $2 \times 10^{-6}$ Torr, and a cathode patterned by a metal mask was formed by a film thickness of 150 nm from Al-Li alloy containing 15 at % of Li, as an evaporation source.

Then, similarly in the resistance heating evaporation device, $AlQ_3$ was formed on the cathode by a film thickness of about 60 nm so as to obtain a luminous layer, and TPD was formed on the luminous layer by a film thickness of about 50 nm so as to obtain a hole transport layer. It is noted that evaporation speeds of TPD and $Alq_3$ were both 0.2 nm/s.

Next, the substrate was masked by a metal film so as to form an ITO film having a film thickness of 160 nm on the hole transport layer in a low damage sputter evaporation device which was evacuated up to a degree of vacuum of $2 \times 10^{-6}$ Torr.

Next, similarly in the low damage sputter device, a silicon oxide film having a film thickness of 3 $\mu$m was formed as a protecting film on the irregular structure having an irregular configuration.

Then, there was formed a steel byte formed thereon with symmetric V-like beads which were formed at pitches corresponding to pixels defined by the patterned anode and cathode, and which were parallel with one another in two directions orthogonal to each other in a plane, and with this steel byte, an light angle changing panel made of polycarbonate was formed under hot working.

A light scattering film was applied to a surface of the light angle changing panel on the side remote from the surface in which the V-like grooves were formed, so as to obtain a light angle changing panel having a light extracting surface which was a light scattering surface.

An optical adhesive was uniformly coated on the outer surface of the protecting film, and then the light angle changing panel was affixed thereto.

Embodiment 3-4

After an Al film having a film thickness of 160 nm was formed on a transparent substrate made of glass, and a resist material (OFPR-800 manufactured by Tokyo Ouka Co.) was coated by a spin coat process on the Al film so as to form a resist film having a thickness of 10 $\mu$m, and was then subjected to masking, exposure and development so as to pattern the resist film into a predetermined configuration. Next, the substrate was soaked in 50% of hydrochloric acid at a temperature 50 deg.C. so as to etch the Al film in a part where no resist film was formed, and thereafter, the resist film was also removed so as to obtain a patterned substrate formed thereon with an anode formed of the Al film with a predetermined pattern.

Next, this patterned substrate is cleaned by ultrasonic washing with pure water at a temperature of 70 deg. C. for 5 minutes, then, moisture sticking to the substrate was removed by nitrogen blown from a blower, and thereafter, the substrate was dried by heating.

Then, the substrate was located in a resistance heating evaporation device which was evacuated up to a degree of vacuum of not greater than $2 \times 10^{-6}$ Torr, $AlQ_3$ was formed on the cathode by a film thickness of about 60 nm so as to obtain a luminous layer, and TPD was formed on the luminous layer by a film thickness of about 50 nm so as to obtain a hole transport layer. It is noted that evaporation speeds of TPD and $Alq_3$ were both 0.2 nm/s.

Next, the substrate was masked by a metal film so as to form an ITO film having a film thickness of 160 nm on the hole transport layer in a low damage sputter evaporation device which was evacuated up to a degree of vacuum of $2 \times 10^{-6}$ Torr so as to obtain a transparent anode.

Next, similarly in the low damage sputter device, a silicon oxide film having a film thickness of 3 $\mu$m was formed on the ITO film so as to obtain a protecting film.

Then, there was formed a steel byte formed thereon with symmetric V-like beads which were formed at pitches corresponding to pixels defined by the patterned anode and cathode, and which were parallel with one another in two directions orthogonal to each other in a plane, and with this steel byte, an light angle changing panel made of polycarbonate was formed under hot working.

An optical adhesive was uniformly coated on the outer surface of the protecting film, and then the light angle changing panel was affixed thereto.

Reference Example 3-5

After an Al film having a film thickness of 160 nm was formed on a transparent substrate made of glass, and a resist material (OFPR-800 manufactured by Tokyo Ouka Co.) was coated by a spin coat process on the Al film so as to form a resist film having a thickness of 10 $\mu$m, and was then subjected to masking, exposure and development so as to pattern the resist film into a predetermined configuration. Next, the substrate was soaked in 50% of hydrochloric acid at a temperature 50 deg.C. so as to etch the Al film in a part where no resist film was formed, and thereafter, the resist film was also removed so as to obtain a patterned substrate formed thereon with an anode formed of the Al film with a predetermined pattern.

Next, this patterned substrate is cleaned by ultrasonic washing with pure water at a temperature of 70 deg. C. for 5 minutes, then, moisture sticking to the substrate was removed by nitrogen blown from a blower, and thereafter, the substrate was dried by heating.

Then, the substrate was located in a resistance heating evaporation device which was evacuated up to a degree of vacuum of not greater than $2 \times 10^{-6}$ Torr, $AlQ_3$ was formed on the cathode by a film thickness of about 60 nm so as to obtain a luminous layer, and TPD was formed on the luminous layer by a film thickness of about 50 nm so as to obtain a hole transport layer. It is noted that evaporation speeds of TPD and $Alq_3$ were both 0.2 nm/s.

Next, the substrate was masked by a metal film so as to form an ITO film having a film thickness of 160 nm on the hole transport layer in a low damage sputter evaporation device which was evacuated up to a degree of vacuum of $2 \times 10^{-6}$ Torr so as to obtain a transparent anode.

Next, similarly in the low damage sputter device, a silicon oxide film having a film thickness of 3 $\mu$m was formed as a protecting film on the ITO film so as to obtain a protecting film.

Then, a transparent resin plate made of PMMA (acryl) was cut by a steel byte formed therein symmetric V-like grooves which were formed at pitches corresponding to pixels defined by the patterned anode and cathode, and the transparent resin plate formed therein with the V-like grooves was turned by an angle of 90 deg., and was similarly cut by using the same steel byte, so as to obtain an light angle changing panel in which V-like grooves were formed in parallel with one another in two directions orthogonal to each other in a plane.

Next, the light angle changing panel was located in a resistance heating evaporation device which was evacuated up to a degree of vacuum of not greater than $2\times10^{-6}$ Torr, Al was formed by about a film thickness of 100 nm on the surface in which the V-like grooves were formed, so as to obtain a light reflecting layer, and further, the surface on the V-like groove side, on which the Al light reflecting surface was formed was cut by 1 μm with the use of a grinding machine so as to obtain a light angle changing panel having the light reflecting surface at one side surface.

Next, an optical binder made of ethylene glycol was uniformly applied on the outer surface of the above-mentioned protecting film, and with the use of surface tension thereof, the light angle changing panel was affixed thereto. Thereafter, the light angle changing panel was fixed at its four corners with the use of an adhesive.

Comparison Example 3-1

An Al film having a film thickness of 160 nm was formed on a substrate made of glass, similar to the embodiment 3-1, and thereafter, a resist material (OFPR-800 manufactured by Tokyo Ouka Co.) was coated on the Al film with the use of a spin coat process so as to form a resist film having a thickness of 10 μm. Then, it was subjected to masking, exposure and development so as to pattern the resist film into a predetermined configuration. Next, this substrate was soaked in 50% of hydrochloric acid at a temperature of 50 deg.C. so as to etch the Al film in a part where no resist film was formed, and thereafter, the resist film was also removed so as to obtained a patterned substrate formed thereon with an anode having the Al film with a predetermined pattern.

Next, the patterned substrate was cleaned by ultrasonic washing with pure water at 70 deg.C., for 5 minutes, and was dried by heating after moisture sticking to the substrate was removed by nitrogen blown from a blower.

Then, Alq$_3$ was formed on the anode by a film thickness of about 60 nm so as to obtain a luminous layer in a resistance heating evaporation device which was evacuated up to a degree of vacuum of not greater than $2\times10^{-6}$ Torr, and TPD was formed on the luminous layer by a film thickness of about 50 nm so as to obtain a hole transport layer. It is noted that evaporation speeds of TPD and Alq$_3$ were both 0.2 nm/s.

Next, the substrate was masked with a metal mask so as to form an ITO film having a film thickness of 160 nm on the hole transport layer in order to obtain a transparent electrode in a low damage sputter device which was evacuated up to a degree of vacuum of not greater than $2\times10^{-6}$ Torr.

Similarly in the low damage sputter device, a silicon oxide film having a film thickness of 3 μm was formed on the ITO film.

TABLE 3

|  | Emission Efficiency | Normal Brightness | Visibility At Emitting Surface |
|---|---|---|---|
| Ref. Ex. 3-1 | ○ | ○ | ○ |
| Ref. Ex. 3-2 | ⊙ | ⊙ | ⊙ |
| Ref. Ex. 3-3 | ⊙ | ○ | ○ |
| Ref. Ex. 3-4 | ⊙ | ○ | Δ |
| Ref. Ex. 3-5 | ⊙ | ⊙ | Δ |
| Com. Ex. 3-1 | Δ | Δ | Δ |

Explanation will be made of an evaluation method and evaluation criteria for items in Table 3.

As to the emission efficiency of the element, the sum of emission brightness in omniazimuth was evaluated when a predetermined current was applied to the organic electroluminescence element. As to the evaluation criterion, ⊙ exhibits extreme excellence, ○ excellence and Δ allowability with respect to the emission efficiency of the comparison example 3-1.

As to the normal brightness of the element, the emission brightness was evaluated in the normal direction when a predetermined current was applied to the organic electroluminescence element. As to the evaluation criterion, ⊙ exhibits extreme excellence, ○ excellence and Δ allowability with respect to the normal brightness of the comparison example 3-1.

As to the visibility at the light emitting surface, the degree of visibility was visually evaluated as to bleeding and blurring of light in the normal direction in the case of a display unit using the organic electroluminescence element consisting of 300 μm×300 μm pixels. The evaluation was made at three stages ⊙, ○, Δ, and as to the evaluation criteria, ⊙ exhibits extreme excellence, ○ excellence and Δ allowability.

As stated above, according to the present invention, by affixing the light angle changing panel to the organic electroluminescence element, there may be provided an organic electroluminescence element having a light emission brightness with a high degree of efficiency, and a display unit, a portable terminal unit and an illumination device which use thereof. Further, by adjusting the symmetry of the mesa structure or scattering at the light extracting surface, there may be provided an organic electroluminescence element with less bleeding and blurring of light or an organic electroluminescence element having a specific visual angle characteristic, and a display unit and a portable terminal unit which use thereof.

Embodiment 4-1

Detailed explanation will be hereinbelow made of an organic electroluminescence element in an embodiment of the present invention. At first, the configuration of the organic electroluminescence element in the embodiment of the present invention will be explained.

Figure 18A:
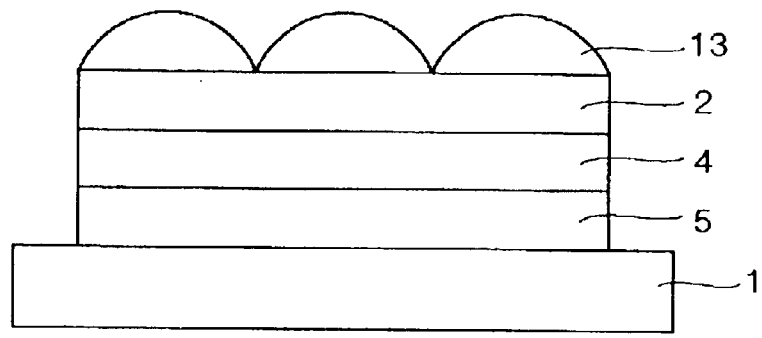
FIG. 18a is a schematic sectional view illustrating an organic electroluminescence element in an embodiment of the present invention.
Figure 18B:
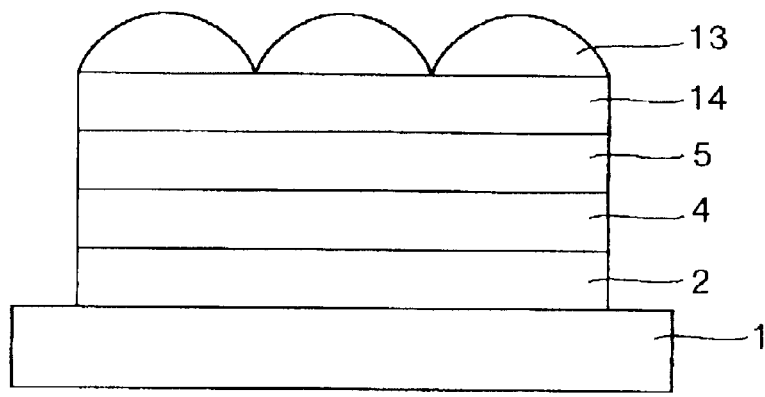
FIG. 18b is a schematic sectional view illustrating an organic electroluminescence element in an embodiment of the present invention.
Figure 18C:
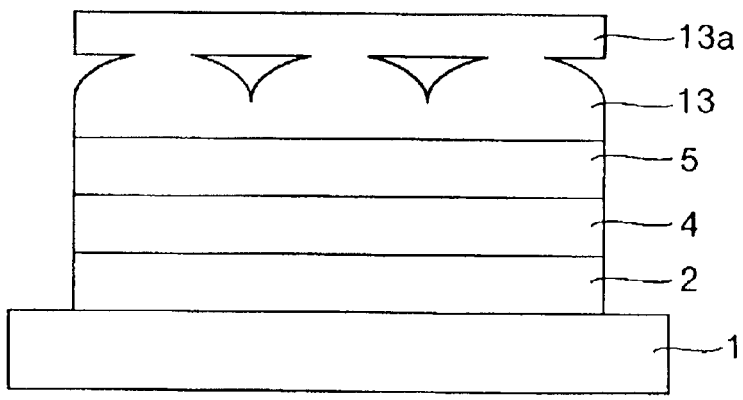
FIG. 18c is a schematic sectional view illustrating an organic electroluminescence element in an embodiment of the present invention.

Referring to FIGS. 18a, 18b and 18c which are schematic sectional views illustrating organic electroluminescence elements in this embodiment, there are shown micro lenses 13, a flattening surface 13a and an optical binder 14. It is noted that the surface of the organic electroluminescence element on the side remote from the substrate 1 is used as the light extracting surface.

Further, micro lenses 13 are formed on the light extracting surface (which corresponds to the anode 2 in this case) as shown in FIG. 18a. Although, in this embodiment, each of the micro lenses 13 is substantially semispherical, it is sufficient that the micro lenses have such a structure that the angle of light is arbitrary changed at an interface with respect to the air, or light is extracted, and accordingly, it may have any of various configurations including a semicircular shape and a semi-oval shape. It is noted that the semisphere should not be limited to a three-dimensional body which is ½ of a spherical body, but it goes without saying that the micro lenses may have a three-dimensional structure which can be obtained by cutting a spherical body or an oval body, such as ⅓ or ⅔ of a sphere.

Further, although the micro lenses 13 may have an equal size, they may have different sizes so that they can be tightly or densely arranged in random on the light extracting surface in order to contribute to improvement of the efficiency of light extraction at any point on the light extracting surface. Further, it can endue a scattering effect. If the micro lenses 13 have sized so as to be different from one another, the formation of the micro lenses 13 can be made by a simple method of spraying a polymeric material and so forth. In particular, in the case of forming the micro lenses 13 in a micron order, no sever control for dimensional accuracy is required, and accordingly, the manufacture thereof is preferably simplified.

Further, the micro lenses may be formed on the light emitting surface (which corresponds to the cathode 5 in this case) as shown in FIG. 18b, through the intermediary of the optical binder 14 which is a medium for optically coupling the micro lenses 13 with the light emitting surface.

Further, in another form of the micro lenses 13, as shown in FIG. 18c, the flattening surface 13 may be incorporated on the light emitting surface side of the micro lenses 13 so that the light emitting surface can be flattened through the air layer and a part of contact points. The flattening surface 13a are configured so that the micro lenses 13 are not directly exposed, that is, the flattening surface 13a can protect the micro lenses 13. Further, since it is flat, it can be additionally processed in a simple manner.

It is noted, as shown in FIGS. 18a, 18b and 18c, they may be used either a configuration such that the cathode 15 is formed on the substrate 1, and the anode 2 is then formed through the intermediary of the luminous layer 4, or a configuration such that the anode 2 is formed on the substrate 1, and then, the cathode 5 is formed through the intermediary of the luminous layer 4. However, the anode 2 or the cathode 5 which is formed on the light extraction side must be a transparent electrode. Further, in order to enhance the efficiency of light extraction, the electrode which is formed on the substrate 1 side, is preferably made of a material which can reflect light.

At first, explanation will be made of micro lenses. The micro lenses consists of semispherical lenses at least two of which has sizes different from each other, and it is sufficient it if the micro lenses have such a configuration that it can optionally change the light angle or can extract light at an interface with the air. Thus, it may be formed on the light extracting surface. As to the material of the micro lenses, there may be used inorganic oxide glass such as transparent or translucent soda-lime glass, glass containing barium and strontium, lead glass, aluminosilicate glass, borosilicate glass, barium borosilicate glass or quartz glass, inorganic glass such as inorganic fluoride glass, a polymer film made of transparent or translucent polyethylene terephthalate, polycarbonate, polymethylmethaclyrate, polyethersulfone, polyvinyl fluoride, polypropylene, polyethylene, polyacrylate, amorphous polyolefin, fluorine group resin or the like, chalcogenide glass such as transparent or translucent $As_2S_3$, $As_{40}S_{10}$ or $S_{40}Ge_{10}$, or a metal oxide or metal nitride material such as ZnO, $Nb_2O_5$, $Ta_2O_5$, SiO, $Si_3N_4$, $HfO_2$ or $TiO_2$. In addition, as the material, among the materials of the substrate which will be described hereinbelow, it can be selected from transparent or translucent materials. Further, there may be used a transparent resist material, a UV curable or thermo-curable optical adhesive or a transparent material which is a composite thereof.

Further, the optical binder is a medium for optically coupling the micro lenses and the light extracting surface with each other, and accordingly, its refractive index is preferably equal to or greater than that of either the micro lenses or the light extracting surface. As the material of the optical binder, there may be used a material which is flexible and adhesive among transparent or translucent substrate materials which will be described later.

Further, the flattening surface may be formed of a flattening film for flattening the surface of the micro lenses on the light extracting surface side, through the intermediary of an air layer and a part of contact points, that is, it may have such a configuration that the micro lenses can be prevented from being directly exposed. As to the material of the flattening film, among the materials which will be described, any of transparent or translucent substrate materials may be used. Since this material is directly exposed to the outside, it can be suitably selected from materials having a sufficient strength or a sufficient flexibility.

Optical simulation was carried out relating to the efficiency of light extraction in the case of changing the refractive index of the micro lenses on the basis of the layer configuration of the organic electroluminescence element shown in FIG. 8a.

Figure 19:
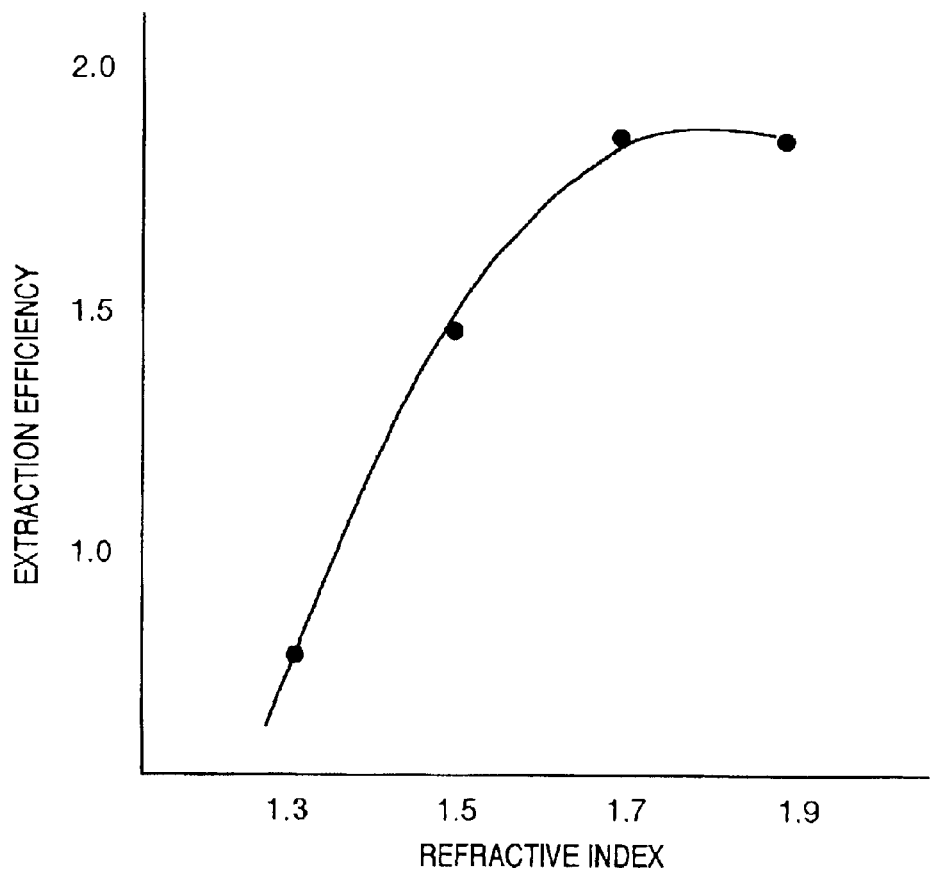
FIG. 19 is a graph showing a result of optical simulation.

Results of the optical simulation is shown in FIG. 19 which is a graph.

Specific explanation will be hereinbelow made of a condition of the optical simulation. As to the refractive indices of the layers, the luminous layer=1.7, ITO, as the anode, =2.0 and air=1.0, and as to the film thickness of the layers, the luminous layer=150 nm and ITO=150 nm. Further the diameter of the micro lenses was 50 μm. Further, the optical simulation was carried out as to two cases, that the case (a) of the presence of micro lenses (that is, air/micro lenses/ITO/luminous layer/cathode/substrate) and the case (b) of no presence of micro lenses (that is, air/ITO/luminous layer/cathode/substrate). It is noted that in this simulation, the efficiency of light extraction in the case (a) was obtained as a relative value with respect to the efficiency of light extraction in the case (b) while the refractive index of the micro lenses was changed in the case (a). That is, in FIG. 19, the refractive index is taken along the abscissa, and the ratio (a)/(b) of the efficiency of light extraction between the case (a) and the case (b) is taken along the ordinate.

Estimation was made such that light from the luminous layer is totally reflected at the interface between the luminous layer and the cathode, and only absorption in the luminous layer and the ITO were considered. That is, the reflectance factor of the cathode was 100%, the transmission factors of the luminous layer, the ITO and the micro lenses were 80%, 97% and 97%, respectively. The simulation was carried out by changing the refractive index of the micro lenses, successively to 1.3, 1.5, 1.7 and 1.9.

As clearly understood from the results of the simulation, as shown in FIG. 19, in which the ratio of the efficiency of light extraction was calculated by changing the refractive index of the micro lenses in view the above-mentioned condition, the greater the refractive index of the micro lenses, the greater the relative value of the efficiency of light extraction. Specifically, if the value of the refractive index is not less than 1.4, the relative value of the efficiency of light extraction increases, and it has an infection point around 1.7, that is, it becomes maximum therearound. Further, in a zone in which it is greater than 1.7, lowering is appreciated more or less, but even in this case, the efficiency which is about 1.8 times as high as that of the case (b) can be obtained. Thus, the efficiency of extraction of light is improved as the refractive index of the micro lenses is increased, and accordingly, the refractive index of the micro lenses is preferably not less than 1.4. Further, it goes without saying that it includes the flattening surface constituting the micro lenses. However, the same can be also said for those formed on the light extracting surface, such as the optical binder or the protecting layer which will be explained later. These component also preferably have a refractive index of 1.4.

Explanation will be hereinbelow made of an embodiment of the present invention with reference to the accompanying drawings.

Embodiment 4-1

Figure 20:
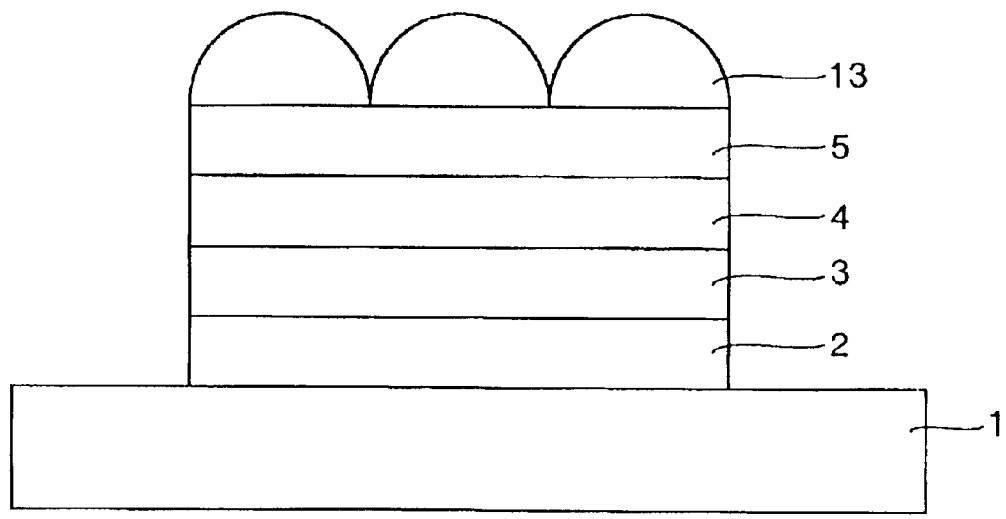
FIG. 20 is a sectional view illustrating an essential part of an organic electroluminescence in an embodiment 4-1 of the present invention.

Explanation will be hereinbelow made of an organic electroluminescence element in an embodiment of 4-1 with reference to FIG. 20 which is a sectional view illustrating an essential part of the organic electroluminescence element in the embodiment 4-1.

The organic electroluminescence element in the embodiment 4-1, a cathode 5 on the side opposed to the substrate is transparent, and the cathode 5 incorporates, on its front surface, micro lenses 13 as a means for enhancing the efficiency of light extraction. Further, the micro lenses 13 can change the angle of light emitted from luminous layer into an arbitrary angle at the interface between the light extracting surface and the air or can extract the light into the air.

As stated above, according the embodiment 4-1, the light can be extracted with a high degree of efficiency, and it is possible to maintain the light emission performance with a high degree of efficiency.

The organic electroluminescence element in the embodiment 4-1 of the present invention can used as an illumination device or the image forming apparatus.

Embodiment 4-2

Figure 21:
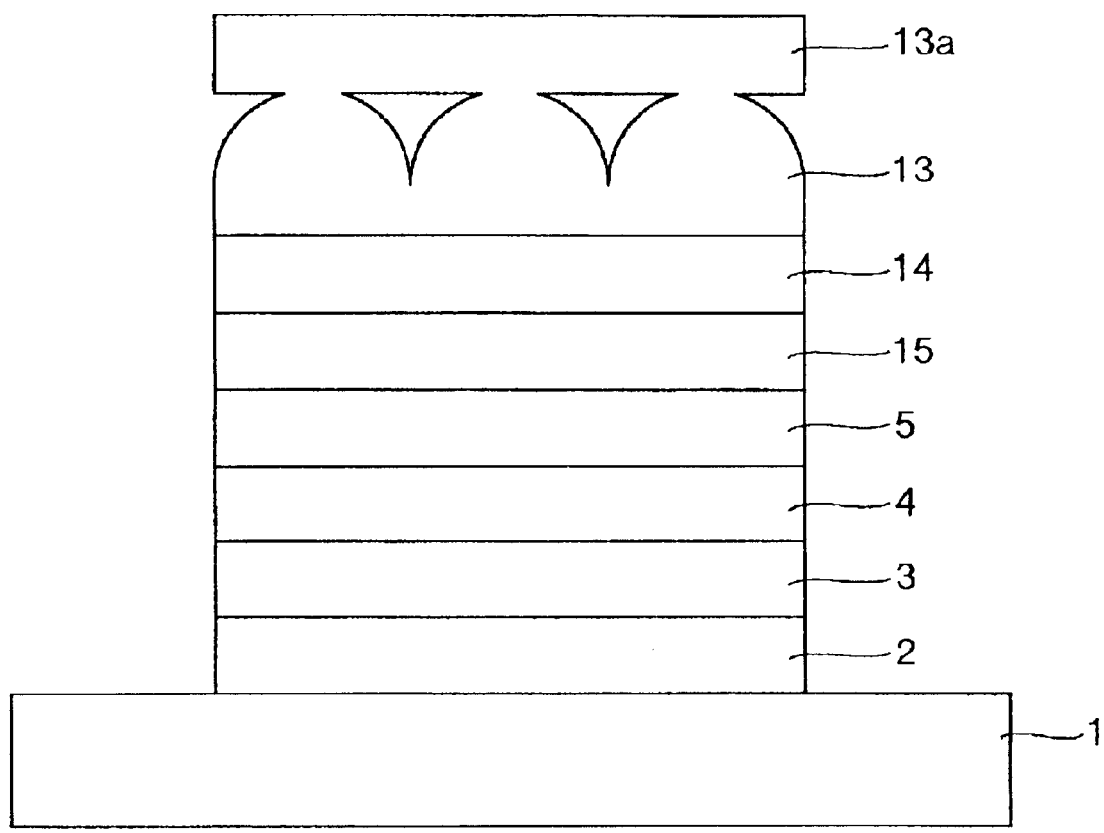
FIG. 21 is a sectional view illustrating an essential part of an organic electroluminescence in an embodiment 4-2 of the present invention.

Explanation will be made of an organic electroluminescence element in an embodiment 4-2 of the present invention with reference to FIG. 21 which is a sectional view illustrating an embodiment of the organic electroluminescence element in the embodiment 4-2 and in which there are shown a protecting film 15 formed on a cathode 5, and a optical binder 14 for affixint the protecting layer 13 and micro lenses 6 onto each other.

In the organic electroluminescence element in the embodiment 4-2, the cathode 5 on the side opposed to the substrate 1 is transparent, and is formed thereon with the protecting layer 15 for blocking moisture in the atmospheric air and reactive gas, and micro lenses 13 serving as a means for enhancing the efficiency of light extraction and incorporated thereto with a flattening surface 13a are affixed to the outer surface of the protecting film 15 through the intermediary of the optical binder 14. The micro lenses 13 is adapted to change the angle of light emitted from the luminous layer 4 into an arbitrary angle at the interface between the light extracting surface and the air, or to extract light into the air.

Further, in the embodiment, as to a seal configuration, the protecting film 14 is formed on the front surface of the organic electroluminescence element so as to seal the same, but such a configuration that the micro lenses own its shield ability and so forth may be used.

As mentioned above, with the embodiment 4-2, it is possible to efficiently extract light, and to maintain a light emission performance with a high degree of efficiency.

Embodiment 4-3

Explanation will be made of an image forming apparatus using an organic electroluminescence element in an embodiment 4-3 of the present invention with reference to FIG. 22 which is a schematic perspective illustrating an image forming apparatus using the organic electroluminescence element in the embodiment 4-3.

Figure 22A:
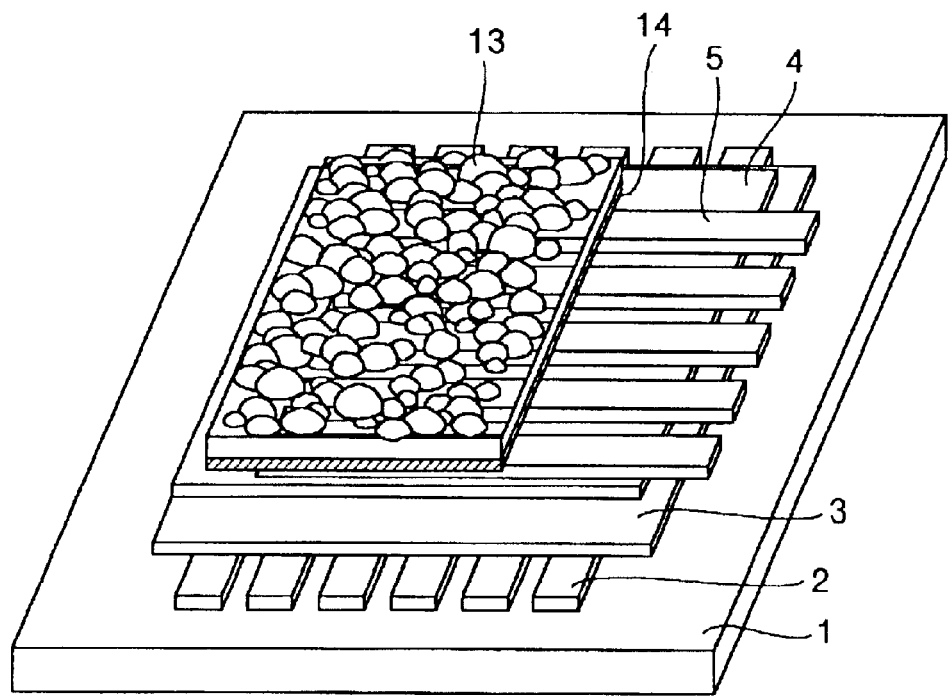
FIG. 22a is a schematic perspective view illustrating a display unit using an organic electroluminescence element in an embodiment of the present invention.

In the embodiment 4-3, as shown in FIG. 22a, an anode 2 is rectilinearly patterned, and a cathode 5 substantially orthogonal thereto is also patterned similarly.

The image forming apparatus is connected to a drive circuit (driver) with the anode 2 being set on the positive side while the cathode 5 being set on the negative side, and by applying a d.c. voltage or a d.c. current between a selected line electrode of the anode 2 and a selected line electrode of the cathode 5, the luminous layer 4 emits light in a part, that is, a pixel in which the line electrodes are orthogonal to each other, and accordingly, it may be used as a simple matrix type image forming apparatus.

In the embodiment 4-3, micro lenses 13 as a means for changing the angle of light, which is formed so as to be sheet-like, are affixed to the element forming surface of the substrate 1 by means of an optical binder 14. The micro lenses change the angle of light emitted from the luminous layer 4 into an arbitrary angle at the interface between itself and the air, or extract the light into the air through the interface between itself and the air. Further, the micro lenses 13 are sheet-like as the micro lenses are bound to a sheet serving as a housing.

As stated above, in the image forming apparatus in the embodiment 4-3, since light can be efficiently extracted, it is possible to enhance the efficiency of light extraction and to maintain a light extraction performance with a high degree of efficiency. Further, since the distance from the luminous layer 4 to the micro lenses 14 is shorter than the short sidewise length of a pixel, it is possible to suppress the light propagation in a transverse direction at the light extracting surface, and to improve the visibility with no bleeding or blurring of light or the like.

Although explanation has been made of the simple matrix type image forming apparatus in the embodiment 4-3, it can also applied to an active matrix type image forming apparatus. In this case, similar to the simple matrix type image forming apparatus, it is possible to maintain the light emission performance with a high degree of efficiency.

Figure 22B:
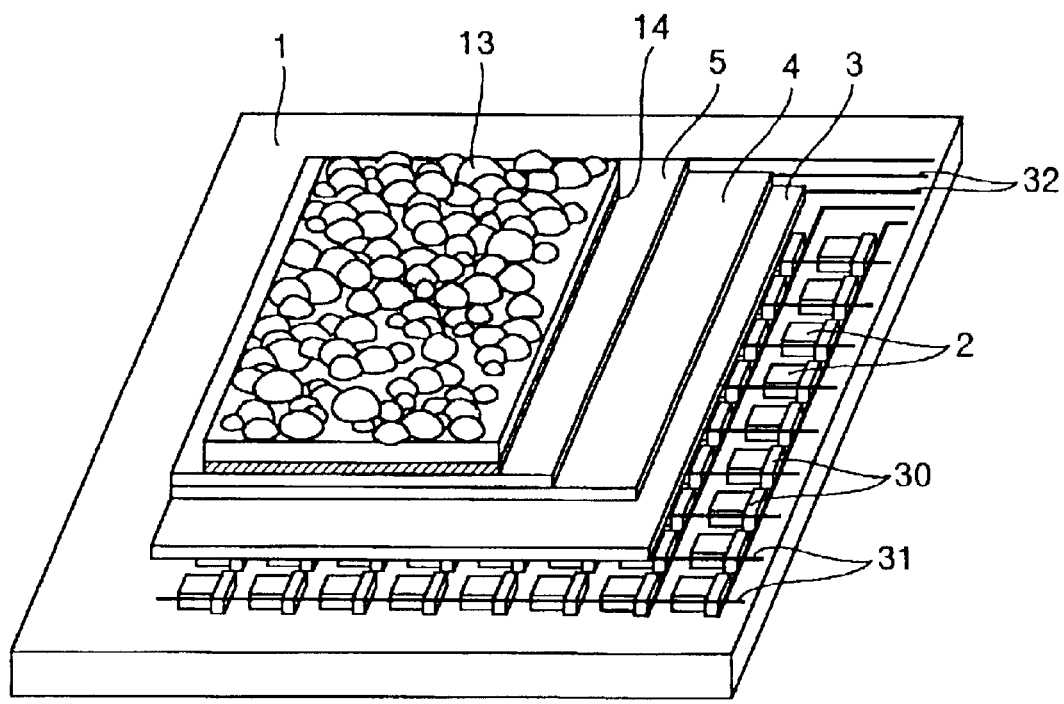

For example, referring to FIG. 22b which shows a perspective view of a variant form of the embodiment 4-3 shown in FIG. 22a, the anode 2 which is patterned so as to have line electrodes. These line electrodes are electrically isolated from each other, and are electrically connected to source lines 32 through the intermediary of switching elements (TFTs) 30 which are connected to gate lines 31 so as to be turned on and off by applying turn-on and -off signals thereto through the gate lines 31. Thus, parts in the luminous layer 4, that is, pixels where the line electrodes of the anode 2 and the line electrodes of the cathode 5 cross to each other luminesce.

Each of the switching elements 30 is formed of a thin film transistor (TFT) having a structure in which a source electrode, a gate electrode and a drain electrode are arranged. That is, a turn-on and -off signals are applied to the gate electrode so as to switch between the source electrode and the drain electrode, and accordingly, current can run between the source electrode and the drain electrode when the turn-of signal is applied, but no current can run between the source-electrode and the drain electrode when the turn-off signal is applied.

The line electrode of the anode 2 is electrically connected to the source electrode when the turn-on signal is applied to the gate line 31. Simultaneously, if a voltage is applied to the source electrode, holes and electrodes are injected into the luminous layer 4 from the anode 2 and the cathode 5, respectively, and accordingly, luminescence is caused in the luminous layer 4. Meanwhile, even when the turn-on signal is applied to the gate line 31, if no voltage is applied to the source electrode, no luminescence is caused in the luminous layer 4.

Further, when the turn-off signal is applied to the gate line 31, the anode 2 is electrically isolated from the source electrode, and accordingly, luminescence is never caused, irrespective of application of a voltage to the source electrode.

As stated above, when the turn-on signal is applied to a gate line while a voltage is applied to a source line, only a pixel associated with these line can selectively emit light. Thus, the line electrodes of the anode 2 which are electrically isolated from one another can selectively emit light, independent from one another, by controlling voltages applied to the gate lines and the source lines. Although a most simple configuration in which a switching element 30 corresponding to one pixel has been explained with reference to FIG. 3b, the switching element may incorporate a signal holding circuit composed of more than two transistors, capacitors and the like so that a pixel which has been applied thereto with the turn-on signal continues light emission until the turn-off signal is applied thereto. Further, the switching element may be composed of a plurality of transistors and a correction circuit for correcting unevenness among the transistors, current and the like.

It is noted that the image forming apparatus in the embodiment 3-4 may be used not only as an image forming apparatus for displaying an image, but also as an illumination device serving as a light source for a laser printer, a scanner or the like. Further, without the anode 2 and the cathode 5 being rectilinearly patterned, whole surface emission is effected in order to use it as a mere illumination device.

Reference Example 4-1

An opaque substrate made of a composite material of polycarbonate and polyimide was cleaned by subjecting it successively to ultrasonic washing with a detergent (Semicoclean manufactured by Furuuchi Chemical Co.) for five minutes, ultrasonic washing with pure water for 10 minutes, ultrasonic washing with a solution in which a part of hydrogen peroxide and five parts of water were mixed with respect to one part of ammonia water by volume, for five minutes and ultrasonic washing with pure water at a temperature of 70 deg. C for 5 minutes, then moisture sticking to the substrate was removed by nitrogen blown from a blower, and thereafter, it was dried by heating.

Next, this substrate was introduced in a resistance heating evaporation device which was evacuated up to a degree of vacuum of not greater than $2 \times 10^{-6}$ Torr, a cathode which was patterned by a metal mask was formed by a film thickness of 150 nm from Al-Li alloy containing 15 at % of Li, as an evaporation source.

Next, similarly in the resistance heating evaporation device, $Alq_3$ was formed on the cathode by a film thickness of about 60 nm so as to obtain a luminous layer, and TPD was formed by about 50 nm on the luminous layer so as to obtain a hole transport layer. It is noted evaporation speeds of $Alq_3$ and TPD were both 0.2 nm/s.

The substrate was masked with a metal mask in a low damage sputter device which was evacuated up to a degree of vacuum of not greater than $2 \times 10^{-6}$ Torr so as to form an ITO film having a film thickness of 160 nm on the hole transport layer.

Next, in a vacuum device which was evacuated up to a degree of vacuum of not greater than $2 \times 10^{-6}$ Torr, UV curable transparent resin was sprayed from a plurality of nozzles onto the outer surface of the ITO film so as to form thereon resin in the form of micro semispherical bodies, and after the substrate was taken out from the vacuum device, UV was irradiated thereonto so as to cure the transparent resin in order to form micro lenses on the outer surface of the ITO film.

Reference Example 4-2

An opaque substrate made of silicon was cleaned by subjecting it successively to ultrasonic washing with a detergent (Semicoclean manufactured by Furuuchi Chemical Co.) for five minutes, ultrasonic washing with pure water for 10 minutes, ultrasonic washing with a solution in which a part of hydrogen peroxide and five parts of water were mixed with respect to one part of ammonia water by volume, for five minutes and ultrasonic washing with pure water at a temperature of 70 deg.C. for 5 minutes, then moisture sticking to the substrate was removed by nitrogen blow from a blower, and it was dried by heating.

Next, this substrate was introduced in a resistance heating evaporation device which was evacuated up to a degree of vacuum of not greater than $2 \times 10^{-6}$ Torr, a cathode which was patterned by a metal mask was formed by a film thickness of 150 nm from Al-Li alloy containing 15 at % of Li, as an evaporation source.

Next, similarly in the resistance heating Evaporation device, $Alq_3$ was formed on the cathode by a film thickness of about 60 nm so as to obtain a luminous layer, and TPD was formed by a film thickness of about 50 nm on the luminous layer so as to obtain a hole transport layer. It is noted evaporation speeds of $Alq_3$ and TPD were both 0.2 nm/s.

Next, the substrate was masked with a metal mask in a low damage sputter device which was evacuated up to a degree of vacuum of not greater than $2 \times 10^{-6}$ Torr so as to form an ITO film having a film thickness of 160 nm on the hole transport layer.

Then, the substrate was introduced into a sputter device which was evacuated up to a degree of vacuum of not greater than $2 \times 10^{-6}$ Torr so as to form an $SiO_3$ film having a thickness of 3 μm on the ITO film.

Next, by tapping a semi-sphere-like block in random on the outer surface of PET, an inversion mold die having a micro lens structure was formed, and from the inversion die, a steel die was formed by a transfer with the use of electroplating. Then, under hot working, micro lenses made of sheet-like polycarbonate were formed.

Next, an optical adhesive was uniformly coated on the outer surface of the above-mentioned protecting film, and the above-mentioned light angle changing panel was affixed thereto.

Reference Example 4-3

A transparent substrate made of glass was cleaned by subjecting it successively to ultrasonic washing with a detergent (Semicoclean manufactured by Furuuchi Chemical Co.) for five minutes, ultrasonic washing with pure water for 10 minutes, ultrasonic washing with a solution in which a part of hydrogen peroxide and five parts of water were mixed with respect to one part of ammonia water by volume, for five minutes and ultrasonic washing with pure water at a temperature of 70 deg. C. for 5 minutes, then moisture sticking to the substrate was removed by nitrogen blown from a blower, and it was dried by heating.

Next, this substrate was introduced in a resistance heating evaporation device which was evacuated up to a degree of vacuum of not greater than $2 \times 10^{-6}$ Torr, a cathode which was patterned by a metal mask was formed by a film thickness of 150 nm from Al-Li alloy containing 15 at % of Li, as an evaporation source.

Next, similarly in the resistance heating evaporation device, $Alq_3$ was formed on the cathode by a film thickness of about 60 nm so as to obtain a luminous layer, and TPD was formed by a film thickness of about 50 nm on the luminous layer so as to obtain a hole transport layer. It is noted evaporation speeds of $Alq_3$ and TPD were both 0.2 nm/s.

Next, the substrate was masked with a metal mask in a low damage sputter device which was evacuated up to a degree of vacuum of not greater than $2 \times 10^{-6}$ Torr so as to form an ITO film having a film thickness of 160 nm on the hole transport layer.

Then, the substrate was introduced into a sputter device which was evacuated up to a degree of vacuum of not greater than $2 \times 10^{-6}$ Torr so as to form a silicon nitride film having a thickness of 3 µm on the ITO film.

Then, beads made of acrylic resin were densely arrayed on the substrate, and UV curable transparent resin was cast thereonto. Then UV radiation was irradiated thereonto, and a transparent film made of acrylic resin as the flattening surface was applied onto the outer surface of semispherical micro lenses by ultrasonic welding so as to form a sheet composed of micro lenses formed with a flattening surface.

Next, an optical binder can be uniformly applied on the outer surface of the above-mentioned protecting film, and the above-mentioned sheet was affixed thereto.

Reference Example 4-4

A TFT array in which pixel electrodes made of Cr were connected to signal lines through the intermediary of TFT made of amorphous silicon was formed on a transparent substrate made of glass.

Then, a negative resist material was applied on the outer surface of the TFT array substrate by a spin coat process so as to form a resist film having a thickness of 5 µm, and a non-light emitting part where no pixel electrodes were present were subjected to masking, exposure and development so as to obtain a TFT array substrate in which non-light emitting part were alone covered with the resist film.

Then, this TFT array substrate was cleaned by subjecting it successively to ultrasonic washing with a detergent (Semicoclean manufactured by Furuuchi Chemical Co.) for 5 minutes and ultrasonic washing with pure water for 10 minutes, then moisture sticking to the substrate was removed by nitrogen blown from a blower, and was dried by heating.

Next, this TFT array substrate was introduced in a resistance heating evaporation device which was evacuated up to a degree of vacuum of not greater than $2 \times 10^{-6}$ Torr, a cathode which was patterned by a metal mask was formed by a film thickness of 150 nm from Al-Li alloy containing 15 at % of Li, as an evaporation source.

Next, similarly in the resistance heating evaporation device, $Alq_3$ was formed on the cathode by a film thickness of about 60 nm so as to obtain a luminous layer, and TPD was formed by a film thickness of about 50 nm on the luminous layer so as to obtain a hole transport layer. It is noted evaporation speeds of $Alq_3$ and TPD were both 0.2 nm/s.

Next, the substrate was introduced in a low damage sputter device which was evacuated up to a degree of vacuum of not greater than $2 \times 10^{-6}$ Torr so as to form an ITO film having a film thickness of 160 nm on the hole transport layer.

Then, similar in a sputter device which was evacuated up to a degree of vacuum of not greater than $2 \times 10^{-6}$ Torr so as to form a silicon nitride film having a thickness of 3 µm on the ITO film so as to form a protecting film.

Next, an adhesive sheet formed into a sheet-like shape having a thickness of 20 µm was applied to the outer surface of the organic electroluminescence element which was protected with the protecting film.

Next, glass beads having different sizes with an averaged diameter of about 10 µm were distributed on the outer surface of the element in its entirety, and were pressed against the entire outer surface of the element. With repetitions of the process by three, the beads were uniformly distributed over the entire surface of the adhesive sheet so as to form micro lenses.

Comparison Example 4-1

Similar to the reference example 4-1, an ITO film having a film thickness of 160 nm was formed on a transparent substrate made of glass, then a resist material (OFPR-800 manufactured by Tokyo Ouka Co.) was coated on the ITO film by a spin coat process so as to form a resist film having a thickness of 10 µm, and it was subjected to masking, exposure and development in order to pattern the resist film into a predetermined configuration. Next, this substrate was soaked into 50% of hydrochloric acid at a temperature of 60 deg. C. so as to etch the ITO film in a part where no resist film was formed, and thereafter, the resist film was also removed so as to obtain a patterned substrate formed thereon an anode formed of the TIO film having a predetermined pattern.

Then, this patterned substrate was cleaned by subjecting it successively to ultrasonic washing with a detergent (Semicoclean manufactured by Furuuchi Chemical Co.) for five minutes, ultrasonic washing with pure water for 10 minutes, ultrasonic washing with a solution in which a part of hydrogen peroxide and five parts of water were mixed with respect to one part of ammonia water by volume, for five minutes and ultrasonic washing with pure water at a temperature of 70 deg. C. for 5 minutes, then moisture sticking to the substrate was removed by nitrogen blown from a blower, and thereafter, it was dried by heating.

Next, TPD was formed by a film thickness of about 50 nm on the front surface of the patterned substrate on the anode side within a resistance heating evaporation device which was evacuated up to a degree of vacuum of not greater than $2 \times 10^{-6}$ Torr so as to form a hole transport layer.

Similarly, in the resistance heating evaporation device, $Alq_3$ is formed on the hole transport layer by a film thickness of about 60 nm so as to obtain a luminous layer. It is noted that evaporation speeds of the TPD and the $Alq_3$ were both 0.2 nm/s.

Similarly, in the resistance heating evaporation device, a cathode was formed by a film thickness of 150 nm on the luminous layer from Al-Li containing 15 at % of Li, as an evaporation source.

TABLE 4

|  | Emission Efficiency | Visibility At Emitting Surface | Visibility Protection AT Emission Surface |
| --- | --- | --- | --- |
| Ref. Ex. 4-1 | ⊚ | ⊚ | Δ |
| Ref. Ex. 4-2 | ○ | ○ | Δ |
| Ref. Ex. 4-3 | ○ | ○ | ○ |
| Ref. Ex. 4-4 | ⊚ | ⊚ | Δ |
| Com/ Ex. 4-1 | Δ | Δ | ○ |

Explanation will be made of an evaluation method and evaluation criteria for items in Table 4.

As to the emission efficiency of the element, the emission brightness was evaluated when a predetermined current was applied to the organic electroluminescence element. As to the evaluation criterion, ⊚ exhibits extreme excellence, ○ excellence and Δ allowability with respect to the emission efficiency of the comparison example 4-1.

As to the visibility at the light emitting surface, the degree of visibility was visually evaluated as to bleeding and blurring of light in the normal direction in such a case that the organic electroluminescence element used as an image forming device consisting of 300 $\mu$m×300 $\mu$m pixels. The evaluation was made at three stages ⊚, ○, Δ, and as to the evaluation criteria, ⊚ exhibits extreme excellence, ○ excellence and Δ allowability.

As to the visibility protection at the emission surface, the degree of facilitating removal of dust sticking to the front surface of the organic electroluminescence element was evaluted. As to the evaluation criteria thereof, ⊚ exhibits extreme excellence, ○ excellence and Δ allowability with respect to the normal brightness of the comparison example 4-1.

As clearly understood from Table 4, the organic electroluminescent elements in the reference examples all exhibited excellent results in view of the emission brightness and the visibility at the light emitting surface in comparison with the comparison example. In particular, reference examples 4-1 and 4-4 exhibited extremely excellent results in view of the emission brightness and the visibility at the emitting surface in comparison example 4-1. However, as to the visibility protection at the emitting surface, the organic electroluminescence elements in the reference examples 4-1, 4–2, 4-4 exhibit inferior results in comparison with the organic electroluminescence element in the comparison example 4-1. However, this is because of no presence of the flattening surface in the comparison example, and this results does not cause severe problems on piratical use. It is understood that the organic electroluminescence element in this embodiment exhibits the efficiency of light emission which is remarkable in comparison with the comparison example 4-1, and excellent in the visibility.

Embodiment 5

Explanation will be hereinbelow made of a portable terminal unit using the organic electroluminescence element in the embodiments 1 to 4 of the present invention with reference to FIG. 23 which is a perspective view illustrating the organic electroluminescence element in an embodiment 5, and FIG. 24 which is a block diagram illustrating the portable terminal unit using the organic electroluminescence element according to the present invention.

Figure 23:
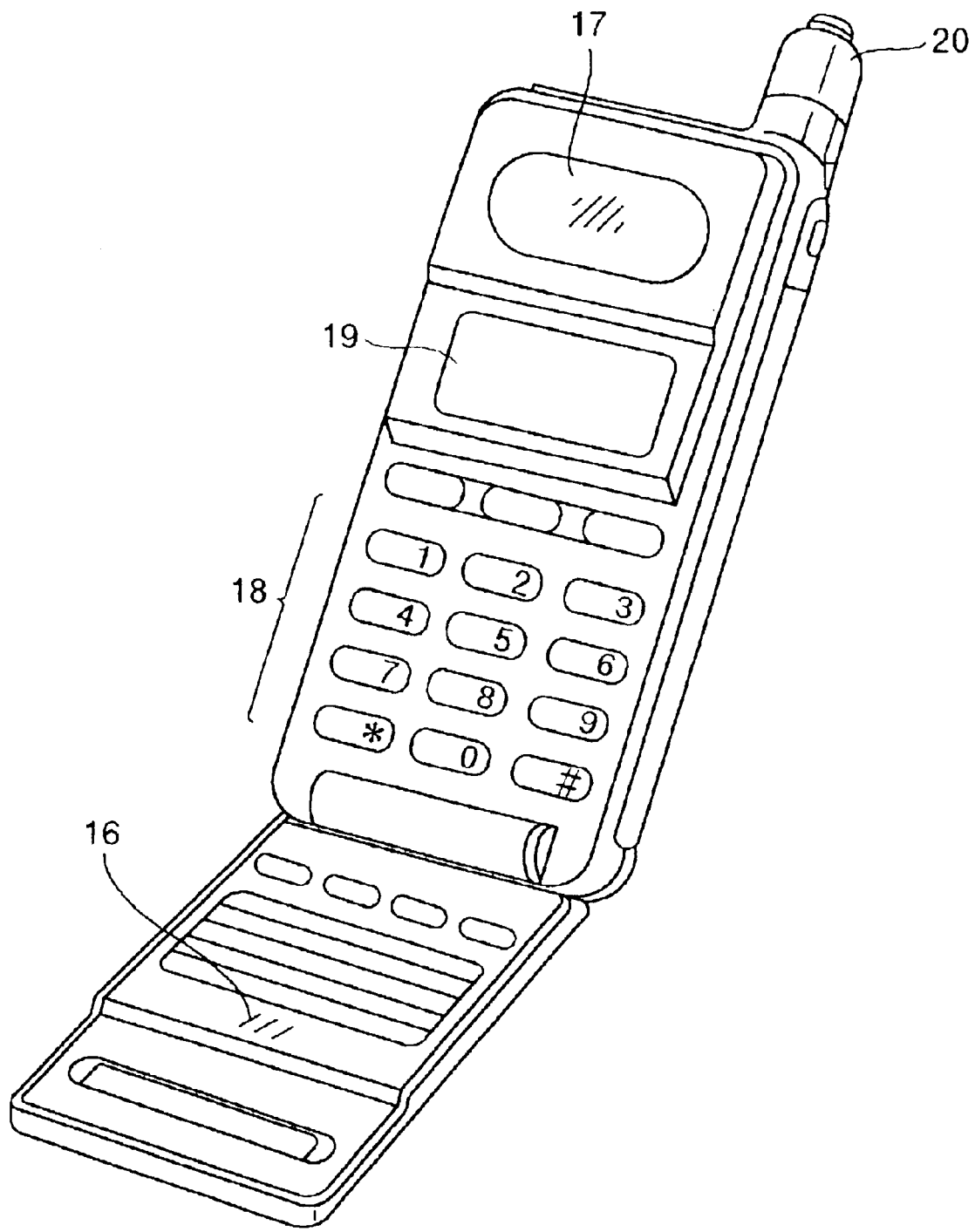
FIG. 23 is a perspective view illustrating a portable terminal unit using an organic electroluminescence element in an embodiment 5 of the present invention.
Figure 24:
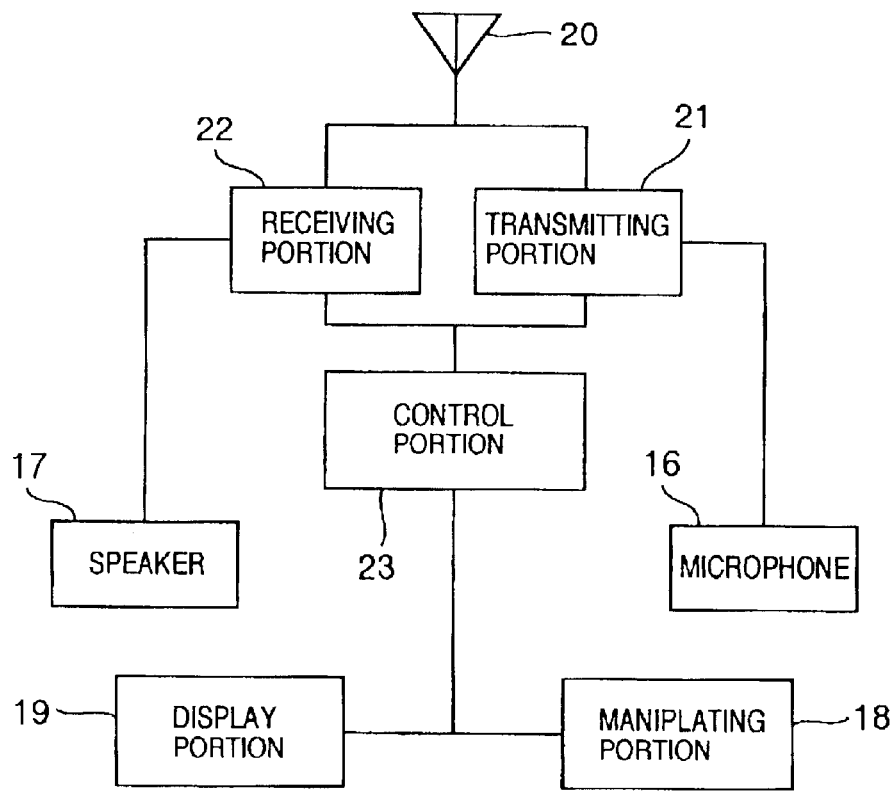
FIG. 24 is a block diagram illustrating a portable terminal unit using an organic electroluminescence element according to the present invention.
Figure 25:
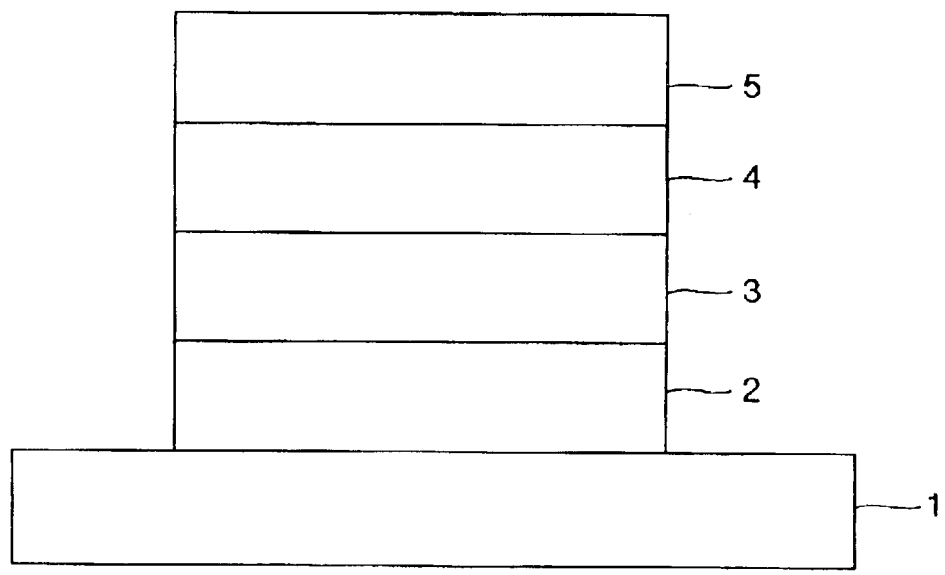
FIG. 25 is a sectional view illustrating an essential part of a conventional organic electroluminescence element.
Figure 26:
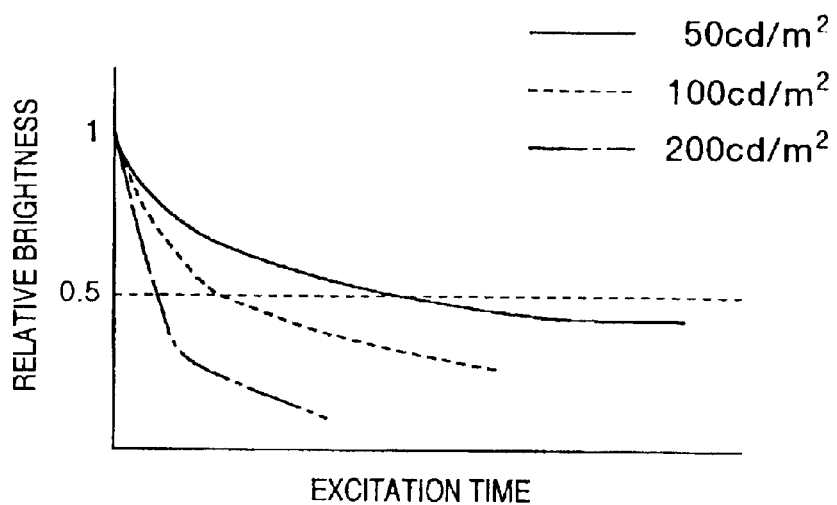
FIG. 26 is a graph showing a relationship between the energizing time and the relative brightness of an electroluminescence element.
Figure 27:
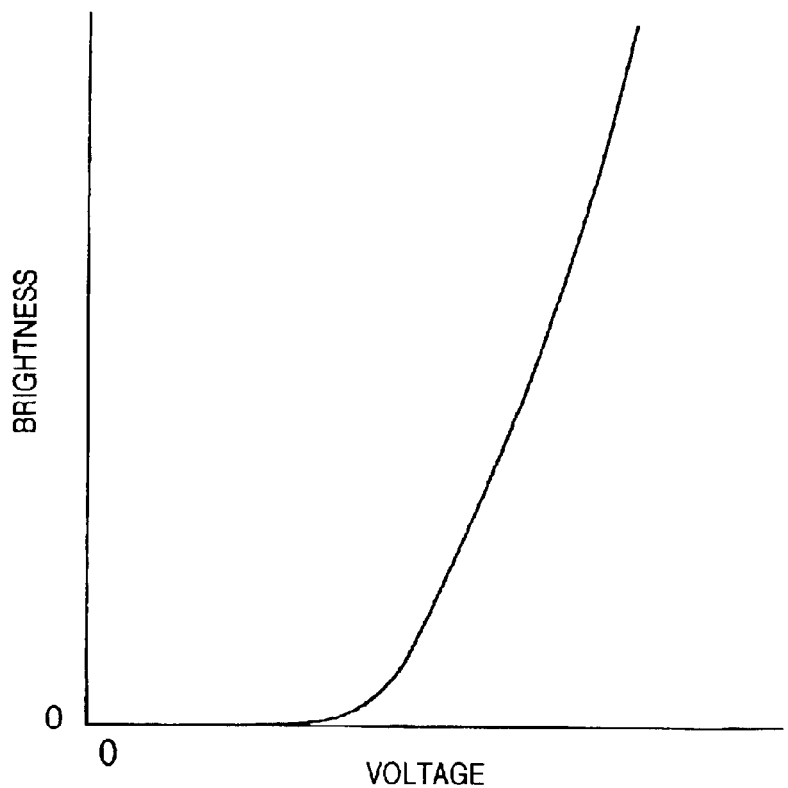
FIG. 27 is a graph showing a relationship between the energizing time and the brightness of an electroluminescence element.
Figure 28:
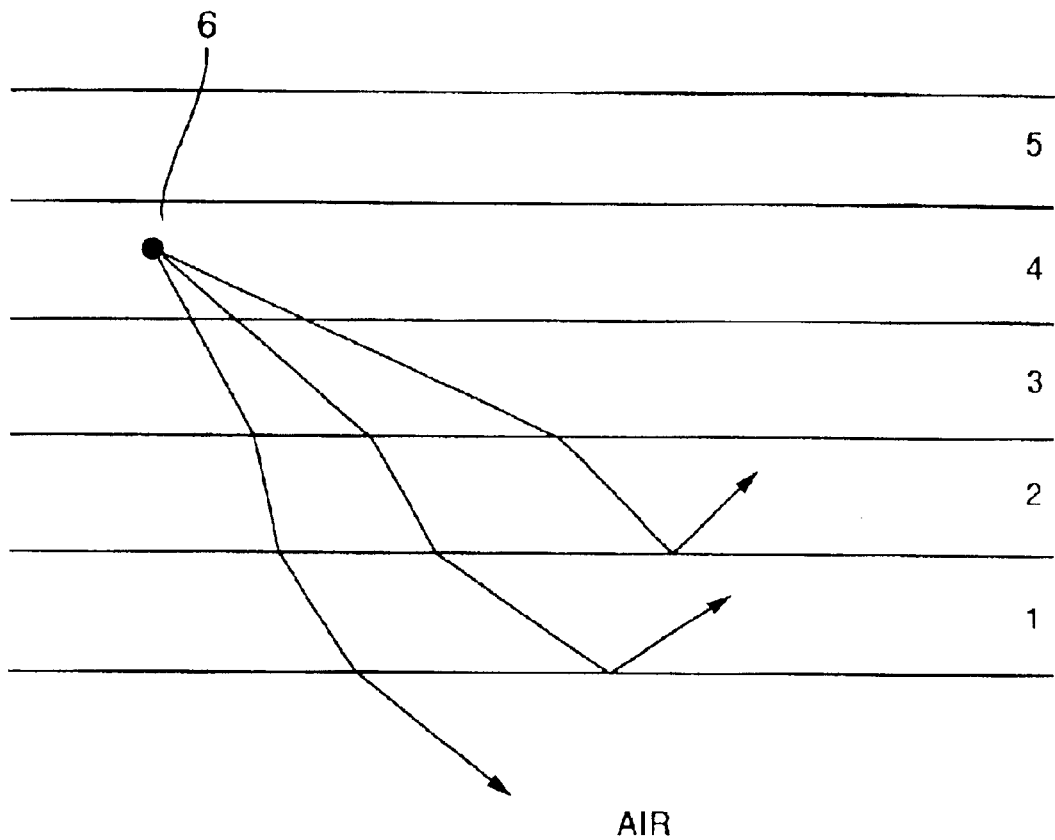
FIG. 28 is a sectional view illustrating an essential part of a conventional organic electroluminescence element in order to schematically illustrate typical light paths.

Referring to FIGS. 23 and 24, there are shown an microphone 16 for converting voice into an voice signal, a speaker 17 for converting the voice signal into voice, a manipulating portion 18 composed of dial buttons and the like, a display portion 19 for displaying received message or the like, which is composed of an image forming device using the organic electroluminescence element according to the present invention, an antenna 20, a transmitting portion 21 for converting a voice signal delivered from the microphone 15, into a transmission signal which is radiated into the outside by way of the antenna 20, a receiving part 22 for converting a received signal received by way of the antenna 20, into a voice signal which is transmitted to the speaker 17 where it is converted into voice, and a control portion 23 for controlling the transmitting portion 21, and the receiving portion 22, the operating portion 18 and the display portion 19.

Voice or the like from the user (originator) during communication is sent into the microphone, and voice from a sender or a notifying sound is issued from the speaker 17 to the user (receiver). It is noted that the microphone may be eliminated if a pager is used as the portable terminal unit.

Further, the manipulating portion 18 incorporates ten keys as dial buttons and various function keys. Further, it may incorporate character keys in addition to the ten keys and the various keys. Through the manipulating portion 18, predetermined data including a telephone number, a name, a time, setting of several functions, an E-mail address and URL are inputted. The manipulating portion 18 may be operated not only by a keyboard but also by a pen inputting unit, a voice inputting unit, a magnetic or optical inputting unit or the like.

Predetermined data inputted through the manipulating portion 18, data such as telephone number, an E-mail address, URL or the like stored in memory, character icons or the like are displayed on the display portion 19.

Further, the antenna 20 carries out at least one of transmission or receiving of radio waves. It is noted that although the antenna (a helical antenna or a flat antenna) is provided in order to carry out signal transmission and receiving by means of radio waves, in the case of optical communication or the like, a light emitting element and a light receiving element may be provided instead of the antenna. In this case, a signal is transmitted to another communication equipment by the light emitting element, and a signal is received from the outside by the light receiving element.

The transmitting portion 21 converts a voice signal into a transmission signal while the receiving portion 21 converts a received signal into a voice signal.

Further, the control portion 23 is composed of a conventionally known configuration using a CPU, memory and the like which are not shown, and controls the transmitting portion 21, the receiving portion 22, the manipulating portion 18 and the display portion 19. More specifically, control portion 23 delivers instructions to control circuits, drive circuits and the like which are not shown and which are provided in these portions, For example, a display control circuit which receives display instructions from the control portion 23 energizes a display drive circuit so as to carry out a display on the display portion 19.

Explanation will be hereinbelow made of the operation thereof.

At first, upon receiving an message, the receiving portion transmits a received signal to the control portion 23 which display a predetermined character or the like on the display portion 19, and further, when a button or the like is pressed for accepting the received message in the manipulating portion 18, a signal is transmitted to the control portion 23 which therefore sets several portions into a signal receiving mode. That is, a signal received through the antenna 20 is converted into a voice signal by the receiving portion 22, and accordingly, the voice signal is outputted in the form of voice from the speaker 17 while voice inputted through the microphone 16 is converted into a voice signal which is then transmitted to the outside from the antenna 20 by means of the transmitting portion 21.

Next, explanation will be made of the transmission of a signal.

At first, upon transmission of a signal, the manipulating portion 18 delivers a signal for transmission to the control portion 23. Then, a signal corresponding to a telephone number is transmitted to the manipulating portion 18 to the control portion 23 from which the signal corresponding to the telephone number is transmitted through the antenna 20. If the communication is established with the third party, a signal for the establishment is transmitted by way of the antenna 20 to the receiving portion 22 from which it is transmitted to the control portion 23 which therefore set the several portion into a signal transmitting mode. That is, a signal received by the antenna 30 is converted into a voice signal by the receiving portion 22 so that the voice signal is issued from the speaker 17 in the form of voice, and voice inputted from the microphone 16 is converted into a voice signal which is transmitted from the transmitting portion 21 to the outside by way of the antenna 20.

It is noted that although explanation has been made of the portable terminal unit which carries out transmission and receipt of voice in the embodiment 5, the same may be said for a portable terminal unit which can process at least one of transmission and receipt of not only voice but also data other then the voice, such as character data.

This portable terminal unit in this embodiment 5 can maintain a light emission performance with a high degree of efficiency, and accordingly, the consumption of power from a battery or the like can be restrained. Thus, the long time use of the portable terminal unit can be made, or it can be made to be lightweight due to miniaturization of the battery. These years, a portable terminal unit having a high image quality and low consumption power has been demanded. Thus, the portable terminal unit in this embodiment having a high image quality and a high degree of efficiency can offer a high merit in comparison with the light extraction of a conventional portable terminal unit. With a higher degree of efficiency, the capacity of the battery can be reduced, and further, the lightweight measure and the long time use can be made. Further, the electroluminescence using a substrate formed of a polymeric film can make the portable terminal unit remarkably lightweight.

Further, there have been demanded for a portable terminal unit for personal use so that the user himself alone can recognize data but other persons therearound cannot recognize the data. The display unit according to the present invention is extremely effective for the above-mentioned use since the orientation of light can be strong in the normal direction.

What is claimed is:

1. An organic electroluminescence element at least having, on a substrate, an anode for injecting holes, a luminous layer including a luminous zone, and a cathode for injecting electrons, characterized in that light emitted from the luminous layer is extracted to a surface opposed to the substrate, and an inverted V-like structure is formed in at least a part of an element forming surface of the substrate, the inverted V-like structure being higher than the luminous layer.

2. An organic electroluminescence element as set forth in claim 1, characterized in that a light extracting surface of said organic electroluminescence element is flattened by a transparent flattening structure made of a transparent material.

3. An organic electroluminescence element as set forth in claim 1, characterized in that said inverted V-like structure reflects light.

4. An organic electroluminescence element as set forth in claim 2, characterized in that said inverted V-like structure is made of a material having a refractive index which is lower than that of said transparent flattening structure.

5. An organic electroluminescence element as set forth in claim 2, characterized in that said transparent flattening structure is formed on a protecting film formed on a surface of said organic electroluminescence element.

6. An organic electroluminescence element as set forth in claim 1, characterized in that said inverted V-like structure is formed so as to be left-right symmetric.

7. An organic electroluminescence element as set forth in claim 1, characterized in that said inverted V-like structure is formed so as to be left-right symmetric.

8. An organic electroluminescence element as set forth in claim 1, characterized in that said inverted V-like structure has a sectional shape which is defined by two rectilinear lines in a V-like shape.

9. An organic electroluminescence element as set forth in claim 1, characterized in that said inverted V-like structure has a sectional shape which is defined by curves which are convex inward of a V-like shape.

10. An image forming apparatus characterized in that said anode and said cathode of said organic electroluminescence element as set forth in claim 1 have stripe-like electrodes which are electrically isolated from one another so as to constitute an image display array composed of a plurality of pixels, and the direction of said inverted V-like structure in the substrate surface is coincident with the direction of the pixels defined by the stripe electrodes.

11. An image forming apparatus characterized in that said anode and said cathode of said organic electroluminescence element as set forth in claim 1 each have electrodes which are each electrically separated from one another for each of pixels, the separated electrodes are scanned by way of at least more than one of switching elements so as to obtain an image display array, and the direction of said inverted V-like structure in the substrate surface is coincident with the direction of the pixels defined by the stripe electrodes.

12. An image forming apparatus as set forth in claim 10 or 11, characterized in that pitches of said inverted V-like structure in each direction are substantially equal to pitches of said luminous layer corresponding to said pixels, and said inverted V-like structure has a center which is located at a substantially middle point of a line connecting centers of said pixels.

13. An image forming apparatus as set forth in claim 10 or 11, characterized in that said transparent flattening structure has a height which is smaller than the sum of a height of said inverted V-like structure and a width of the pixels in a plane direction.

14. A portable terminal unit comprising a voice signal converting section that converts voice into a voice signal, a manipulating section that inputs data including a telephone number, a display section that displays data including a received message and a telephone number, a transmitting section that converts the voice signal into a transmission signal, a receiving section that converts a received signal into a voice signal, an antenna for transmitting and receiving the transmission signal and the received signal, a control section that controls several portions, characterized in that said display section is formed of an image forming apparatus as set forth in claim 10 or 11.

15. An organic electroluminescence element incorporating at least, on a substrate, an anode for injecting holes, a luminous layer having a light emitting zone and a cathode for injecting electrons, characterized in that a light emitting part including said luminous layer has an area which is greater than an area of an aperture through which light from said luminous layer is extracted.

16. An organic electroluminescence element incorporating at least, on a substrate, an anode for injecting holes, a luminous layer having a light emitting zone and a cathode for injecting electrons, characterized in that a light emitting part including said luminous layer is formed in a plane having an nonparallel relationship with an aperture through which light from said luminous layer is extracted.

17. An organic electroluminescence element as set forth in claim 15, characterized in that said luminous layer is formed in an upper part of an irregular structure formed at least on a surface of said substrate.

18. An organic electroluminescence element as set forth in claim 17, characterized in that said irregular structure is formed in a quadratic pyramid-like shape, a cone-like shape or a curved shape.

19. An organic electroluminescence element as set forth in claim 17, characterized in that said substrate, said irregular structure, or said anode or said cathode which are formed on said substrate are transparent.

20. An organic electroluminescence element as set forth in claim 17, characterized in that the anode or the cathode which are formed on said irregular structure on said substrate is a reflective electrode for reflecting light emitted from the luminous layer, the cathode or the anode which is opposed to the reflective electrode is a transparent electrode, and a transparent flattening structure having a planer light extracting surface is formed above the transparent electrode.

21. An organic electroluminescence element as set forth in claim 20, characterized in that said transparent flattening structure is formed on a protecting film formed on the transparent electrode.

22. An organic electroluminescence element as set forth in claim 17, characterized in that said irregular structure is formed at an oblique angle which is in a range from 60 to 170 deg. and preferably in a range from 100 to 140 deg. with respect to a direction normal to the substrate.

23. An organic electroluminescence element as set forth in claim 17, characterized in that said irregular structure has a refractive index which is in a range from 1.4 to 2.0, and preferably in a range from 1.7 to 2.0.

24. An image forming apparatus characterized in that said anode and said cathode of said organic electroluminescence element as set forth in claim 17 have stripe-like electrodes which are electrically isolated from one another so as to constitute an image display array composed of a plurality of pixels.

25. An image forming apparatus characterized in that said anode and said cathode of said organic electroluminescence element as set forth in claim 17 are electrically separated from one another for each of pixels, said anode or said cathode is scanned by way of at least more than one of switching elements so as to obtain an image display array.

26. An image forming apparatus as set forth in claim 24 or 25, characterized in that said irregular structure has a size which is smaller in a plane direction than a size of the pixel in a plane direction.

27. A portable terminal unit comprising a voice signal converting portion for converting voice into a voice signal, a manipulating portion for inputting data including a telephone number, a display portion for displaying data including a received message and a telephone number, a transmitting portion for converting the voice signal into a transmission signal, a receiving portion for converting a received signal into a voice signal, an antenna for transmitting and receiving the transmission signal and the received signal, a control portion for controlling several portions, characterized in that said display portion is formed of an image forming apparatus as set forth in claim 24 or 25.

28. An organic electroluminescence element having at least, on a substrate, an anode for injecting holes, a luminous layer having a light emitting zone, and a cathode for injecting electrons, characterized by a light angle changing panel formed on an element forming surface of said substrate.

29. An organic electroluminescence element as set forth in claim 28, characterized in that said light angle changing panel is joined to the element forming surface of said substrate through the intermediary of a protecting film formed in the element forming surface.

30. An organic electroluminescence element as set forth in claim 28, characterized in that said light angle changing panel has a light extraction surface which is a light scattering surface.

31. An organic electroluminescence element as set forth in claim 28, characterized in that said light angle changing panel incorporates a plurality of grooves which are parallel in one direction within an in-plane direction.

32. An organic electroluminescence element as set forth in claim 28, characterized in that said light angle changing panel incorporates a plurality of grooves which are parallel in two direction orthogonal to each other within an in-plane direction.

33. An organic electroluminescence element as set forth in claim 28, characterized in that said light angle changing panel is formed therein grooves each of which is a V-like grove having a V-like sectional shape defined by two rectilinear lines formed in a V-like shape.

34. An organic electroluminescence element as set forth in claim 28, characterized in that in that said light angle changing panel is formed therein grooves each of which is a V-like groove having a curved V-like sectional shape defined by curves which are convex inward of the V-like shape.

35. An organic electroluminescence element as set forth in claim 28, characterized in that said light angle changing panel is formed therein grooves which have a symmetric shape.

36. An organic electroluminescence element as set forth in claim 28, characterized in that said light angle changing panel is formed therein grooves which have an asymmetric shape.

37. An organic electroluminescence element as set forth in claim 28, characterized in that said light angle changing panel is formed therein grooves each having at least side surfaces formed with light reflecting surfaces.

38. An organic electroluminescence element as set forth in claim 28, characterized in that said light angle changing panel is formed therein grooves each having at least side surfaces formed with surfaces made of medium having a refractive index which is smaller than that of said light angle changing panel.

39. An organic electroluminescence element as set forth in claim 28, characterized in that said light angle changing panel is made of a medium having a thermal expansion coefficient which is not less than 80% but not greater than 120% of a thermal expansion of said substrate.

40. An organic electroluminescence display unit using said organic electroluminescence element as set forth in claim 28, said anode split into a plurality of stripe-like electrodes which are electrically isolated from one another and said cathode is split into a plurality stripe-like electrodes which are electrically isolated from one another so as to obtain an image display array, and a direction of grooves formed in said light angle changing panel is coincident with a direction of pixels which are defined by any of the stripe electrodes.

41. An organic electroluminescence display unit using said organic electroluminescence element as set forth in claim 28, said anode or said cathode is split into a plurality of stripe-like electrodes which are electrically isolated from one another, said isolated electrodes are scanned by more than one of switching elements so as to obtain an image display array, and a direction of grooves formed in said light angle changing panel is coincident with a direction of pixels which are defined by any of the stripe electrodes.

42. An organic electroluminescence display unit as set forth in claim 40 or 41, characterized in that the direction of V-like grooves formed in said light angle changing panel is coincident with a direction of a column or a row of said pixels.

43. An organic electroluminescence display unit as set forth in claim 40 or 41, characterized in that pitches of V-like grooves formed in said light angle changing panel are substantially equal to pitches of said light emitting portions corresponding to the pixels in each direction, and the V-like groove has a center which is located at a substantially middle point of a line connecting between centers of the pixels.

44. An organic electroluminescence display unit as set forth in claim 40 or 41, characterized in that pitches of said V-like grooves are smaller than pitches of said light emitting portions corresponding to said pixels in each direction.

45. An organic electroluminescence display unit as set forth in claim 40 or 41, characterized in that a convex surface defined by said V-like grooves has an area which is smaller than an area of said luminous layer in said pixel.

46. An organic electroluminescence display unit as set forth in claim 40 or 41, characterized in that a distance from said luminous layer to a convex surface formed by said V-like grooves is smaller than a length of one side of said pixel.

47. An organic electroluminescence display unit as set forth in claim 40 or 41, characterized in that said light angle changing panel is split into pieces for not less than one of said pixels.

48. A portable terminal unit comprising a voice signal converting section that converts voice into a voice signal, a manipulating section that inputs data including a telephone number, a display section that displays a display of data including a received message and a telephone number, a transmitting section that converts the voice signal into a transmission signal, a receiving section that converts a received signal into a voice signal, an antenna for transmitting and receiving the transmission signal and the received signal, a control section that controls several portions, characterized in that said display section is formed of an image forming apparatus as set forth in claim 40 or 41.

49. An organic electroluminescence element incorporating a luminous layer having a light emitting zone between two electrodes, a substrate is provided at one of said electrode sides, and a light angle changing panel is provided at the other of said electrode sides.

50. An organic electroluminescence element incorporating at least, on a substrate, an anode for injecting holes, a luminous layer having a light emitting zone, and a cathode for injecting electrons, characterized in that light radiated from said luminous layer is extracted through a light extracting surface opposed to said substrate, not less than at least two semisphere-like micro lenses having sizes which are different from one another are formed on said light extracting surface.

51. An organic electroluminescence element incorporating at least, on a substrate, an anode for injecting holes, a luminous layer having a light emitting zone, and a cathode for injecting electrons, characterized in that light radiated from said luminous layer is extracted through a light extracting surface opposed to said substrate, not less that at least two semisphere-like micro lenses having sizes which are different from one another are formed on said light extracting surface, and a flattening surface is formed on the light extracting surface side of the micro lenses so as to define a flat surface through the intermediary of an air layer and at least a part of contact points.

52. An organic electroluminescence element as set forth in claim 50, characterized in that said micro lenses are affixed to the light extracting surface through the intermediary of an optical binder.

53. An organic electroluminescence element as set forth in claim 50, characterized in that said micro lenses are made of a material having a refractive index which is greater than 1.4.

54. An organic electroluminescence element as set forth in claim 50, characterized in that said micro lenses is made of a transparent material which can emit not less than 50% of light radiated from said luminous layer.

55. An organic electroluminescence element as set forth in claim 50, characterized in that said micro lenses are formed by optically coupling at least two materials.

56. An organic electroluminescence element as set forth in claim 50, characterized in that said micro lenses are formed on a protecting film which is formed on a surface of said organic electroluminescence element.

57. An organic electroluminescence element as set forth in claim 56, characterized in that said protecting film has a refractive index which is greater than 1.4.

58. An organic electroluminescence element as set forth in claim 56, characterized in that said protecting film is made of a material which can emit not less than 50% of light radiated from said luminous layer.

59. An organic electroluminescence element as set forth in claim 52, characterized in that said optical binder has a refractive index which is greater than 1.4.

60. An organic electroluminescence element as set forth in claim 52, characterized in that said optical binder is made of a transparent material which can emit not less than 50% of light radiated from luminous layer.

61. An organic electroluminescence element as set forth in claim 52, characterized in that said optical binder is made of a material which is liquid or gel-like.

62. An organic electroluminescence element as set forth in claim 52, characterized in that said optical binder is made of a material which is cured by heat or light.

63. An image forming apparatus characterized in that said anode and said cathode of said organic electroluminescence element as set forth in claim 50 have stripe-like electrodes which are electrically isolated from one another so as to provide an image display array composed of a plurality of pixels.

64. An image forming apparatus characterized in that said anode or said cathode of said organic electroluminescence element as set forth in claim 50 is split into electrodes which are electrically isolated from one another for each electrode, and said isolated electrodes are scanned through the intermediary of at least more than one of switching elements so as to provide an image display array.

65. An image forming apparatus as set forth in claim 63 or 64, characterized by an organic electroluminescence element incorporating at least, on a substrate, an anode for injecting holes, a luminous layer having a light emitting zone and a cathode injecting electrons, said micro lenses having diameters which are smaller than a length of a long side of said pixel.

66. An image forming apparatus as set forth in claim 63 or 64, characterized by an organic electroluminescence element incorporating at least, on a substrate, an anode for injecting holes, a luminous layer having a light emitting zone and a cathode injecting electrons, said micro lenses having diameters which are smaller than a length of a short side of said pixel.

67. An image forming apparatus as set forth in claim 63 or 64, characterized by an organic electroluminescence element incorporating at least, on a substrate, an anode for injecting holes, a luminous layer having a light emitting zone and a cathode injecting electrons, a distance from said luminous layer to the outermost surface of said micro lenses is shorter than a length of a long side of said pixel.

68. An image forming apparatus as set forth in claim 63 or 64, characterized by an organic electroluminescence element incorporating at least, on a substrate, an anode for injecting holes, a luminous layer having a light emitting zone and a cathode injecting electrons, a distance from said luminous layer to the outermost surface of said micro lenses is shorter than a length of a short side of said pixel.

69. A portable terminal unit comprising a voice signal converting section that converts voice into a voice signal, a manipulating section that inputs data including a telephone number, a display section that displays data including a received message and a telephone number, a transmitting section that converts the voice signal into a transmission signal, a receiving section that converts a received signal into a voice signal, an antenna for transmitting and receiving the transmission signal and the received signal, a control section that controls several portions, characterized in that said display section is formed of an image forming apparatus as set forth in claim 63 or 64.

70. An organic electroluminescence element incorporating a luminous layer having a light emitting zone between two electrodes, characterized in that a substrate is provided on one of said electrode sides, and semisphere-like micro lenses are provided on the other one of said electrode sides.

* * * * *